United States Patent
Yamazaki et al.

(10) Patent No.: US 7,594,644 B2
(45) Date of Patent: Sep. 29, 2009

(54) SEMICONDUCTOR DEVICE AND METHOD FOR MANUFACTURING THE SAME, CIRCUIT BOARD, ELECTRONIC APPARATUS, AND SEMICONDUCTOR DEVICE MANUFACTURING APPARATUS

(75) Inventors: Takao Yamazaki, Tokyo (JP); Hirobumi Inoue, Tokyo (JP); Ichiro Hazeyama, Tokyo (JP); Sakae Kitajo, Tokyo (JP); Masahiro Kubo, Tokyo (JP); Yoshimichi Sogawa, Tokyo (JP); Hidehiko Kuroda, Tokyo (JP)

(73) Assignee: NEC Corporation, Tokyo (JP)

( * ) Notice: Subject to any disclaimer, the term of this patent is extended or adjusted under 35 U.S.C. 154(b) by 283 days.

(21) Appl. No.: 11/267,328

(22) Filed: Nov. 7, 2005

(65) Prior Publication Data
US 2006/0055053 A1    Mar. 16, 2006

Related U.S. Application Data

(62) Division of application No. 10/644,952, filed on Aug. 21, 2003, now Pat. No. 6,998,704.

(30) Foreign Application Priority Data

Aug. 30, 2002  (JP) ............................. 2002/255530
Nov. 14, 2002  (JP) ............................. 2002/331411

(51) Int. Cl.
    *B25B 11/00*      (2006.01)
(52) U.S. Cl. ........................................ 269/21
(58) Field of Classification Search ............ 269/21
    See application file for complete search history.

(56) References Cited

U.S. PATENT DOCUMENTS

| 5,201,452 | A | * | 4/1993 | Takahashi et al. ............ 228/8 |
| 5,447,596 | A | * | 9/1995 | Hayase ..................... 156/584 |
| 5,735,731 | A | * | 4/1998 | Lee ......................... 451/143 |
| 6,121,118 | A | * | 9/2000 | Jin et al. .................. 438/460 |
| 6,376,769 | B1 |  | 4/2002 | Chung |
| 6,650,393 | B1 | * | 11/2003 | Nishiguchi ................. 349/156 |
| 6,705,922 | B1 | * | 3/2004 | Inbe ............................ 451/6 |
| 2002/0130427 | A1 | * | 9/2002 | Kobayashi et al. .......... 264/1.6 |

FOREIGN PATENT DOCUMENTS

| JP | 5-291361 A | 11/1993 |
| JP | 8-31868 A | 2/1996 |
| JP | 8-335663 A | 12/1996 |
| JP | 2001-196504 A | 7/2001 |

OTHER PUBLICATIONS

"Adjacent." Oxford English Online Dictionary. 2009. Oxford University Press. Jan. 14, 2009. <http://dictionary.oed.com/cgi/entry/50002708?single=1&query_type=word&queryword=adjacent&first=1&max_to_show=10>.*

* cited by examiner

*Primary Examiner*—Alexander G Ghyka
*Assistant Examiner*—Reema Patel
(74) *Attorney, Agent, or Firm*—Sughrue Mion, PLLC

(57) ABSTRACT

A semiconductor device is provided including a semiconductor element having a circuit and at least one electrode of the circuit, a flexible substrate having at least one electrode pad and surrounding the semiconductor element, a conductor for connecting the electrode with the electrode pad, and a plurality of solder bumps on the electrode pad, wherein at least a first portion between a surface facing the solder bumps of the semiconductor element and the flexible substrate is not fixed by adhesion.

19 Claims, 45 Drawing Sheets

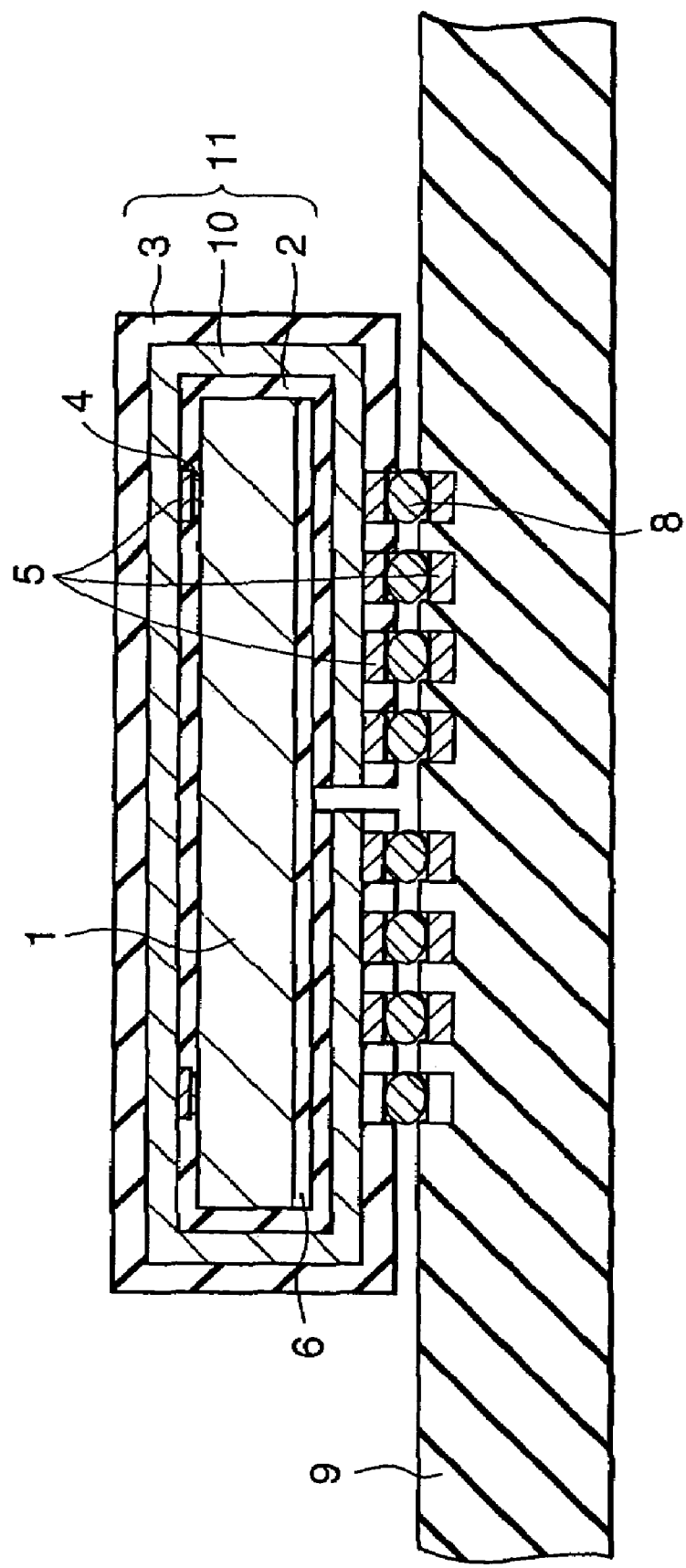

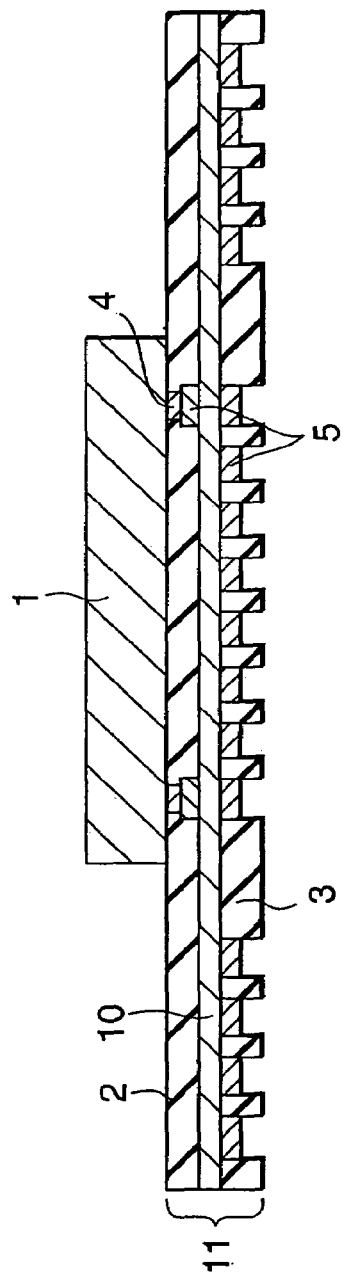
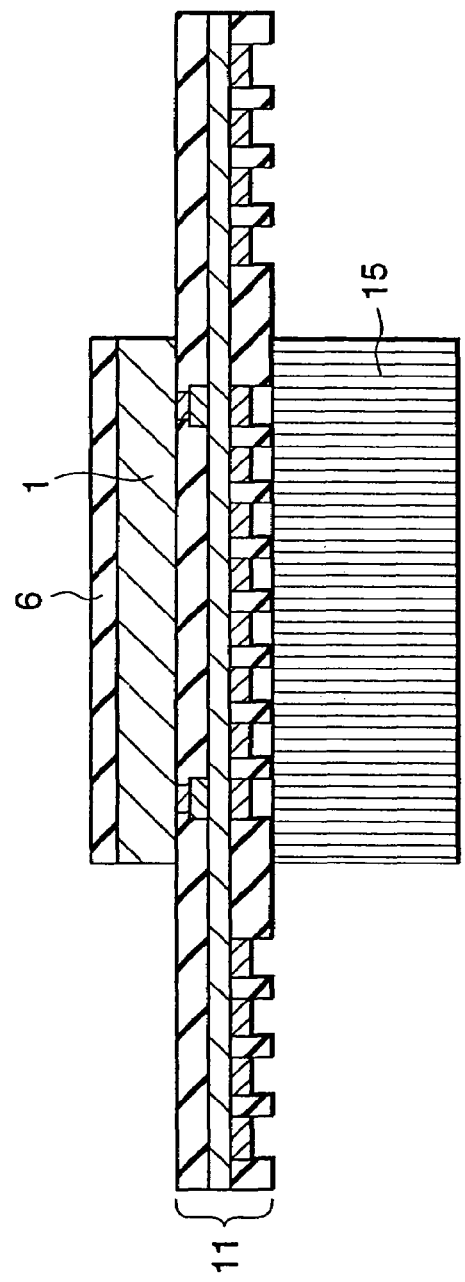

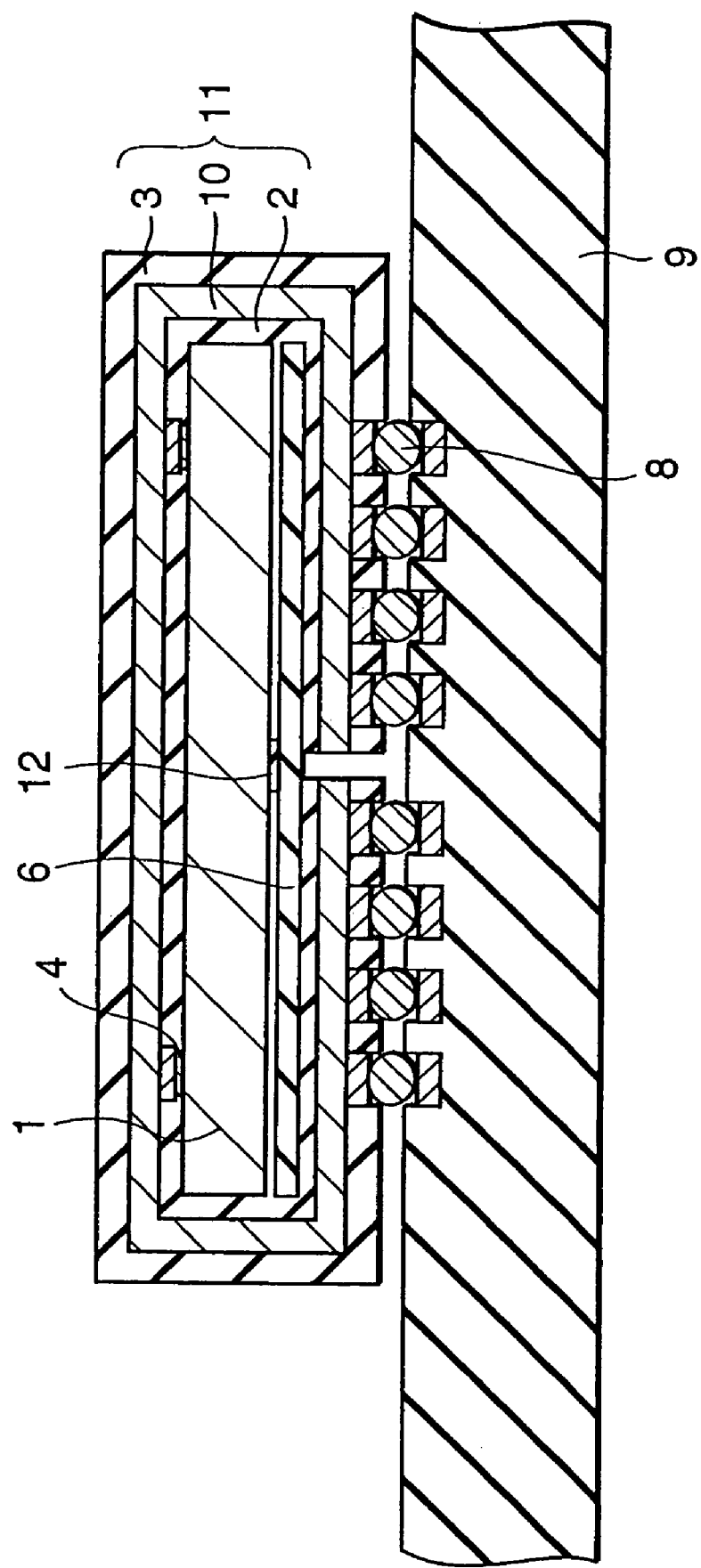

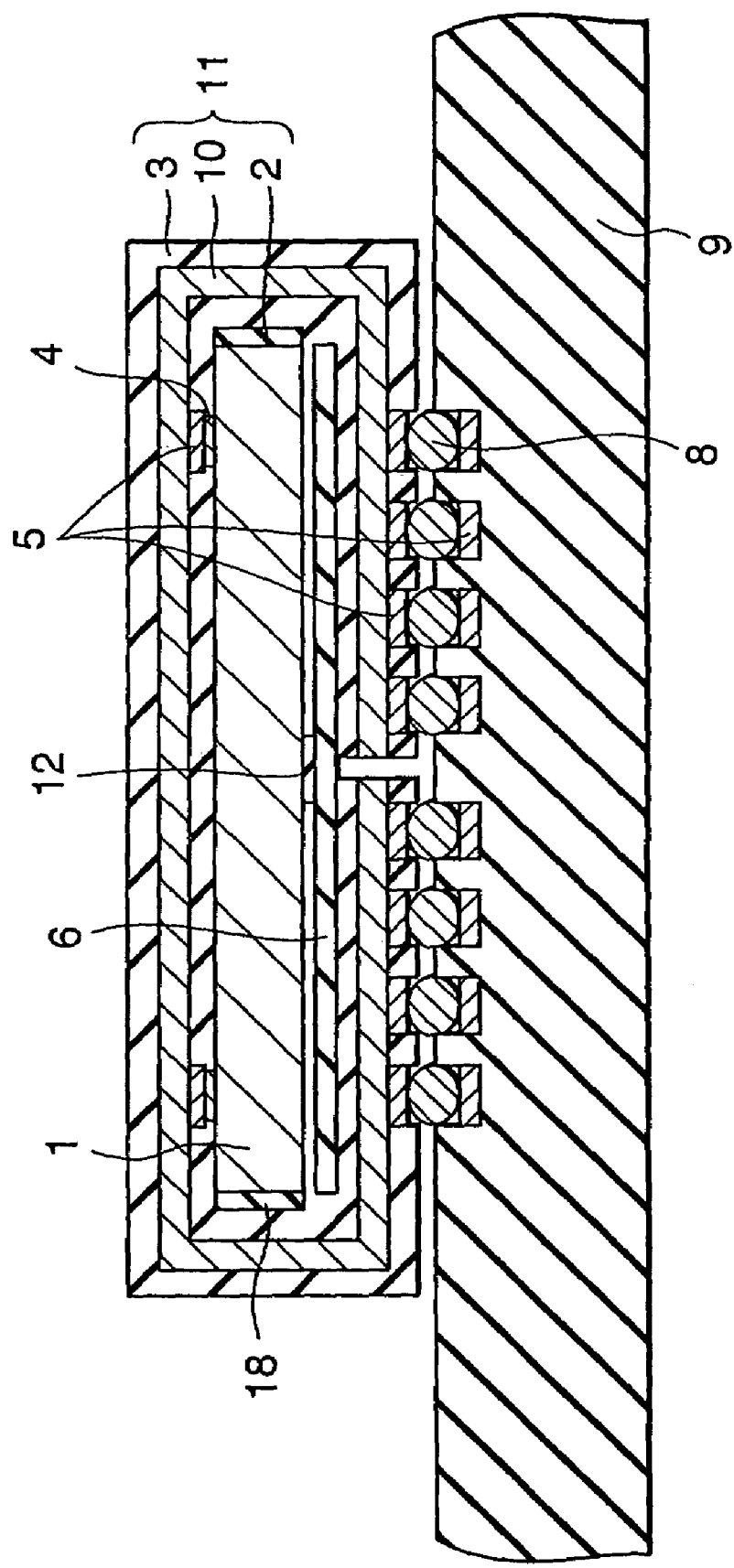

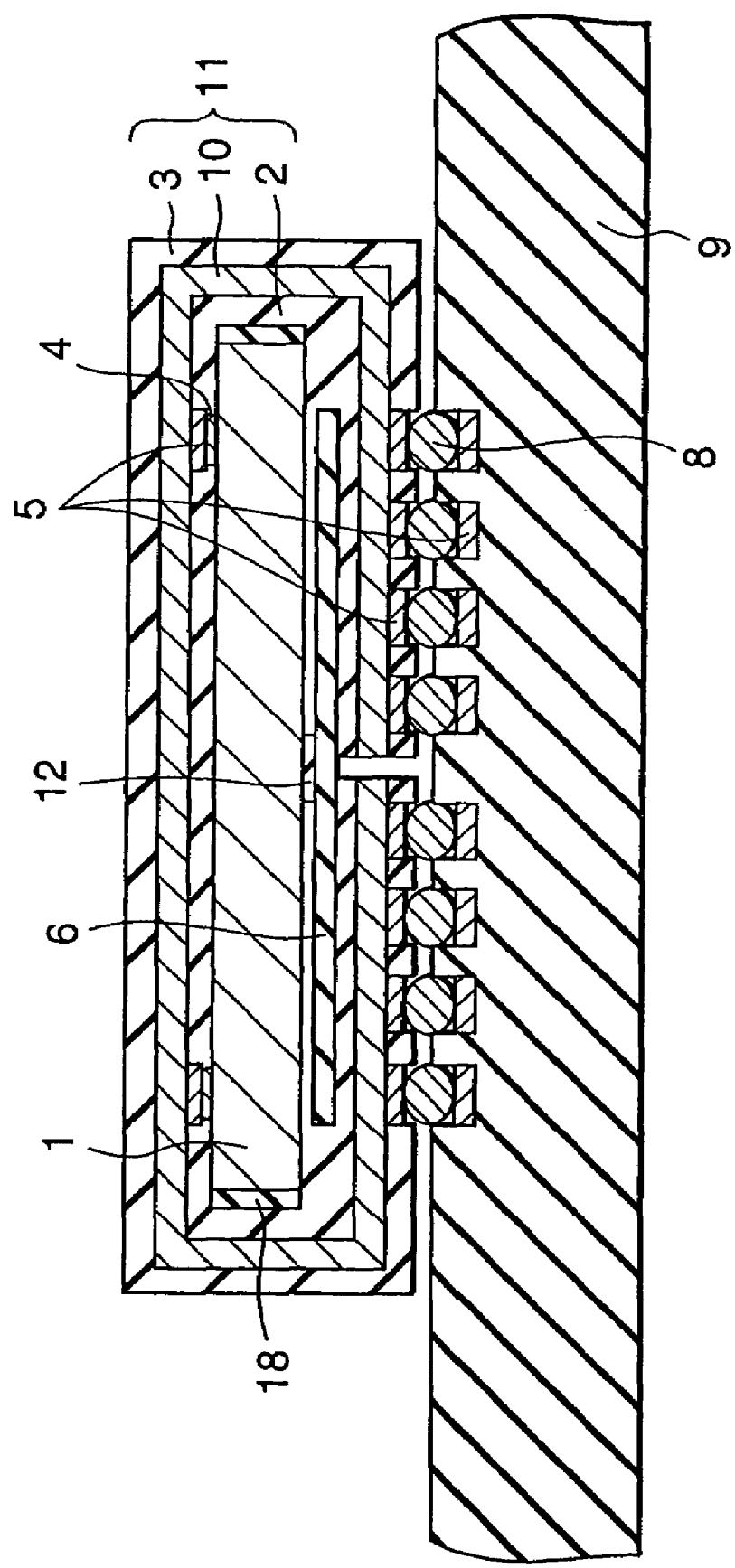

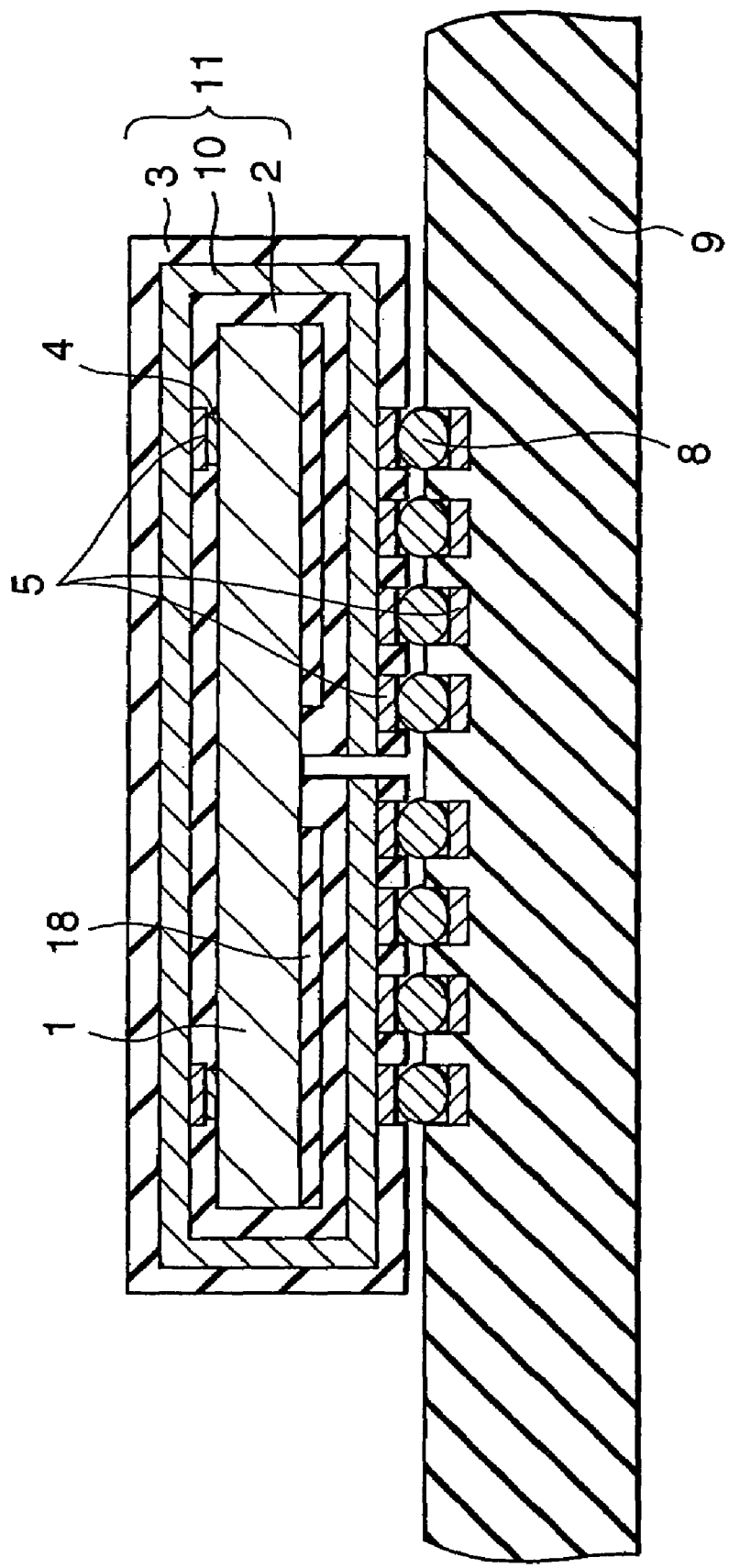

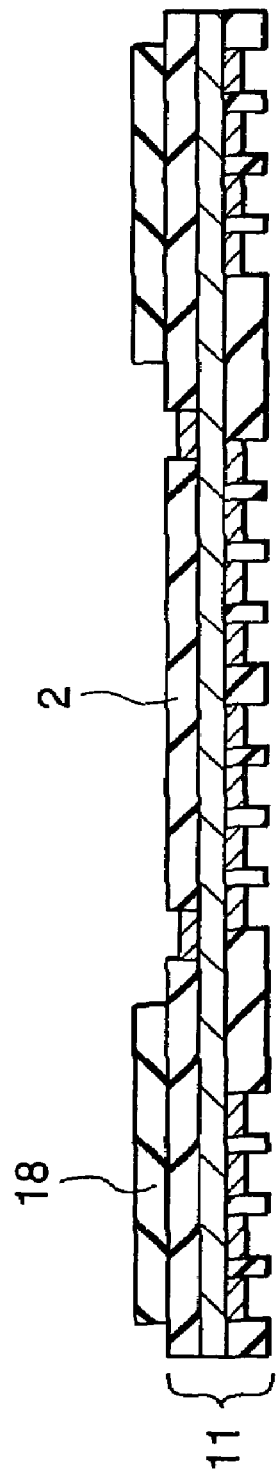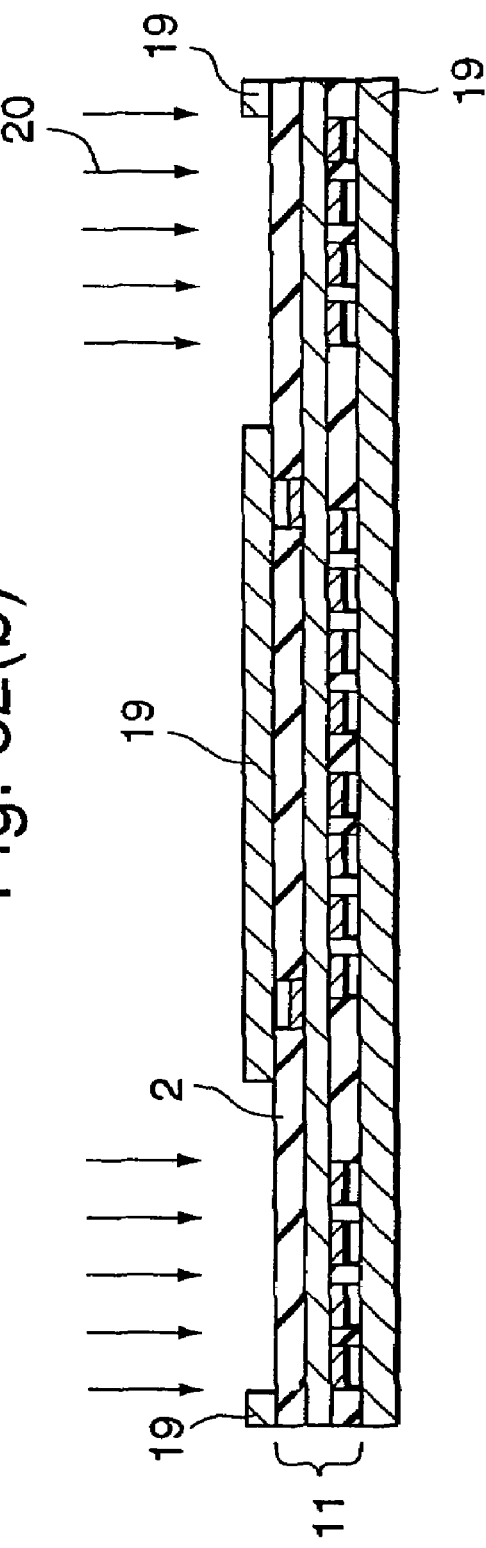

Fig. 45
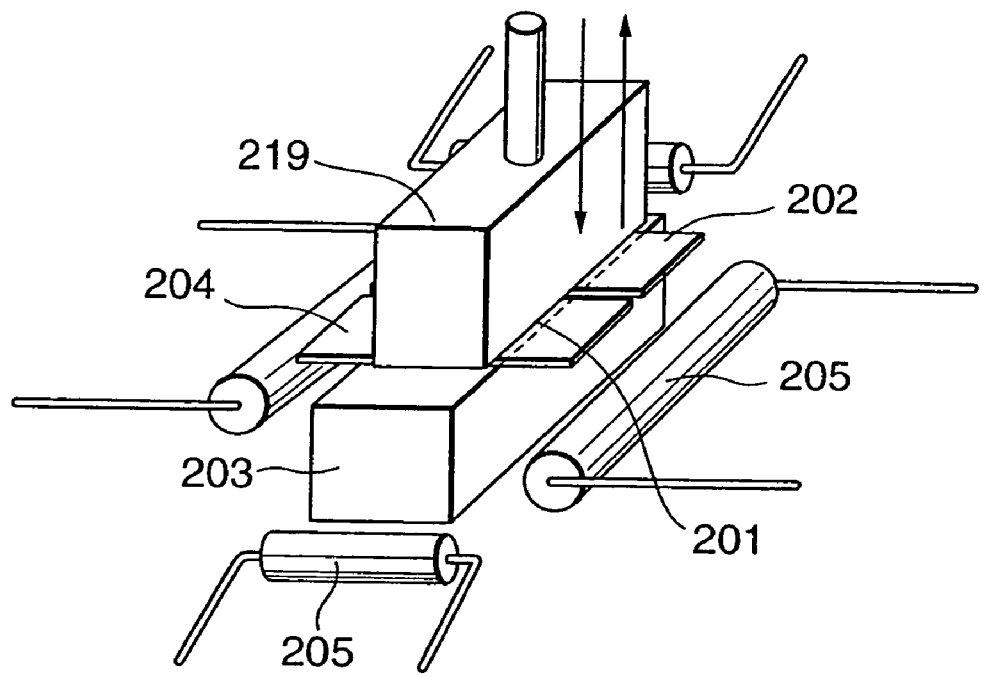
Fig. 46(a)   Fig. 46(b)
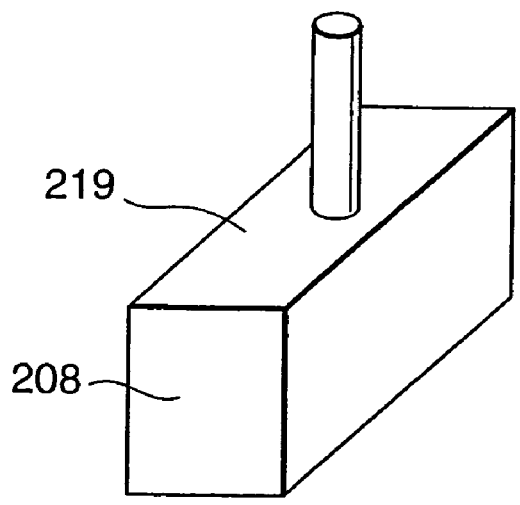 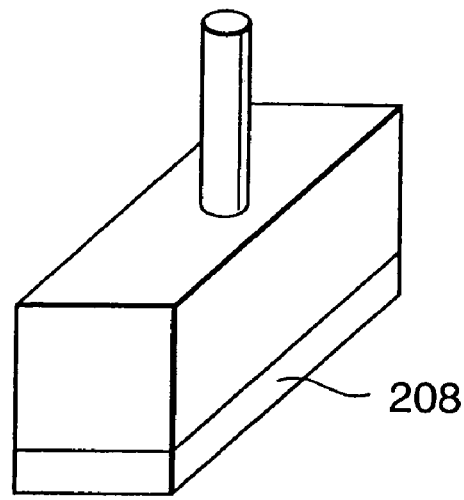

CHANGING OF
THE SURFACE
SHAPE →

CHANGING OF THE SURFACE SHAPE →

SEMICONDUCTOR DEVICE AND METHOD FOR MANUFACTURING THE SAME, CIRCUIT BOARD, ELECTRONIC APPARATUS, AND SEMICONDUCTOR DEVICE MANUFACTURING APPARATUS

This is a divisional of application Ser. No. 10/644,952 filed Aug. 21, 2003 now U.S. Pat. No. 6,998,704, the entire disclosure of which is considered part of the disclosure of this application and is hereby incorporated by reference.

BACKGROUND OF THE INVENTION

1. Field of the Invention

The present invention relates to a semiconductor device, a method for manufacturing the semiconductor device, and a semiconductor device manufacturing apparatus, and more particularly, to a chip size package (CSP) sized to a bare chip and a manufacturing method therefor, a manufacturing apparatus therefor.

2. Description of the Related Art

Rapidly Developing CSP techniques, as compared to conventional semiconductor packaging, have produced a reduced package size and weight, high density packaging, and a reduction in manufacturing costs. In particular, three-dimensional and laminate semiconductor devices stacking small-sized semiconductor devices for cellular phones, portable information terminals, notebook computers, digital cameras, and similar equipment, have recently been required for reduction in size and weight.

For instance, Japanese published application JP 08-335663 A discloses a CSP technique which is capable of inspecting with high reliability characteristics and operation state of a bare chip to be packaged. In addition, it discloses that it is possible to stack semiconductor chips having different kinds of carriers without fearing breakage by short circuit to thereby achieve high density packaging in a three-dimensional semiconductor device.

FIG. 1 is a sectional view of a semiconductor device according to a conventional CSP technique. FIG. 2 is a sectional view of a three-dimensional semiconductor device according to the same conventional technique. FIGS. 3 and 4 are sectional views showing a process of secondarily mounting this three-dimensional semiconductor device of the conventional technique to a motherboard. As shown in FIG. 1, a semiconductor device 100 according to this conventional technique (referred to as first prior art) has insulating resin 109 as an adhesive layer placed on the circuit side and side faces of a semiconductor chip 101. The semiconductor chip 101 is surrounded by an interposer substrate 102 composed of a wiring pattern 105 to which an insulating film 110 is adhered on each side, so that the interposer substrate 102 runs along the entire circumference of the semiconductor chip 101. The wiring pattern 105 is connected to a circuit on the front side of the semiconductor chip 101 through a conductor 103. On the rear side of the semiconductor chip 101, which is opposite to the circuit side, the insulating resin 109 is applied to bond the semiconductor chip 101 to the interposer substrate 102. Portions of the interposer substrate 102 that face the circuit side and rear side of the semiconductor chip 101 have a plurality of electrode pads 104 for external connection. A solder bump 107 is formed on each of the electrode pads 104 that face the circuit side of the semiconductor chip 101. The small-sized semiconductor device 100 which has substantially the same size as a bare chip is thus structured in this conventional CSP technique.

The conventional semiconductor device 100 thus formed can be used to build a small-sized, three-dimensional semiconductor device which has substantially the same size as a bare chip by stacking and mounting one semiconductor device 100 and another semiconductor device 100 with the electrode pads 104 and the solder bump 107 sandwiched between them as shown in FIG. 2.

The thus obtained small-sized, three-dimensional semiconductor device which has substantially the same size as a bare chip is secondarily mounted onto a motherboard 111 through the solder bump 107 that faces the circuit side of the lowermost semiconductor device 100 of the stack as shown in FIG. 3. As shown in FIG. 4, underfill resin 108 that is thermosetting resin is inserted between the motherboard 111 and the lowermost semiconductor device 100 of the three-dimensional semiconductor device. The underfill resin 108 seals the solder bump 107 of the lowermost semiconductor device 100. The underfill resin 108 prevents shortening of the life span of the solder bump 107 because of deterioration caused by thermal stress to the solder bump 107 due to the difference in a rate of a linear expansion between the semiconductor chip 101 and the motherboard 111 in variations of temperature. Accordingly, the solder bump 107 is saved from cracking and wire breakage can be avoided.

A Japanese published application JP 2001-196504 A discloses another CSP technique which facilitates manufacturing of a semiconductor device according to the first prior art. FIG. 5 is a sectional view of a semiconductor device 200 according to the CSP technique (referred to as second prior art). FIG. 6 is a sectional view of a three-dimensional semiconductor device according to the second prior art. FIGS. 7 and 8 are sectional views showing a process of secondarily mounting this three-dimensional semiconductor device to a motherboard. As shown in FIG. 5, the semiconductor device 200 according to the second prior art is constituted of a semiconductor chip 101 and a flexible interposer substrate 106 that is composed of a wiring pattern 105 to which thermoplastic insulating resin 112 is adhered on each side. The semiconductor chip 101 is surrounded by the flexible interposer substrate 106 such that the flexible interposer substrate 106 runs along the entire circumference of the semiconductor chip 101. The wiring pattern 105 is connected to a circuit on the front side of the semiconductor chip 101 through a conductor 103 and electrode pads 104. Portions of the flexible interposer substrate 106 that cover the circuit side and rear side of the semiconductor chip 101 have a plurality of electrode pads 104 for external connection. A solder bump 107 is formed on each of the electrode pads 104 that face the rear side of the semiconductor chip 101. In the second prior art, the thermoplastic insulating resin 112 is employed to form the flexible interposer substrate 106. The flexible interposer substrate 106 can therefore readily be adhered to the semiconductor chip 101 by fitting the flexible interposer substrate 106 to the circumferential faces of the semiconductor chip 101 while heating after the flexible interposer substrate 106 is connected to the semiconductor chip 101 through the conductor 103. In addition, bending the flexible interposer substrate 106 along the circumference of the semiconductor chip 101 to bond the two is much easier than in the first prior art because, when heated, the thermoplastic resin 112 is reduced in elastic coefficient and becomes adhesive as well. Moreover, the second prior art does not need the insulating resin 109 inserted as an adhesive layer between the interposer substrate 102 and the semiconductor chip 101 in the first prior art. Therefore manufacturing process and manufacture cost can be reduced for the semiconductor device 102 according to the second prior art.

Similar to the semiconductor device 100 according to the first prior art, the thus formed semiconductor device 200 of the second prior art can be used to build a small-sized, three-dimensional semiconductor device which has substantially the same size as a bare chip. In this case, one semiconductor device 200 and another semiconductor device 200 are stacked and mounted sandwiching the electrode pads 104 and the solder bump 107 between them as shown in FIG. 6.

The thus obtained small-sized, three-dimensional semiconductor device which has substantially the same size as a bare chip is, similar to the three-dimensional semiconductor device according to the first prior art, secondarily mounted onto a motherboard 111 through the solder bump 107 that faces the circuit side of the lowermost semiconductor device 200 of the stack as shown in FIG. 7. As shown in FIG. 8, the underfill resin 108 that is thermosetting resin is inserted between the motherboard 111 and the lowermost semiconductor device 200 of the three-dimensional semiconductor device. The underfill resin 108 seals the solder bump 107 of the lowermost semiconductor device 200 as in the first prior art. Therefore, the underfill resin 108 prevents shortening of the life span of the solder bump 107 because of deterioration caused by thermal stress to the solder bump 107 due to the difference in a rate of linear expansion between the semiconductor chip 101 and the motherboard 111 in variations of temperature. Accordingly, the solder bump 107 is saved from cracking and wire breakage can be avoided.

However, filling the space between the semiconductor device 200 and the motherboard 111 with the underfill resin 108 that is thermosetting resin makes repair impossible if a defect is found in a test to evaluate characteristics of the semiconductor chip 101 and a test for evaluating the quality of the semiconductor device 200 which are conducted after the semiconductor device 200 is secondarily mounted to the motherboard 111. Furthermore, the step of inserting the underfill resin that is thermosetting resin between the semiconductor device and the motherboard substrate and then thermosetting the resin causes an increase in manufacture cost of a semiconductor manufacturing device.

SUMMARY OF THE INVENTION

A first object of the present invention is to provide a semiconductor device which is highly reliable in connection between the semiconductor device and the motherboard without a step of sealing a solder bump with the underfill resin between the semiconductor device and the motherboard on which the semiconductor device mounted.

According to a first aspect of the present invention, a semiconductor device comprises a semiconductor element having a circuit and at least one electrode of said circuit, a flexible substrate having at least one electrode pad and surrounding the semiconductor element, a conductor for connecting the electrode with said electrode pad, and a plurality of solder bumps on the electrode pad, wherein at least a first portion between a surface facing the solder bumps of the semiconductor element and the flexible substrate is not fixed by adhesion.

Thus, according to the first aspect of the present invention, at least a first portion between a surface facing the solder bumps of the semiconductor element and the flexible substrate is not fixed by adhesion; Therefore, the thermal stress caused by difference in the rate of a linear expansion between the semiconductor element and the external board in a variation of temperature can be relieved, and the life span of the solder bump can be prevented from shortening.

According to a second aspect of the present invention, a semiconductor device comprises a semiconductor element having a circuit and at least one electrode of the circuit, a flexible substrate having at least one electrode pad and surrounding the semiconductor element, a conductor for connecting said electrode with said electrode pad, a plurality of solder bumps on the electrode pad, and a plate between a surface facing the solder bumps of the semiconductor element and the flexible substrate.

Thus, according to a second aspect of the present invention, the plate between a surface facing the solder bumps of the semiconductor element and the flexible substrate can relieve the thermal stress caused by difference in the rate of a linear expansion between the semiconductor element and the external board in a variation of temperature, and the life span of the solder bump can be prevented from shortening.

A third aspect of the present invention is a semiconductor device manufacturing method which comprises providing a semiconductor element having a circuit and at least one electrode of the circuit, providing a flexible substrate including two insulating resin films and an intermediate layer for forming a wiring pattern, opening a hole for an electrode pad in the insulating resin of the flexible substrate, forming the electrode pad connecting to the wiring pattern, connecting the electrode pad to the semiconductor element via a conductor, bending the flexible substrate along the semiconductor element, forming a plurality of solder bumps on the electrode pad, and fixing by adhesion the flexible substrate and semiconductor element other than at least a first portion between a surface facing said solder bumps of the semiconductor element and the flexible substrate.

Thus, according to the third aspect of the present invention, the step of filling the space between the semiconductor device and the external board with the underfill resin can be omitted, and the defect can be repaired after mounting the semiconductor device if the defect is found in a test to evaluate characteristics of the semiconductor device and a test for evaluating the quality of the semiconductor device.

According to a fourth aspect of the present invention, a semiconductor device manufacturing apparatus comprises a stage for placing a semiconductor device, a roller for pressurizing the surface of the semiconductor device on the stage, wherein the surface of the stage has minute holes for fixing the semiconductor device on the stage by vacuuming through the holes.

Thus, according to the fourth aspect of the present invention, by vacuuming through the holes on the stage, the semiconductor device on the stage can be held on the stage in the process, therefore, the efficiency of the manufacturing of the semiconductor device can be increased.

BRIEF DESCRIPTION OF THE DRAWINGS

FIG. 9 is a sectional view showing a first embodiment of the present invention.

FIGS. 10(a) and (b) are sectional views showing a manufacturing process according to the first embodiment of the present invention.

FIG. 20 is a sectional view showing a fifth embodiment of the present invention.

FIG. 25 is a sectional view showing a sixth embodiment of the present invention.

FIG. 27 is a sectional view showing an eighth embodiment of the present invention.

FIG. 28 is a sectional view showing a ninth embodiment of the present invention.

FIGS. 32(a) and (b) are sectional views showing another manufacturing process according to the ninth embodiment of the present invention.

FIG. 45 is a diagram showing a semiconductor device manufacturing apparatus according to a nineteenth embodiment of the present invention.

FIGS. 46(a) and 46(b) are diagrams illustrating a material that forms a pressurizing device.

DETAILED DESCRIPTION OF THE INVENTION

First Embodiment

Figure 12:
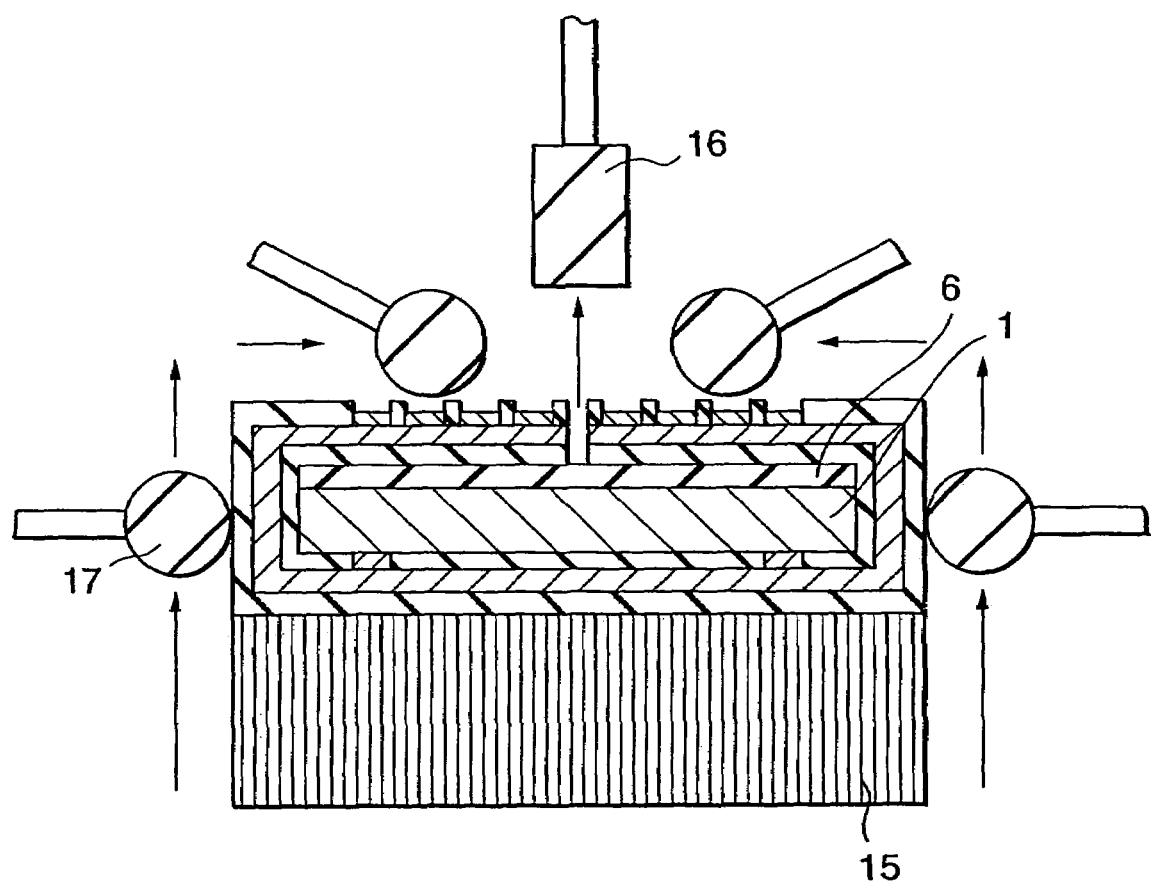
FIG. 12 is a sectional view showing the manufacturing step that follows FIG. 11.
Figure 13A:
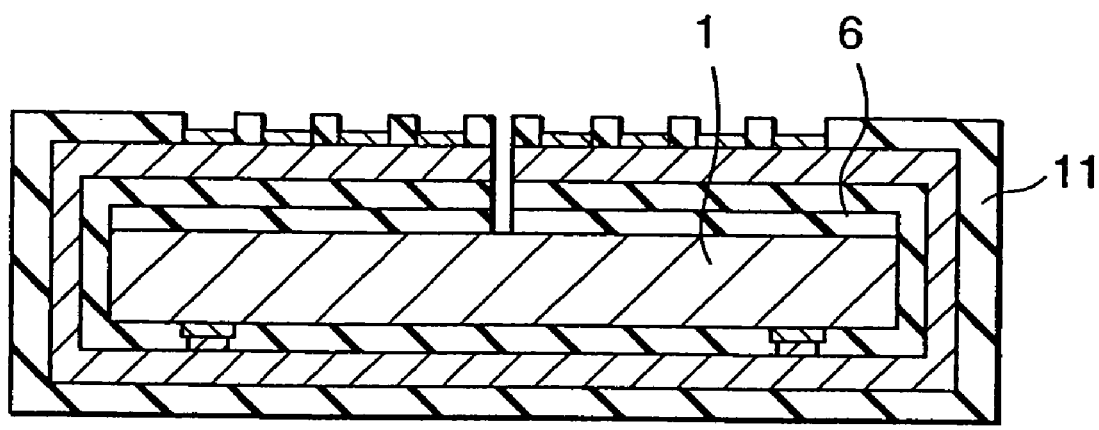
FIGS. 13(a) and (b) are sectional views showing the manufacturing steps that follow FIG. 12.
Figure 13B:
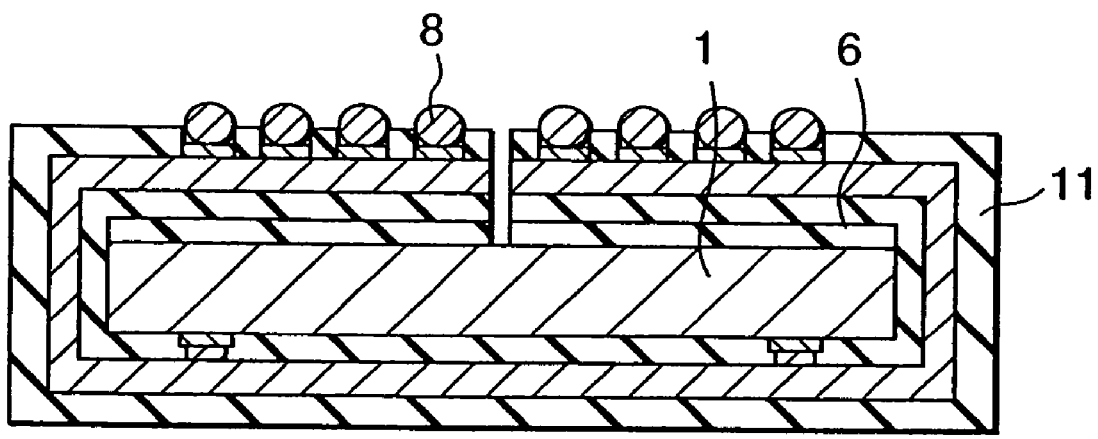
Figure 14A:
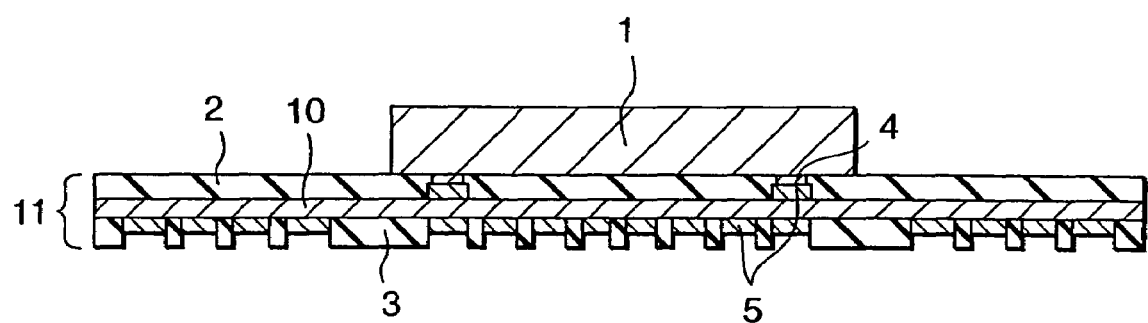
FIGS. 14(a) and (b) are sectional views showing another manufacturing process according to the first embodiment of the present invention.
Figure 14B:
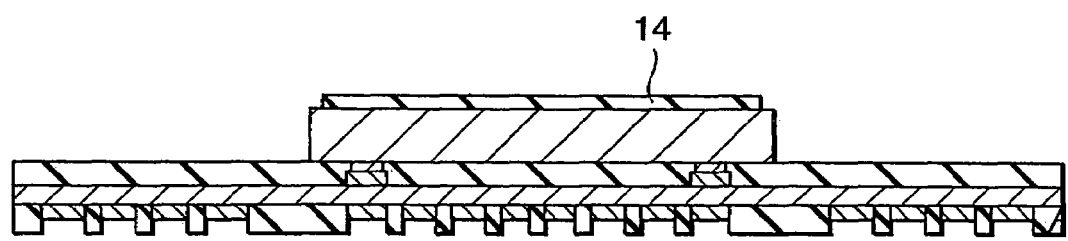

FIG. 9 is a sectional view of a semiconductor device according to a first embodiment of the present invention. FIGS. 10 through 13 are sectional views showing a method of manufacturing the semiconductor device according to the first embodiment. FIGS. 14 through 16 are sectional views showing another method of manufacturing the semiconductor device according to the first embodiment.

In the semiconductor device according to the first embodiment, a flat plate 6 is provided between the side facing the solder bump of a semiconductor chip 1 as shown in FIG. 9. The contour in plan view of the flat plate 6 is substantially the same size as that of the semiconductor chip 1. A flexible interposer substrate 11 covers the semiconductor chip 1 and the flat plate 6 by running along the entire circumference. The flexible interposer substrate 11 is composed of thermoplastic resin 2 placed on the semiconductor chip 1 side, insulating resin 3 that is thermoplastic resin or thermosetting resin placed on the side opposite to the thermoplastic resin 2, and a wiring pattern 10 that is interposed between the resin layers 2 and 3 and adhered thereto. A conductor 4 is formed on each electrode pad (not shown in the drawing) which is formed on the semiconductor chip 1 in a wafer step. The semiconductor chip 1 is connected by way of flip chip to the wiring pattern 10 in the flexible interposer substrate 11 through the conductor 4 and electrode pads 5 that are formed in the thermoplastic resin 2 bonded to the semiconductor chip 1. The insulating resin 3 facing outward has the plurality of electrode pads 5 for external connection as shown in FIG. 9. Bumps 8 are formed on the external connection electrode pads 5. The solder bumps 8 are respectively connected by way of flip chip to electrode pads 5 that are formed on a motherboard 9 serving as an external substrate. The semiconductor device according to the first embodiment is thus structured.

Next, FIGS. 10 through 13 show a method of manufacturing the semiconductor device according to the first embodiment. A plurality of holes that reach the wiring pattern 10 at desired positions in the resin layers (the thermoplastic resin 2 and the insulating resin 3) that constitute the flexible interposer substrate 11 is formed by using a UV-YAG laser, a carbon dioxide gas laser, an excimer laser or the like. The electrode pads 5 are formed from conductive materials such as Ni/Au and Pd by a known method such as plating or sputtering in portions of the wiring pattern 10 that are exposed by the holes. In this way, the electrode pads 5 are formed on each side of the flexible interposer substrate. Thereafter, as shown in FIG. 10(*a*), the electrode pads 5 formed in the thermoplastic resin 2 are connected to the conductor 4 on the circuit side of the semiconductor chip 1 by a known flip-chip technique, for example, hot press-fit using a flip-chip bonder or the like. The conductor 4 is a bump formed of Au, Sn—Pb, Sn—Ag, Sn—Cu, Sn—Ag—Cu, Sn—Bi, or Sn—Zn solder. The conductor 4 and the electrode pads 5 can readily be connected by way of flip chip through known hot press-fit, reflow, and the like at a temperature ranging from 150° C. through 350° C. depending on the material used to form the conductor 4. For instance, when the material forming the conductor 4 is an Au bump, the maximum heating temperature is set to 300 through 350° C., the load applied to a bump that serves as the conductor 4 is set to 40 through 100 g each, and the conductor 4 is hot press-fit onto the electrode pads 5 by a flip-chip bonder. In this way, the conductor 4 formed from an Au bump can readily be connected by way of flip chip to the electrode pads 5. Through the hot press-fit process for this flip-chip connection, the thermoplastic resin 2 seals portions around the conductor 4 and at the same time is bonded to the circuit side of the semiconductor chip 1.

Figure 1:
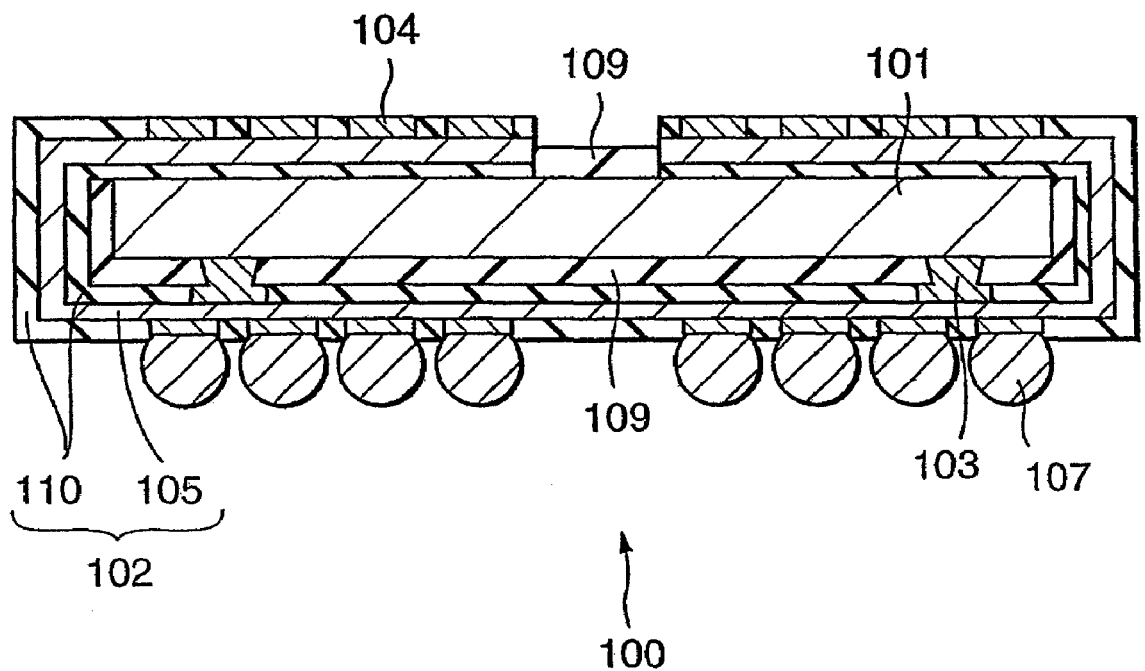
FIG. 1 is a sectional view showing the semiconductor device according to the first prior art.
Figure 2:
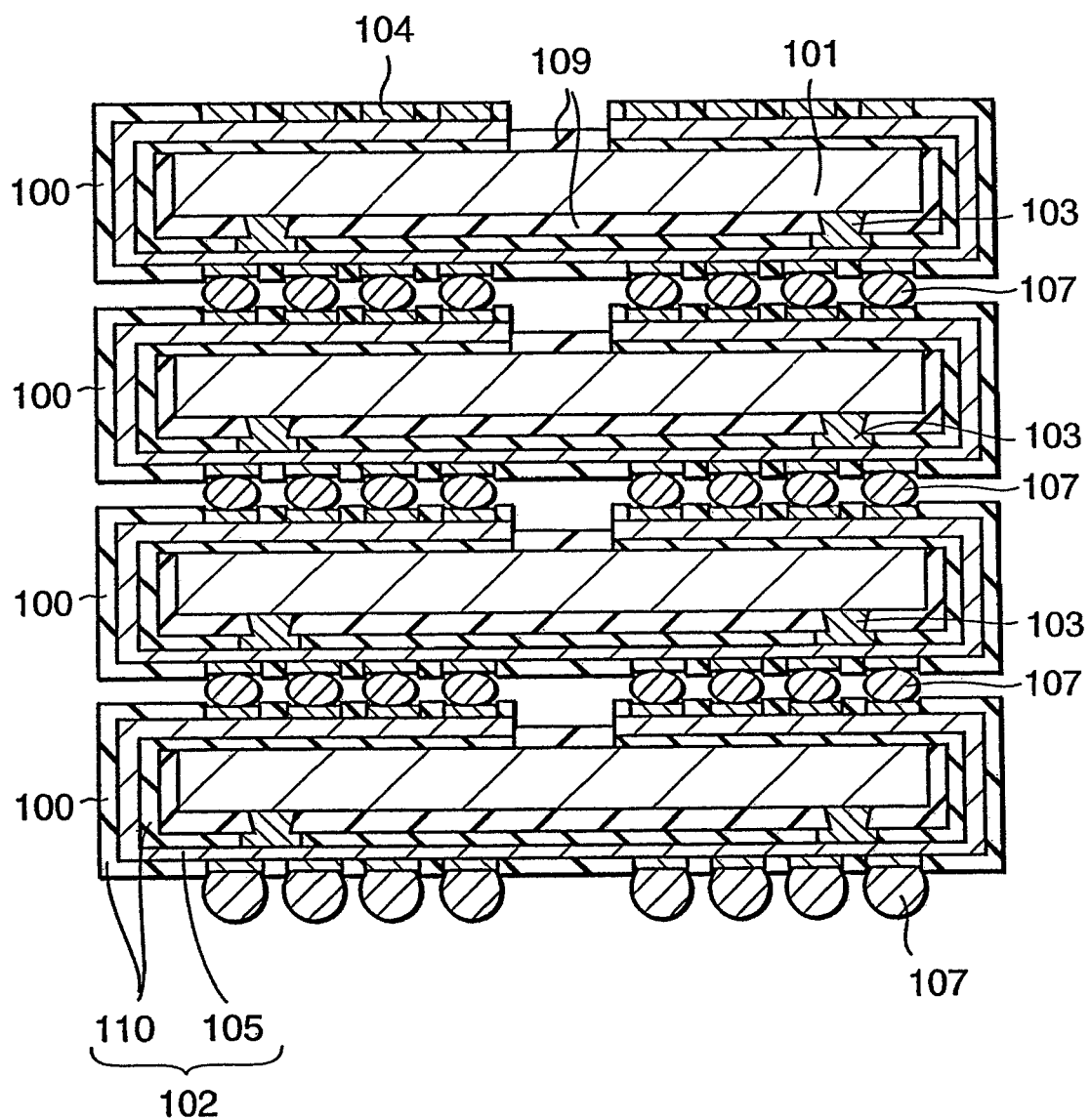
FIG. 2 is a sectional view showing the three-dimensional semiconductor device according to the first prior art.
Figure 3:
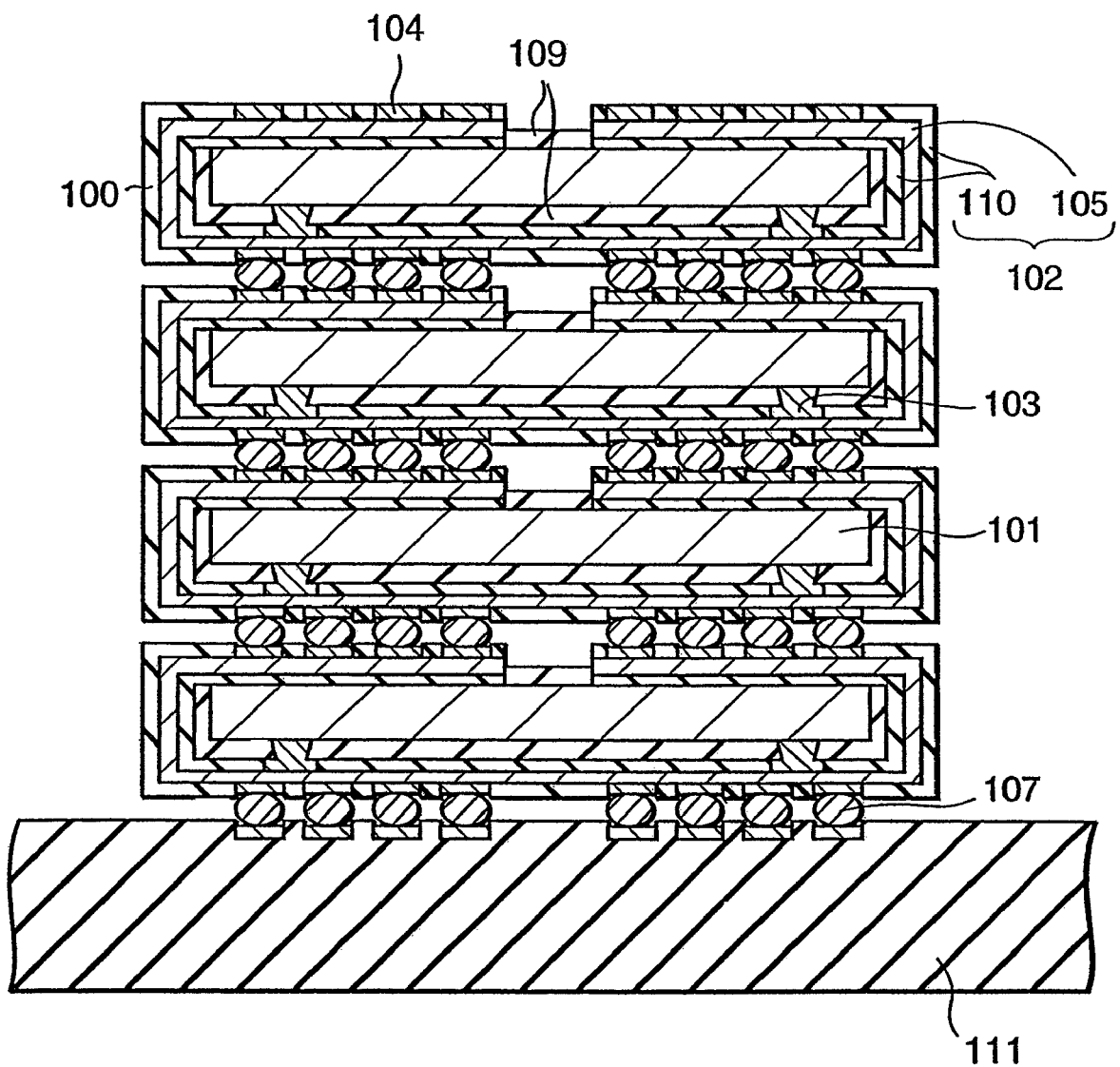
FIG. 3 is a sectional view showing a process of secondarily mounting the three-dimensional semiconductor device according to the first prior art.
Figure 4:
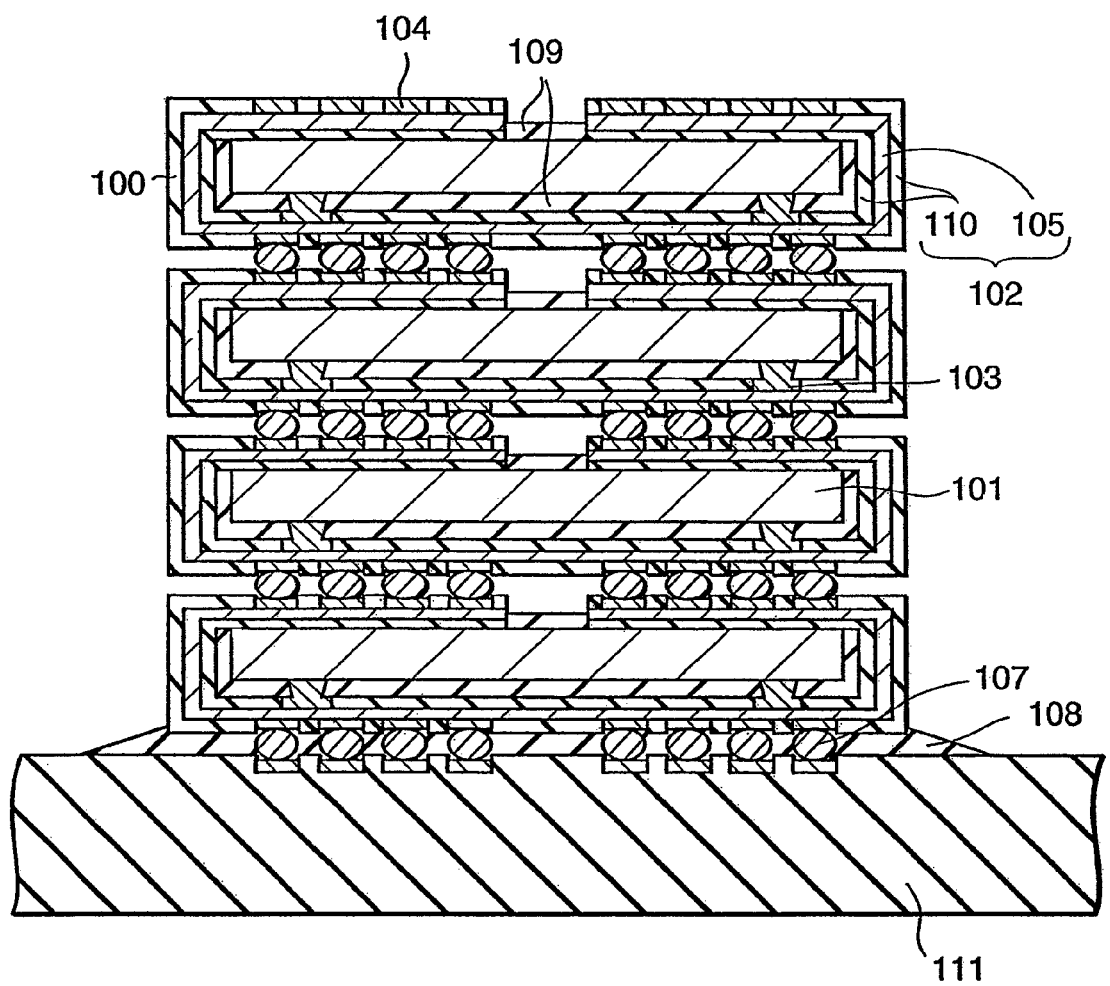
FIG. 4 is a sectional view showing a mounting step that follows FIG. 3.
Figure 5:
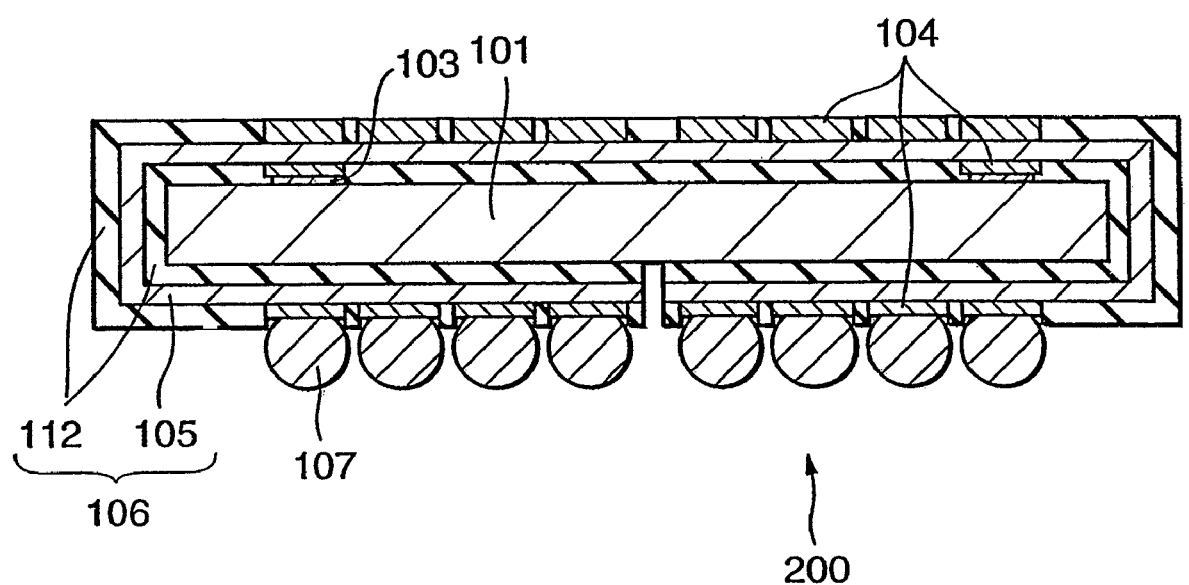
FIG. 5 is a sectional view showing the semiconductor device according to the second prior art.
Figure 6:
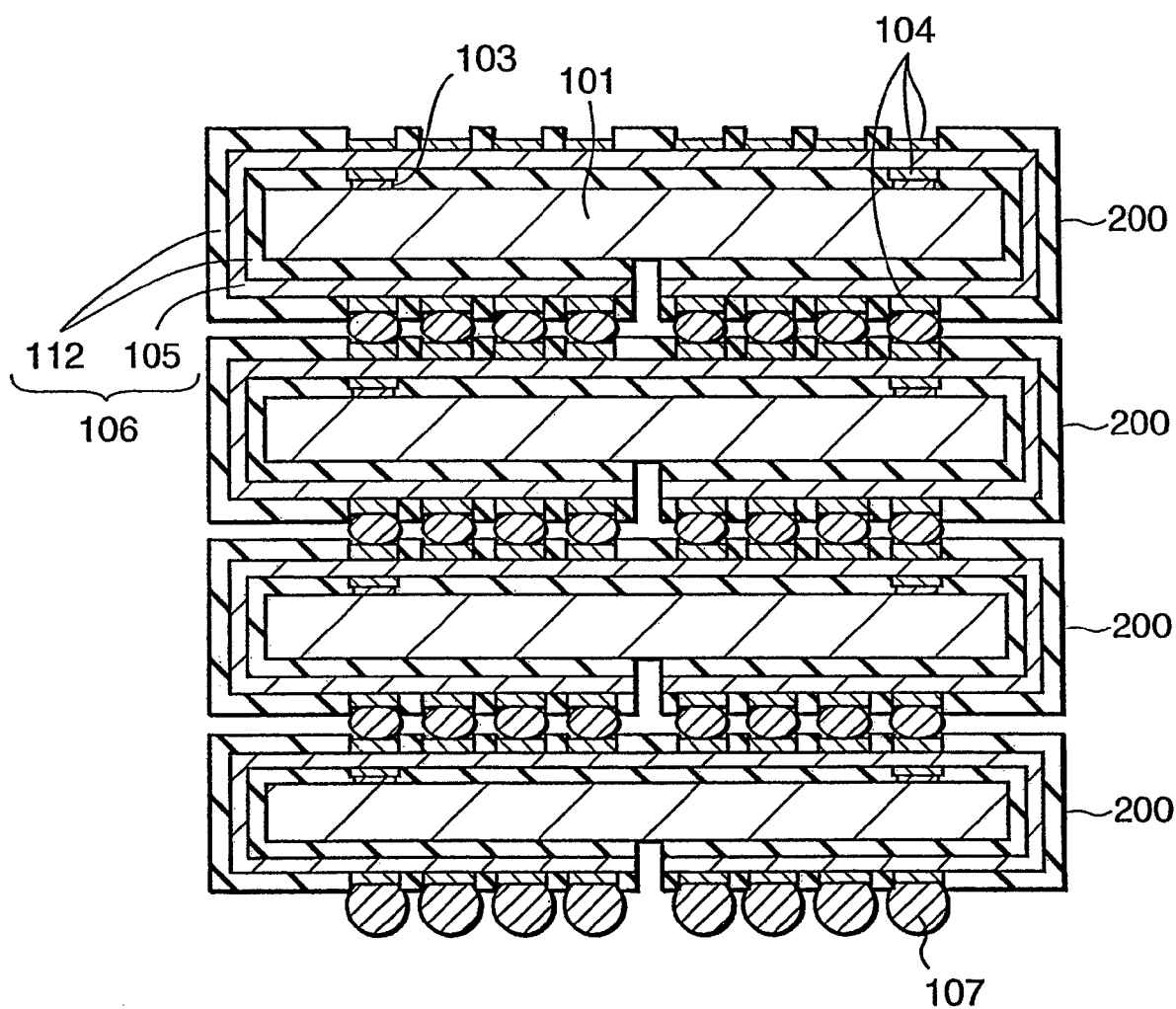
FIG. 6 is a sectional view showing a three-dimensional semiconductor device according to the second prior art.
Figure 7:
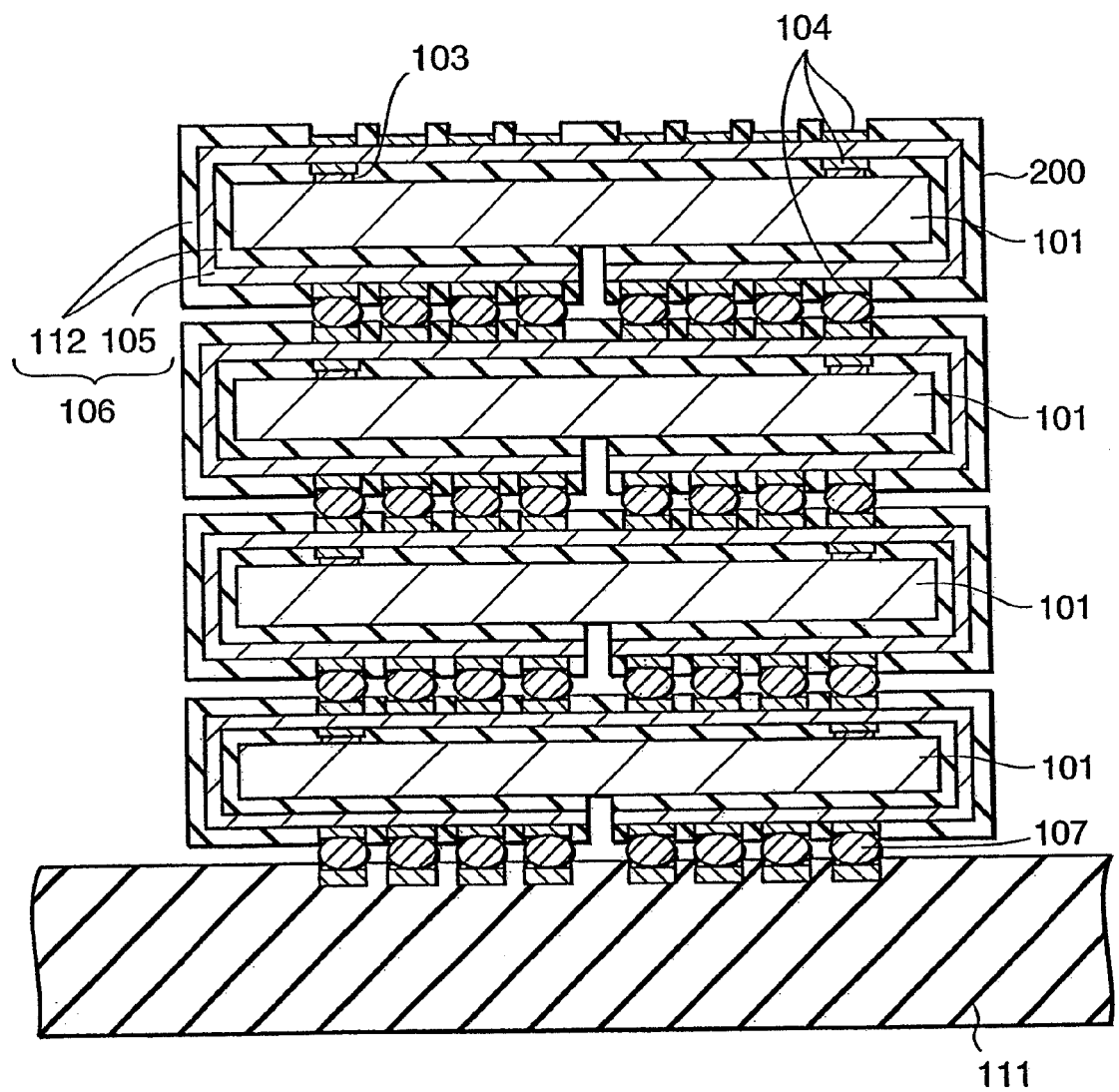
FIG. 7 is a sectional view showing a process of secondarily mounting the three-dimensional semiconductor device according to the second prior art.
Figure 8:
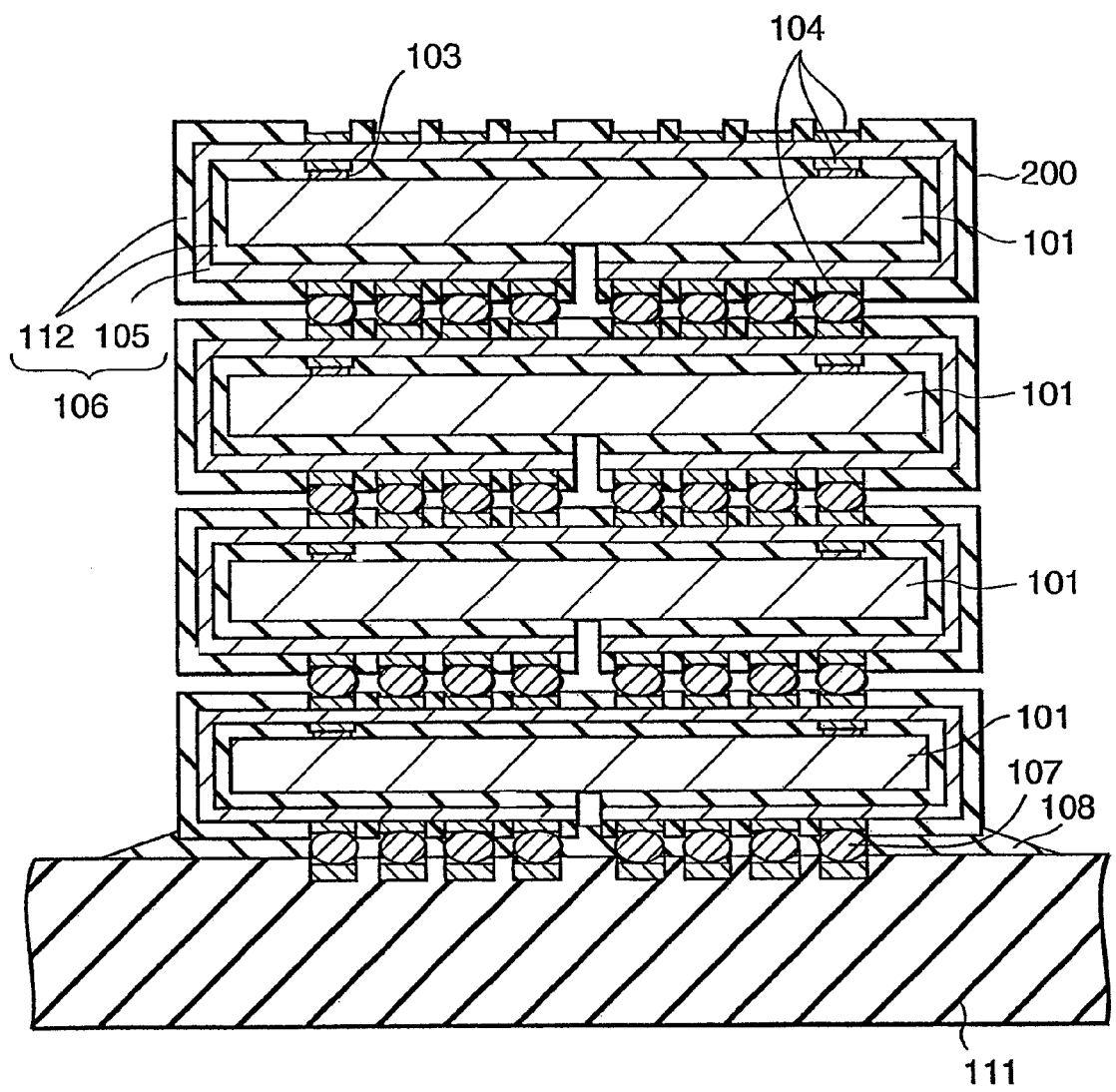
FIG. 8 is a sectional view showing a mounting step that follows FIG. 7.
Figure 11:
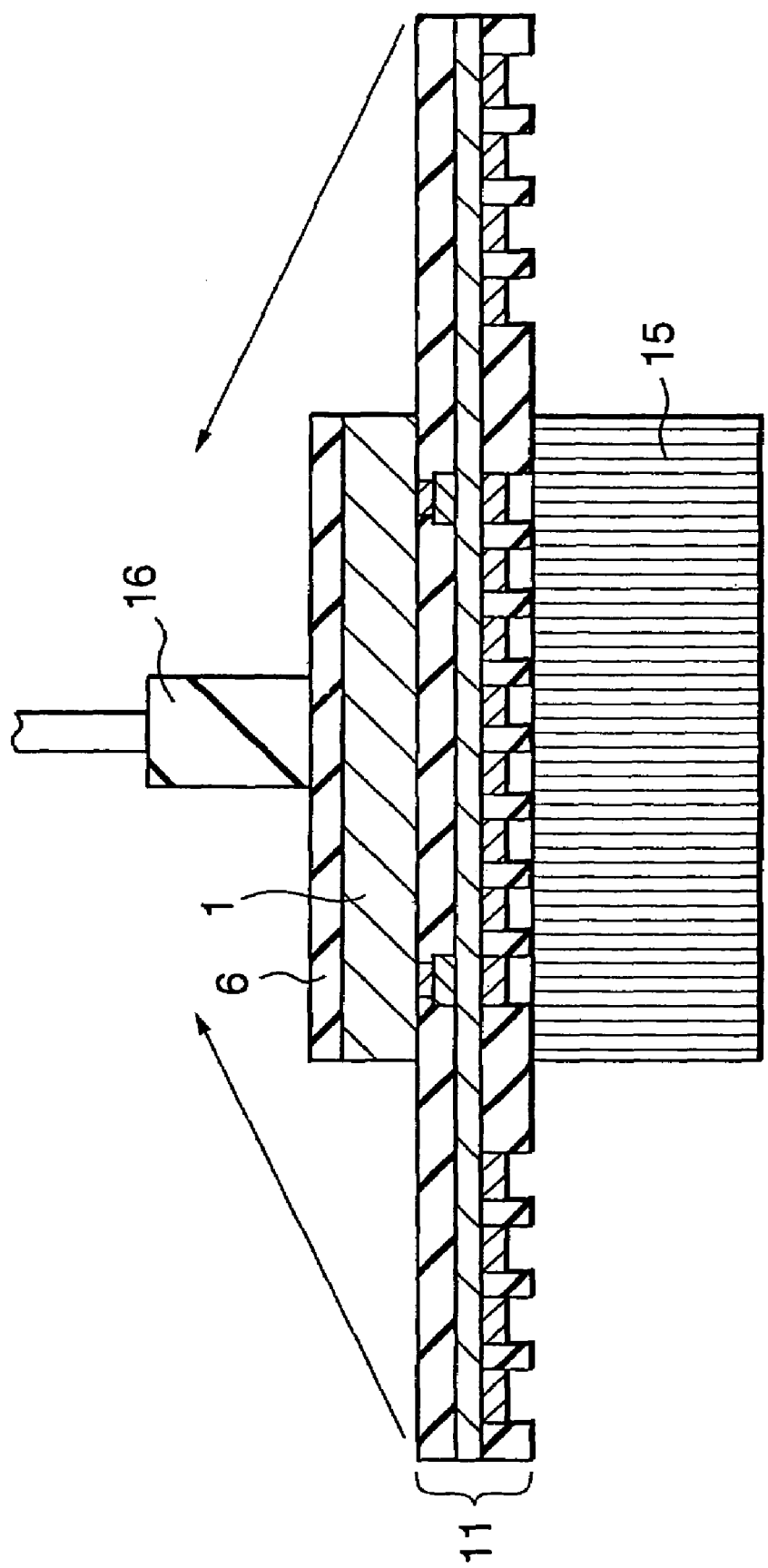
FIG. 11 is a sectional view showing the manufacturing step that follows FIGS. 10(a) and (b).

Then the flexible interposer substrate 11 connected to the semiconductor chip 1 through the conductor 4 and the electrode pads 5 is placed such that the insulating resin 3 to which the semiconductor chip 1 is not connected is brought into contact with the top face of a heater 15 as shown in FIG. 10(*b*). Meanwhile, the flat plate 6 is placed on the semiconductor chip 1. Next, as shown in FIG. 11, a fixing jig 16 made of TEFRON or other material that has excellent heat resistance is used to apply load as large as 100 through 500 g and fix the flat plate 6 onto the semiconductor chip 1 in order to prevent the flat plate from shifting from its position on the semiconductor chip 1. Setting the temperature of the heater 15 around 150° C., the flexible interposer substrate 11 is heated and bent along the side faces and rear side of the semiconductor chip 1. When bending the flexible interposer substrate 11 in this manner, a roller 17 made of silicon, TEFRON or other material that has excellent heat resistance is used to apply load as large as 0.5 through 3 kg to the flexible interposer substrate from the outside and bond the flexible interposer substrate 11 to the front side of the semiconductor chip 1 as shown in FIG. 12. While the roller 17 is moved over a portion of the flexible interposer substrate 11 that is placed on the flat plate 6 side in order to bond the flexible interposer substrate 11 and the flat plate 6 to each other, the fixing jig 16 is preferably moved upward so as not to interfere with the action of the roller 17. Thus the flexible interposer substrate 11 is bonded to the semiconductor chip 1 so as to cover the entire circumference of the semiconductor chip 1, and the semiconductor device according to this embodiment is completed as shown in FIG. 13(*a*). Lastly, as shown in FIG. 13(*b*), the solder bumps 8 are formed by reflow of solder balls formed from Sn—Pb, Sn—Ag, Sn—Cu, Sn—Ag—Cu, Sn—Bi, Sn—Zn, or the like on the electrode pads 5 that are formed in the insulating resin 3 of the flexible interposer substrate 11 on the flat plate 6 side in order to secondarily mount the semiconductor device to an external substrate such as a motherboard. The maximum reflow temperature for forming the solder bumps 8 is set to 200 through 260° C. depending on the material of the solder balls used. In the case where the semiconductor device according this embodiment is secondarily mounted to the motherboard 9 as shown in FIG. 9, the solder bumps 8 formed on the semiconductor device and the electrode pads 5 formed on the motherboard 9 are positioned and then connected to each other by reflow.

In the manufacturing method described above, the semiconductor chip 1 and the flat plate 6 are bonded to the flexible interposer substrate 11 while heating the semiconductor chip 1, the flat plate 6, and the flexible interposer substrate 11 by the heater 15 with the heater 15 set to 150° C. The same effect can be obtained by forming the roller 17 from silicon rubber, TEFRON or other material that has excellent heat resistance, putting a resistor inside the roller % 17, and letting a current flow in the resistor to generate heat and warm the flexible interposer substrate 11 from the outside. In this case, the heater 15 is unnecessary and, more conveniently, the temperature at which the flexible interposer substrate 11 is heated can readily be changed by changing the amount of current given to the resistor that is put in the roller 17. If thermoplastic resin is used for the insulating resin 3 of the flexible interposer substrate 11 that faces outward, the temperature of the heater 15 has to be set precisely in order to prevent the insulating resin 3 from adhering to the heater 15 during heating. This is not necessary in heating by the roller 17 and the flexible interposer substrate 11 can be bonded to the semiconductor chip 1 and the flat plate 6 more conveniently.

Figure 15A:
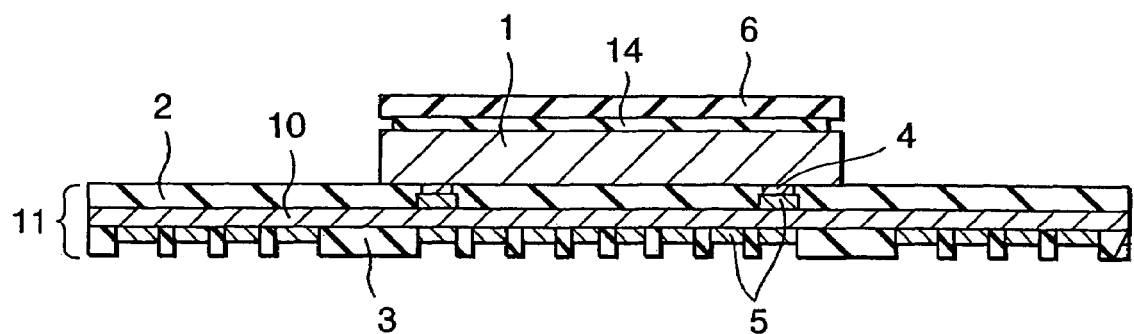
FIGS. 15(a) and (b) are sectional views showing manufacturing steps that follow FIG. 14.

Described next referring to FIGS. 15 and 16 is another method of manufacturing the semiconductor device according to the first embodiment. Similar to the manufacturing method described above, holes that reach the wiring pattern 10 at desired positions in the resin layers that constitute the flexible interposer substrate, namely, the thermoplastic resin 2 and the insulating resin 3 that is thermoplastic resin or thermosetting resin is formed by using a UV-YAG laser, a carbon dioxide gas laser, an excimer laser or the like. The electrode pads 5 are formed from conductive materials such as Ni/Au and Pd by a known method such as plating or sputtering in portions of the wiring pattern 10 that are exposed by the holes. In this way, the electrode pads 5 are formed on each side of the flexible interposer substrate. Thereafter, as shown in FIG. 15(a), the electrode pads 5 formed in the thermoplastic resin 2 are connected to the conductor 4 formed on the electrode pad on the circuit side of the semiconductor chip 1 by a known flip-chip technique, for example, hot press-fit using a flip-chip bonder or the like. Through the hot press-fit process for this flip-chip connection, the thermoplastic resin 2 seals portions around the conductor 4 and at the same time is bonded to the circuit side of the semiconductor chip 1. Then a temporary adhesive 14 is applied to the surface of the semiconductor chip 1 to fix the flat plate 6 by adhesion as shown in FIG. 15(a). Examples of adhesive suitable for the temporary adhesive 14 include hot melt adhesives such as ethylene-vinyl acetate copolymer resin (EVA), polyamide, polyester, and atactic polypropylene, phenol resin-based adhesives, urea resin-based adhesives, melamine resin-based adhesives, resorcin-based adhesives, α-olefin resin-based adhesives, vinyl acetate resin-based adhesives, and cyanoacrylate-based adhesives. These are suitable because their adhesion can be lost through exposure to high temperature, for example, ranging from 150 through 250° C.

Figure 15B:
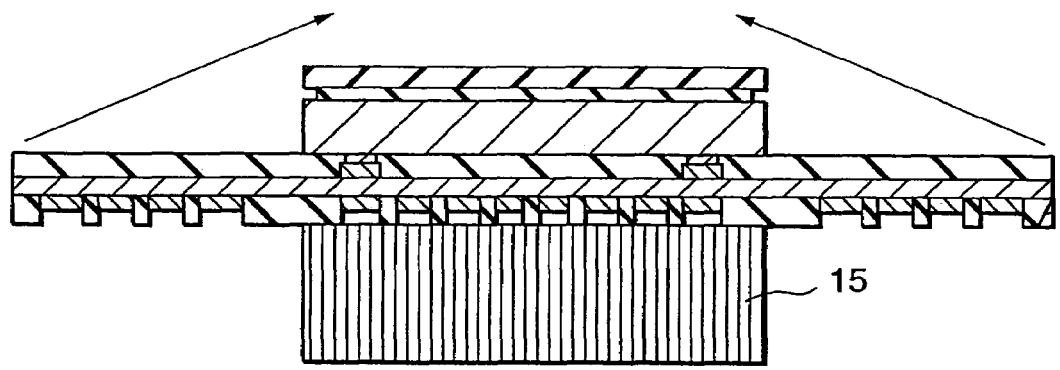
Figure 16A:
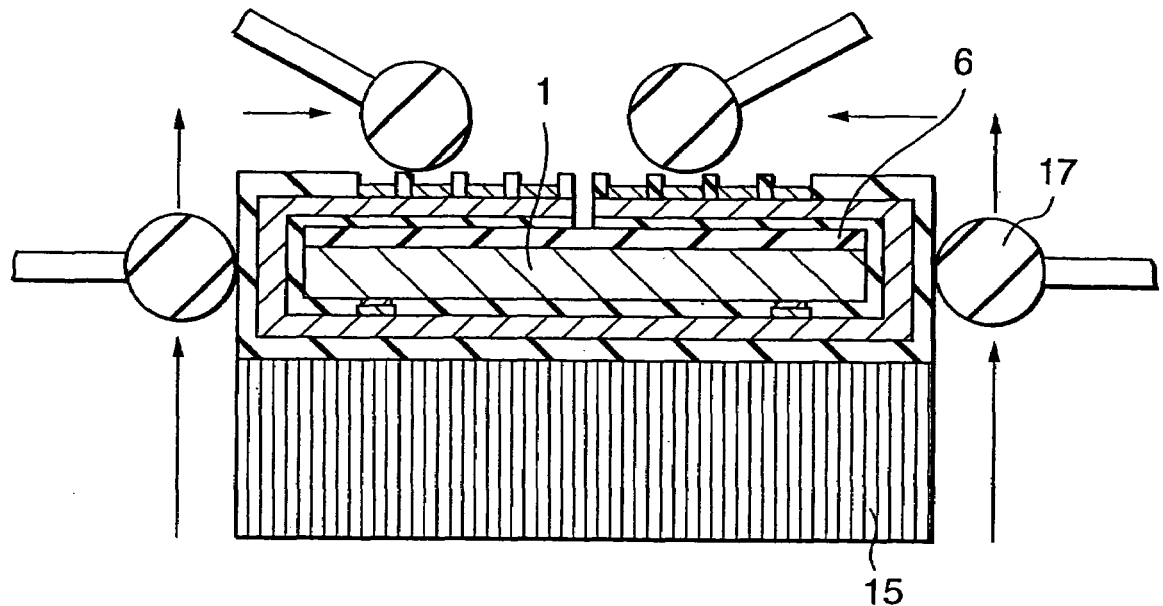
FIGS. 16 (a) through (c) are sectional views showing manufacturing steps that follow FIG. 15.
Figure 16B:
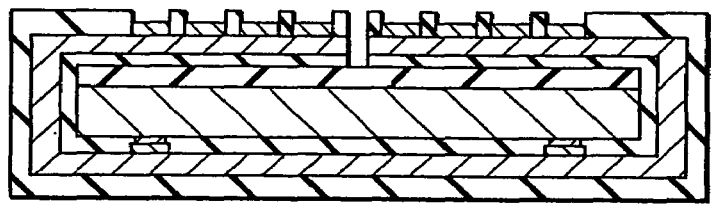
Figure 16C:
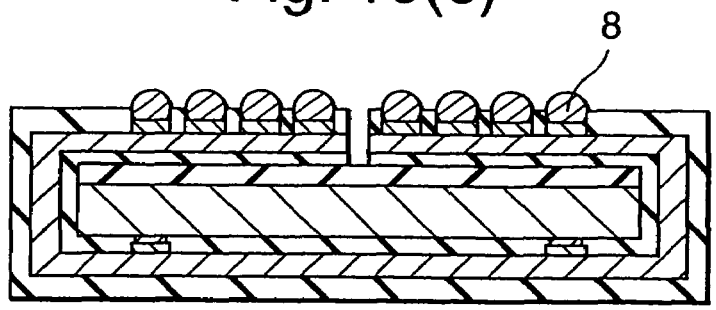

Next, the flexible interposer substrate 11 connected to the semiconductor chip 1 through the conductor 4 and the electrode pads 5 is set on a heater 15 as shown in FIG. 15(b). While heating the flexible interposer substrate 11, the flexible interposer substrate 11 is bent along the side faces and rear side of the semiconductor chip 1. When bending the flexible interposer substrate 11 in this manner, a roller 17 made of silicon, TEFRON or other material that has excellent heat resistance is used to apply load as large as 0.5 through 3 kg to the flexible interposer substrate from the outside and bond the flexible interposer substrate 11 to the front side of the semiconductor chip 1 as shown in FIG. 16(a). Thus the semiconductor device according to this embodiment is completed as shown in FIG. 16(b). The temperature of the heater 15 is set around 150° C. to bond the flexible interposer substrate 11 to the side faces of the semiconductor chip 1 and to the flat plate 6. Then the heater temperature is raised high enough to make the temporary adhesive 14 lose its adhesion, for example, around 200° C., so that the rear side of the semiconductor chip 1 and the flat plate 6 are not adhered to each other. Another method to prevent the rear side of the semiconductor chip 1 and the flat plate 6 from adhering to each other is removal of the temporary adhesive 14 by washing with an organic solvent such as ethanol, isopropyl alcohol, or methyl ethyl ketone. Alternatively, a heating process at 200° C. or higher in the later step of forming the solder bumps 8 may be utilized to make the adhesive lose its adhesion. If a water-soluble adhesive such as polyvinyl alcohol (PVA) is used for the temporary adhesive 14, the temporary adhesive 14 can easily be removed by washing with water or a solvent such as ethanol after assembling the semiconductor device is completed. This eliminates the need to change the temperature of the heater 15 to high in the middle of the process. In this way, the flexible interposer substrate 11 is bonded to the semiconductor chip 1 so as to cover the entire circumference of the semiconductor chip 1 and the semiconductor device according to this embodiment is completed as shown in FIG. 16(b). Lastly, as shown in FIG. 16(c), the solder bumps 8 are formed by reflow of solder balls formed from Sn—Pb, Sn—Ag, Sn—Cu, Sn—Ag—Cu, Sn—Bi, Sn—Zn, or the like on the electrode pads 5 that are formed in the insulating resin 3 of the flexible interposer substrate 11 on the flat plate 6 side in order to secondarily mount the semiconductor device to an external substrate such as a motherboard.

In this manufacturing method also, the effect provided by heating with the heater 15 can also be obtained by putting a resistor inside the roller 17 and heating the flexible interposer substrate 11 from the outside with the roller 17 to bond the flexible interposer substrate 11 to the semiconductor chip 1 and the flat plate 6.

The semiconductor chip 1 is, in general, made from a semiconductor substrate that has a rate of linear expansion of 3 through 4 ppm. On the other hand, the motherboard 9 or other external substrate to which such semiconductor chip 1 is secondarily mounted is made from a material with a rate of linear expansion of about 15 ppm, such as epoxy resin.

Therefore, in the prior art, when the semiconductor chip 1 is primarily mounted as CSP or other small-sized semiconductor device and the semiconductor device is secondarily mounted to the motherboard 9, the difference in the rate of linear expansion between the semiconductor chip 1 and the motherboard 9 could cause thermal expansion and cold shrinkage alternately depending on heat that is generated by driving the semiconductor chip 1 and an environment in which the semiconductor device is used. Because of the thermal expansion and cold shrinkage, the solder bumps 8 serving as contact points between the semiconductor device mounted with the semiconductor chip 1 and the motherboard 9 receive thermal stress repeatedly, with the result that the solder bumps 8 are deteriorated and their life span is shortened. However, in the first embodiment, the flat plate 6 is in contact with the surface of the semiconductor chip 1 but not fixed by adhesion to the surface of the semiconductor chip 1, thereby the flat plate 6 can absorb thermal stress which would be caused between the semiconductor chip 1 and the motherboard 9 in a conventional semiconductor device by thermal expansion or cold shrinkage of the motherboard 9 upon temperature change. Accordingly the plate can relieve thermal stress which is caused by difference in the rate of linear expansion between the semiconductor chip 1 and the motherboard 9 in a variation of temperature.

In addition, because the thermal stress can be relieved the underfill resin which is necessary in prior art is not needed in secondary mounting of the semiconductor device of this embodiment onto the motherboard 9. Accordingly, the number of steps to manufacture the semiconductor device can be reduced and thereby the manufacturing period and manufacture cost can be cut. In addition, the need to seal the solder bumps 8 with underfill resin is eliminated and therefore any defect that might be found in the later inspection step can be repaired easily. Moreover, the very reliability of the flip-chip connection between the semiconductor device and the motherboard 9 is improved greatly since the solder bumps 8 are not deteriorated by the thermal stress.

The material of the flat plate 6 is not particularly limited. However, the flat plate 6 preferably has the rate of linear expansion similar to that of the motherboard 9 in order to enable the flat plate 6 to absorb and relieve thermal expansion and cold shrinkage of the motherboard 9. For instance, when the rate of linear expansion of the semiconductor chip 1 is about 3 through 4 and the rate of linear expansion of the motherboard 9 is about 15 ppm, the flat plate 6 is preferably formed of a material with the rate of linear expansion of about 9 through 15 ppm, such as ceramic, glass epoxy resin, or bismaleimide triazine (BT) resin.

Second Embodiment

Figure 17:
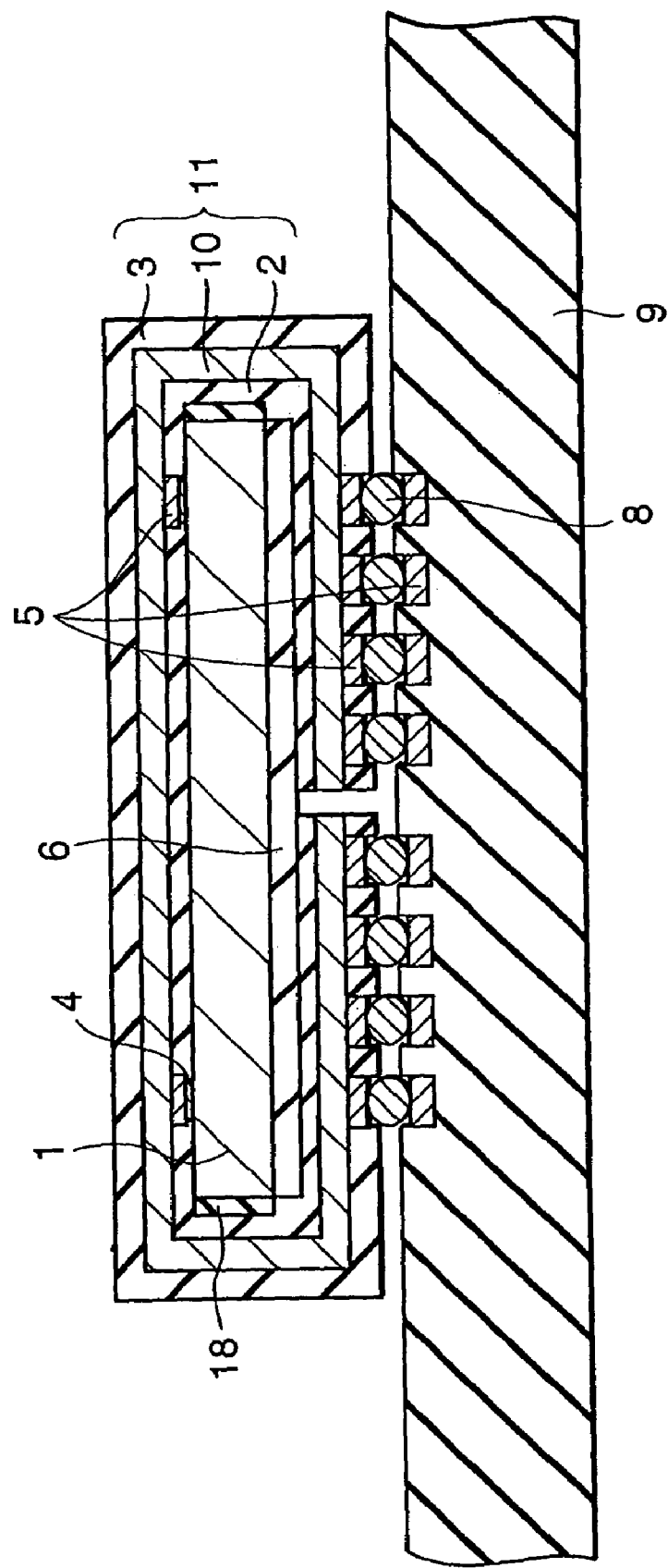
FIG. 17 is a sectional view showing a second embodiment of the present invention.

FIG. 17 is a sectional view of the semiconductor device according to the second embodiment of the present invention. The semiconductor device of the second embodiment is different from the first embodiment in that a non-adhesive agent 18 is applied to the side surface of the semiconductor chip 1. Element corresponding to those described above with respect to the first embodiment are identified with the same reference numerals and a detailed description thereof will be omitted for the sake of brevity.

A method of manufacturing the semiconductor device according to this embodiment is similar to the method of manufacturing the semiconductor device according to the first embodiment. Prior to bonding the flexible interposer substrate 11 to the circumference of the semiconductor chip 1, the non-adhesive agent 18 is applied to the side surface of the semiconductor chip 1. The non-adhesive agent 18 is formed of, for example, fluorocarbon resin such as polytetrafluoroethylene (PTFE) resin, perfluoroalkyl-tetrafluoroethylene copolymer (PFA) resin, or fluorinated ethylene-propylene copolymer (FEP) resin. Thereafter, the semiconductor chip 1 and the flat plate 6 are bonded to the flexible interposer substrate 11 and the solder bumps 8 are mounted to the electrode pads 5 on the flexible interposer substrate 11 by the same method that is employed in the manufacturing method of the first embodiment.

In this embodiment, the non-adhesive agent 18 is applied to the side surface of the semiconductor chip 1 to thereby reduce the area of a portion where the semiconductor chip 1 and the flexible interposer substrate 11 are bonded to each other. However, the same effect can be obtained if the temporary adhesive 14 described in detail in the first embodiment, instead of the non-adhesive agent 18, is applied to the side faces of the semiconductor chip 1 and is heated after the semiconductor device is completed to make the temporary adhesive 14 lose its adhesion.

In the second embodiment, the non-adhesive agent 18 is applied to the side faces of the semiconductor chip 1 to prevent not only the surface facing the colder bumps but also the side surface of the semiconductor chip 1 from being fixed by adhesion to the flexible interposer substrate 11. The area of a portion where the flexible interposer substrate 11 and the semiconductor chip 1 are adhered to each other is thus reduced. Therefore, when a motherboard 9 alternates between thermal expansion and cold shrinkage following temperature change, the semiconductor device according to this embodiment can avoid thermal stress, which is caused by the expansion/contraction movement of the motherboard 9, by making the flexible interposer substrate 11 expand and contract in sync with the expansion/contraction movement of the motherboard 9 through the solder bumps 8. In this way, secondary mounting of higher reliability than the first embodiment can be achieved.

Third Embodiment

Figure 18:
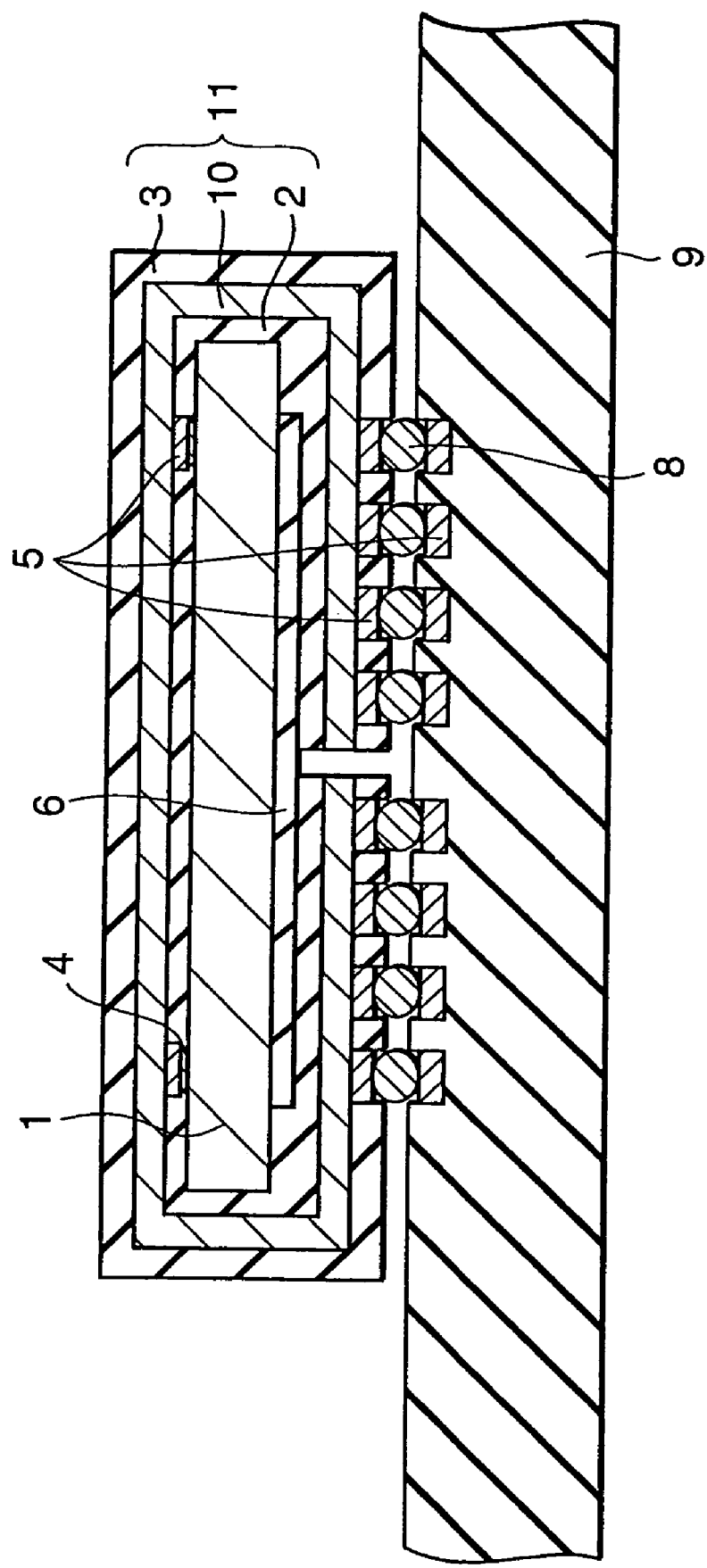
FIG. 18 is a sectional view showing a third embodiment of the present invention.

FIG. 18 is a sectional view of the semiconductor device according to a third embodiment of the present invention. The semiconductor device of the third embodiment is different from the first embodiment in the contour in plan view of the flat plate 6 is smaller than that of the semiconductor chip 1. The semiconductor device according to this embodiment is manufactured by using a flat plate 6 whose contour in plan view is smaller than that of the semiconductor chip 1, and by the same method that is employed in the manufacturing method of the first embodiment.

In the third embodiment, the flat plate 6 which is in contact with but not fixed by adhesion to the semiconductor chip 1 and which is bonded to the flexible interposer substrate 11 has a contour in plan view that is smaller in size than the flat plate 6 of the first embodiment. Therefore, the flexible interposer substrate 11 is affected less by thermal expansion and cold shrinkage which are due to temperature change in the flat plate 6, and making the flexible interposer substrate 11 to expand and contract in sync with the expansion/contraction movement of the motherboard 9 through the solder bumps 8 becomes easier. Accordingly, thermal stress due to the expansion/contraction movement of the motherboard can be prevented and secondary mounting of higher reliability can be achieved.

Fourth Embodiment

Figure 19:
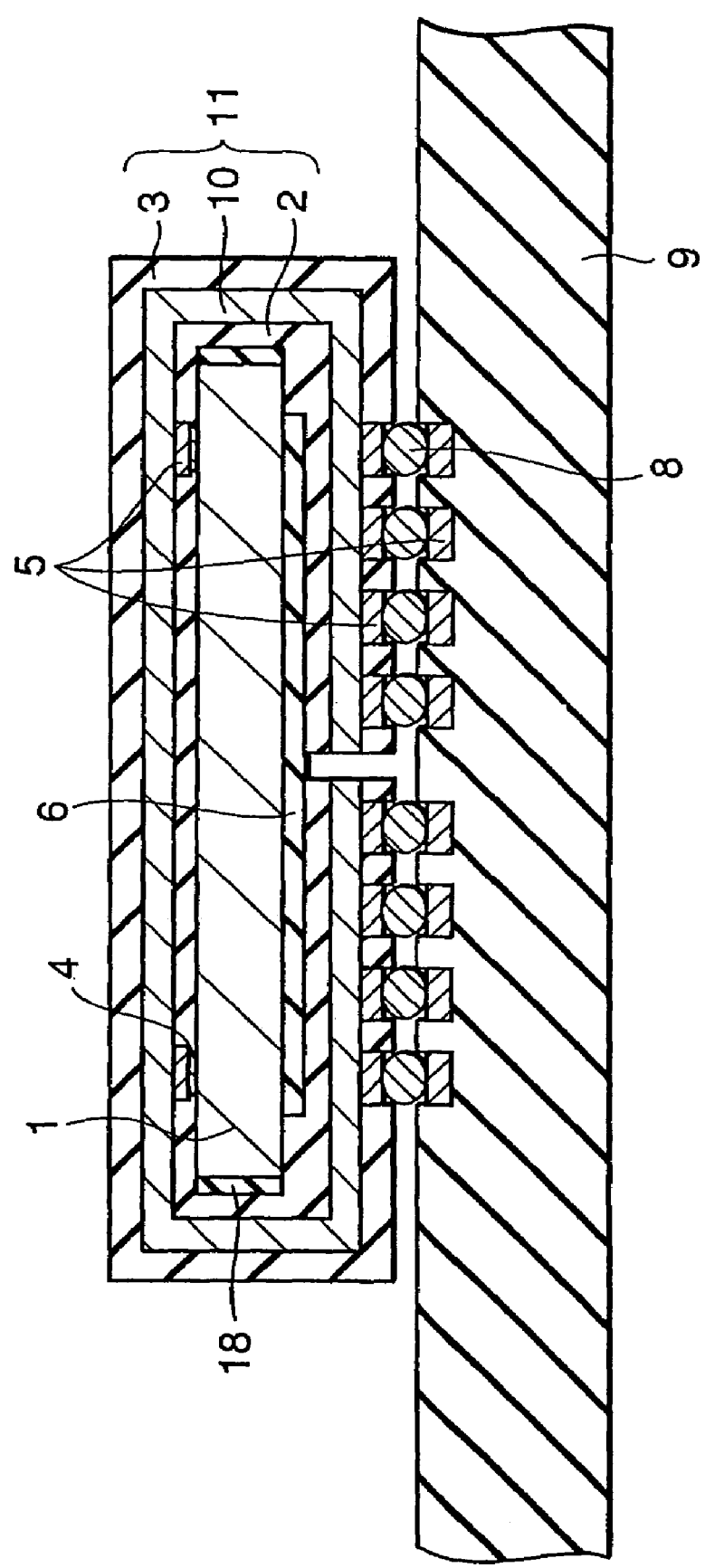
FIG. 19 is a sectional view showing a fourth embodiment of the present invention.

FIG. 19 is a sectional view of the semiconductor device according to the fourth embodiment of the present invention. The semiconductor device of the fourth embodiment is different from the second embodiment in that the contour in plan view of the flat plate 6 is smaller than that of the semiconductor chip 1. A method of manufacturing the semiconductor device according to the fourth embodiment is similar to the method of manufacturing the semiconductor device according to the second embodiment. Also, the flat plate 6 that is smaller in size than the semiconductor chip 1 is employed similar to the semiconductor device according to the third embodiment.

According to the fourth embodiment, a semiconductor device having the effects of both the second embodiment and the third embodiment can be manufactured. The semiconductor device according to this embodiment therefore can achieve secondary mounting with higher connection reliability.

Fifth Embodiment

FIG. 20 is a sectional view of a semiconductor device according to a fifth embodiment of the present invention. FIGS. 21 through 24 are sectional views showing a method of manufacturing the semiconductor device according to this embodiment. In the semiconductor device of this embodiment, as shown in FIG. 20, a small area of a flat plate 6 is fixed by adhesion of an adhesive 12 to the semiconductor chip 1. The contour in plan view of the flat plate 6 is substantially the same to that of the semiconductor chip 1. A flexible interposer substrate 11 covers the semiconductor chip 1 and the flat plate 6 by running along the entire circumference. The flexible interposer substrate 11 is composed of thermoplastic resin 2 placed on the semiconductor chip 1 side, insulating resin 3 that is thermoplastic resin or thermosetting resin placed on the side opposite to the thermoplastic resin 2, and a wiring pattern 10 that is interposed between the resin layers 2 and 3 and adhered thereto. A conductor 4 is formed on each electrode pad (not shown in the drawing) which is formed on the semiconductor chip 1 in a wafer step. The semiconductor chip 1 is connected by way of flip chip to the wiring pattern 10 in the flexible interposer substrate 11 through the conductor 4 and electrode pads 5 that are formed in the thermoplastic resin 2 bonded to the semiconductor chip 1. The insulating resin 3 facing outward has the plurality of electrode pads 5 for external connection. The bumps 8 are formed on the external connection electrode pads 5. The solder bumps 8 are respectively connected by way of flip chip to electrode pads 5 that are formed on a motherboard 9 serving as an external substrate. The semiconductor device according to this embodiment is thus structured.

Figure 21A:
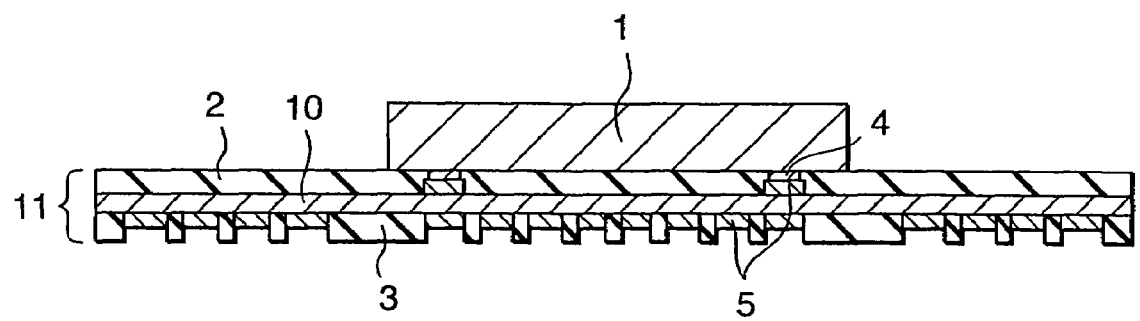
FIG. 21(a) through (c) are sectional views showing a manufacturing process according to the fifth embodiment of the present invention.
Figure 21B:
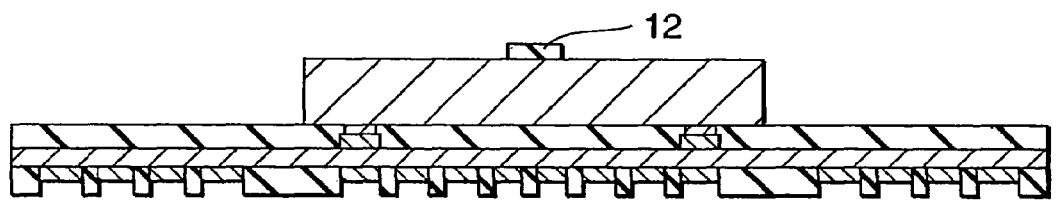
Figure 21C:
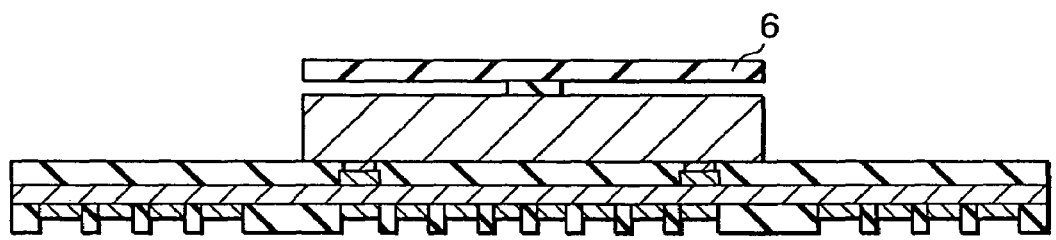

Next, a description is given with reference to FIGS. 21 through 24 on the method of manufacturing the semiconductor device according to this embodiment. Similar to the first embodiment, the method of manufacturing the semiconductor device according to this embodiment uses a UV-YAG laser, a carbon dioxide gas laser, an excimer laser or the like to form the plurality of holes that reach the wiring pattern 10 at desired positions in the resin layers that constitute the flexible interposer substrate, namely, the thermoplastic resin 2 and the insulating resin 3 that is thermoplastic resin or thermosetting resin. The electrode pads 5 are formed from conductive materials such as Ni/Au and Pd by a known method such as plating or sputtering in portions of the wiring pattern 10 that are exposed by the holes. In this way, the electrode pads 5 are formed on each side of the flexible interposer substrate. Thereafter, as shown in FIG. 21(*a*), the electrode pads 5 formed in the thermoplastic resin 2 are connected to the conductor 4 formed on the electrode pad on the semiconductor chip 1 by a known flip-chip technique, for example, hot press-fit using a flip-chip bonder or the like.

As shown in FIG. 21(*b*), an adhesive 12 is applied to a very small area at the center of the rear side of the semiconductor chip 1. The flat plate 6 is then put on the semiconductor chip 1 as shown in FIG. 21(*c*) to fix the flat plate 6 to the semiconductor chip 1 through the adhesive 12.

Figure 22:
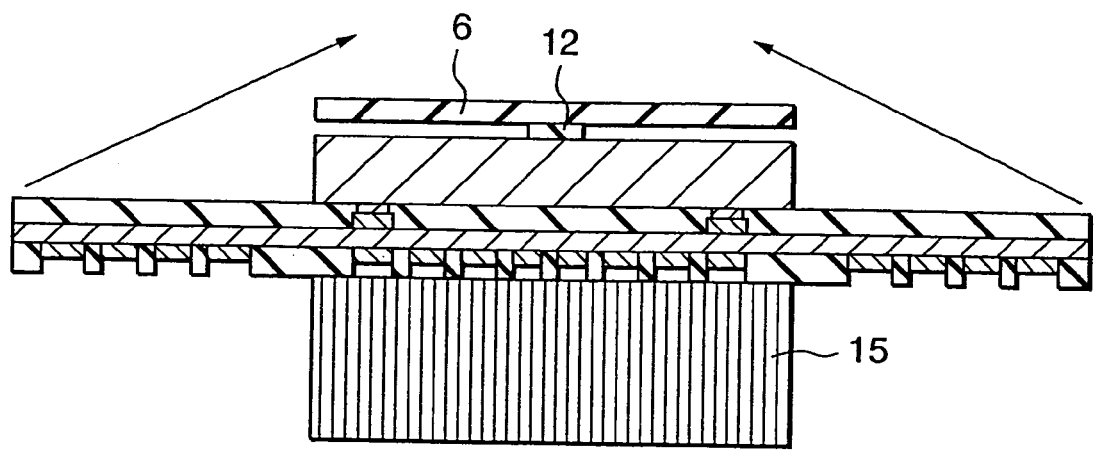
FIG. 22 is a sectional view showing the manufacturing step that follows FIG. 21.
Figure 23:
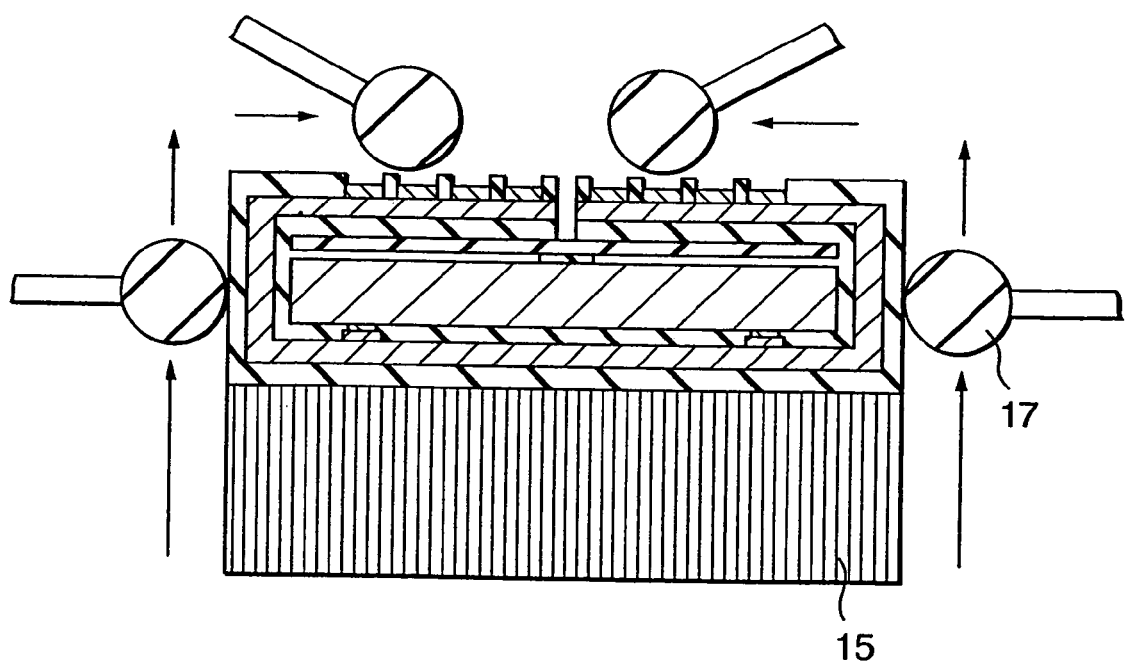
FIG. 23 is a sectional view showing the manufacturing step that follows FIG. 22.
Figure 24A:
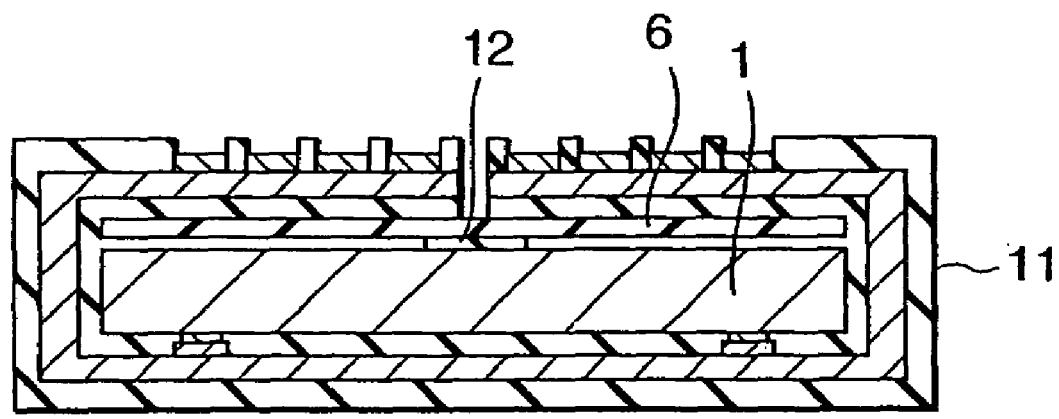
FIGS. 24(a) and (b) are sectional views showing the manufacturing steps that follow FIG. 23.
Figure 24B:
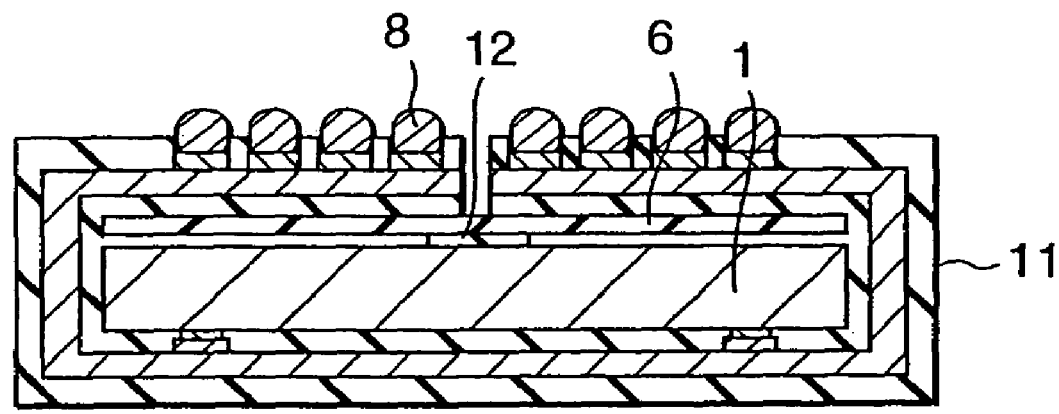

Next, the flexible interposer substrate 11 connected to the semiconductor chip 1 through the conductor 4 and the electrode pads 5 is placed such that the insulating resin 3 to which the semiconductor chip 1 is not connected is brought into contact with the top face of a heater 15 as shown in FIG. 22. Next, as shown in FIG. 23, the flexible interposer substrate 11 is bent along the side faces and rear side of the semiconductor chip 1 while heated on the heater 15. Thus the flexible interposer substrate 11 is bonded to the semiconductor chip 1 so as to cover the entire circumference of the semiconductor chip 1, and the semiconductor device according to this embodiment is completed as shown in FIG. 24(*a*). Lastly, as shown in FIG. 24(*b*), the solder bumps 8 are formed on the electrode pads 5 that are formed in the insulating resin 3 of the flexible interposer substrate 11 on the flat plate 6 side in order to secondarily mount the semiconductor device to an external substrate such as a motherboard. In the case where the semiconductor device according this embodiment is secondarily mounted to the motherboard 9 as shown in FIG. 20, the solder bumps 8 formed on the semiconductor device and the electrode pads 5 formed on the motherboard 9 are positioned and then connected to each other by reflow.

In the manufacturing method described above, the semiconductor chip 1 and the flat plate 6 are bonded to the flexible interposer substrate 11 while heating the flat plate 6 and the flexible interposer substrate 11 by the heater 15. As in the first embodiment, the same effect can be obtained by forming a roller 17 from silicon rubber, TEFRON or other material that has excellent heat resistance, putting a resistor inside the roller 17, and letting a current flow in the resistor to generate heat and warm the flexible interposer substrate 11 from the outside.

An adhesive preferred as the adhesive 12 is composed of a material whose adhesion is not lowered at a temperature around 150° C., which is the heating temperature used to bond the flexible interposer substrate 11, and an epoxy resin-based adhesive or a silicon-based adhesive, for example, can be used. A different application method can be employed for the adhesive 12 to obtain the effect of the above manufacturing method; the adhesive 12 is applied in advance to the center of the flat plate 6 and then the flat plate 6 is put on the semiconductor chip 1 such that the side of the flat plate 6 to which the adhesive 12 is applied comes into contact with the rear side of the semiconductor chip 1.

This embodiment lowers the possibility of accidentally putting the semiconductor chip 1 and the flat plate 6 out of alignment by applying the adhesive 12 to a very small area of the semiconductor chip 1 and fixing by adhesion the semiconductor chip 1 and the flat plate 6 to each other. Therefore, the semiconductor device obtained is high in yield in the semiconductor manufacturing process and has higher connection reliability in secondary mounting to the motherboard 9. In addition, unlike the manufacturing method of the first embodiment, it is not necessary to use the material fixing jig 16 to fix the flat plate 6 to the rear side of the semiconductor chip 1 in bonding the flexible interposer substrate 11 to the semiconductor chip 1 and the flat plate 6.

Sixth Embodiment

FIG. 25 is a sectional view of the semiconductor device according to the sixth embodiment of the present invention. The semiconductor device of this embodiment is different from the fifth embodiment in that a non-adhesive agent 18 is applied to the side faces of the semiconductor chip 1.

A method of manufacturing the semiconductor device according to this embodiment is similar to the manufacturing method of the fifth embodiment. However, this embodiment adds a step of applying the non-adhesive agent 18 to the side surface of the semiconductor chip 1 before the step of bonding the semiconductor chip 1 and the flat plate 6 to the flexible interposer substrate 11 as in the second embodiment.

This embodiment can provide the effects of both the second embodiment and the fifth embodiment. To elaborate, thermal stress caused by expansion/contraction movement of the motherboard 9 can be avoided by making the flexible interposer substrate 11 expand and contract in sync with the expansion/contraction movement of the motherboard 9 through the solder bumps 8 when the motherboard 9 alternates between thermal expansion and cold shrinkage following temperature change. In addition, the possibility of accidentally putting the semiconductor chip 1 and the flat plate 6 out of alignment in the later semiconductor device assembling step is lowered. Accordingly, the semiconductor device obtained is high in yield in the semiconductor manufacturing process and has higher connection reliability in secondary mounting to the motherboard 9.

Seventh Embodiment

Figure 26:
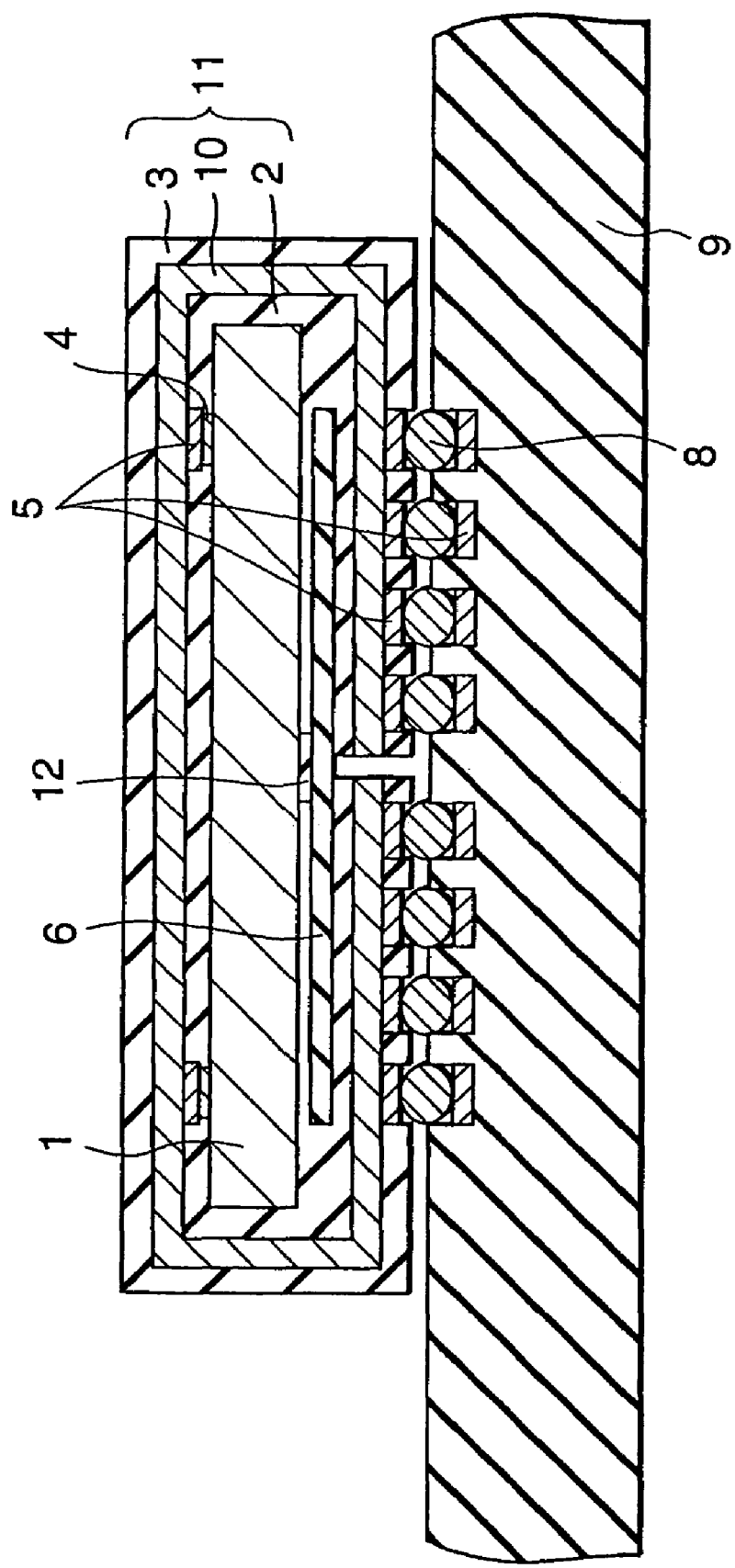
FIG. 26 is a sectional view showing a seventh embodiment of the present invention.

A semiconductor device of the seventh embodiment, as shown in FIG. 26, is different from the fifth embodiment in that a contour in plan view of the flat plate 6 is smaller than that of the semiconductor chip 1. The manufacturing of the semiconductor device of the seventh embodiment is also similar to the fifth embodiment and the third embodiment.

This embodiment can provide the effects of the third embodiment and the fifth embodiment both. To elaborate, since the flat plate 6 is smaller in contour size than the semiconductor chip 1, thermal stress caused by expansion/contraction movement of the motherboard 9 can be avoided by making the flexible interposer substrate 11 expand and contract in sync with the expansion/contraction movement of the motherboard 9 through the solder bumps 8 when the motherboard 9 alternates between thermal expansion and cold shrinkage following temperature change. In addition, the possibility of accidentally putting the semiconductor chip 1 and the flat plate 6 out of alignment in the later semiconductor device assembling step is lowered. Accordingly, the semiconductor device obtained is high in yield in the semiconductor manufacturing process and has higher connection reliability in secondary mounting to the motherboard 9.

Eight Embodiment

FIG. 27 is a sectional view of the semiconductor device according to the eighth embodiment of the present invention. The semiconductor device of this embodiment is different from the sixth embodiment in that the contour in plan view of the flat plate 6 is smaller than that of the semiconductor chip 1.

A method of manufacturing the semiconductor device according to this embodiment is similar to the manufacturing method of the sixth embodiment. Also, the manufacturing method of this embodiment has a step of applying the flat plate of which the contour in plan view is smaller than that of the semiconductor chip 1 as in the third embodiment.

This embodiment can provide the effects of both the sixth embodiment and the seventh embodiment. To elaborate, thermal stress caused by expansion/contraction movement of the motherboard 9 can be avoided by making the flexible interposer substrate 11 expand and contract in sync with the expansion/contraction movement of the motherboard 9 through the solder bumps 8 when the motherboard 9 alternates between thermal expansion and cold shrinkage following temperature change. In addition, the possibility of accidentally putting the semiconductor chip 1 and the flat plate 6 out of alignment in the later semiconductor device assembling step is lowered. Accordingly, the semiconductor device obtained is high in yield in the semiconductor manufacturing process and has higher connection reliability in secondary mounting to the motherboard 9.

Ninth Embodiment

FIG. 28 is a sectional view of the semiconductor device according to the ninth embodiment of the present invention. FIGS. 29 through 32 are sectional views showing a method of manufacturing the semiconductor device according to this embodiment. The semiconductor device of this embodiment, as shown in FIG. 28, a non-adhesive agent 18 is applied to the surface facing the solder bumps of the semiconductor chip 1, except only a small area at the center of the semiconductor chip 1. The flexible interposer substrate 11 covers the semiconductor chip 1 and the flat plate 6 by running along the entire circumference. The flexible interposer substrate 11 is composed of thermoplastic resin 2 placed on the semiconductor chip 1 side, insulating resin 3 that is thermoplastic resin or thermosetting resin placed on the side opposite to the thermoplastic resin 2, and a wiring pattern 10 that is interposed between the resin layers 2 and 3 and adhered thereto. The flexible interposer substrate 11 is bonded by the thermoplastic resin 2 to the semiconductor chip 1 at a portion of the rear side of the semiconductor chip 1 where the non-adhesive agent 18 is not applied. A conductor 4 is formed on each electrode pad (not shown in the drawing) which is formed on the semiconductor chip 1 in a wafer step. The semiconductor chip 1 is connected by way of flip chip to the wiring pattern 10 in the flexible interposer substrate 11 through the conductor 4 and electrode pads 5 that are formed in the thermoplastic resin 2 bonded to the semiconductor chip 1. The insulating resin 3 facing outward has the plurality of electrode pads 5 for external connection. The bumps 8 are formed on the external connection electrode pads 5. The solder bumps 8 are respectively connected by way of flip chip to electrode pads 5 that are formed on the motherboard 9 serving as the external substrate. The semiconductor device according to this embodiment is thus structured.

Figure 29A:
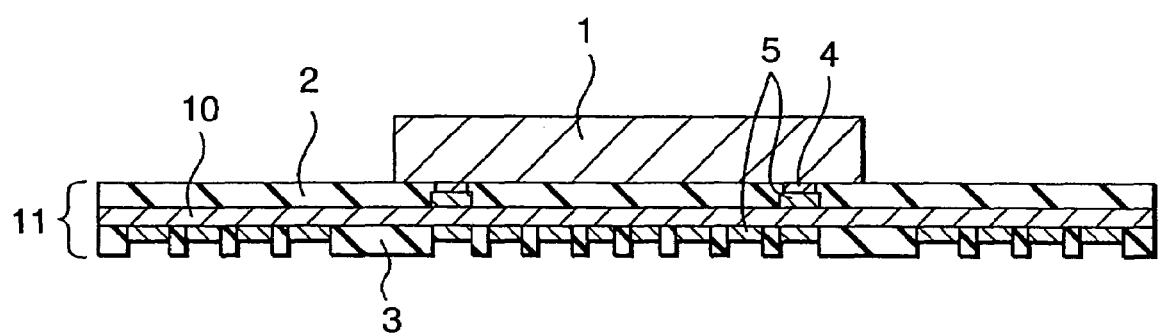
FIGS. 29(a) and (b) are sectional views showing the manufacturing process according to the ninth embodiment of the present invention.
Figure 29B:
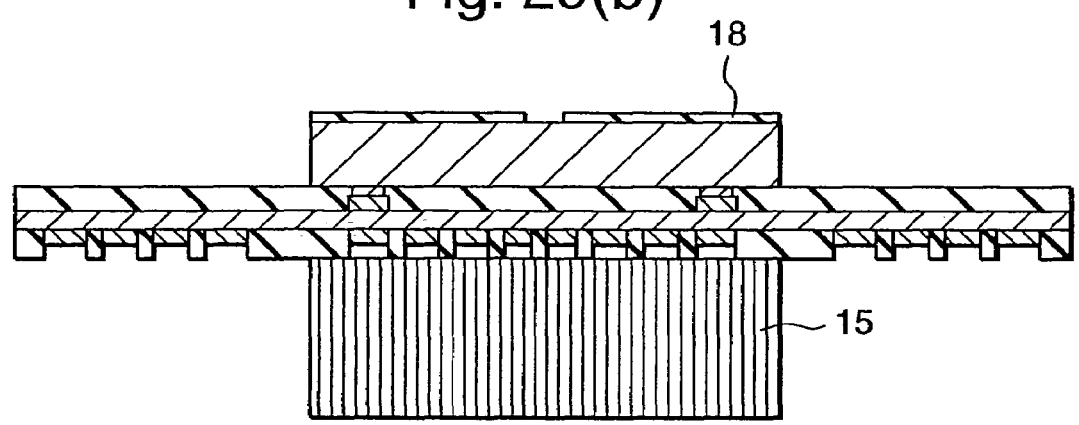

Next, a description is given with reference to FIGS. 29 through 32 on the method of manufacturing the semiconductor device according to this embodiment. Similar to the first embodiment, the method of manufacturing the semiconductor device according to this embodiment uses a UV-YAG laser, a carbon dioxide gas laser, an excimer laser or the like to form the plurality of holes that reach the wiring pattern 10 at desired positions in the resin layers that constitute the flexible interposer substrate, namely, the thermoplastic resin 2 and the insulating resin 3 that is thermoplastic resin or thermosetting resin. The electrode pads 5 are formed from conductive materials such as Ni/Au and Pd by a known method such as plating or sputtering in portions of the wiring pattern 10 that are exposed by the holes. In this way, the electrode pads 5 are formed on each side of the flexible interposer substrate. Thereafter, as shown in FIG. 29(*a*), the electrode pads 5 formed in the thermoplastic resin 2 are connected to the conductor 4 formed on the electrode pad on the circuit side of the semiconductor chip 1 by a known flip-chip technique, for example, hot press-fit using a flip-chip bonder or the like.

Figure 30:
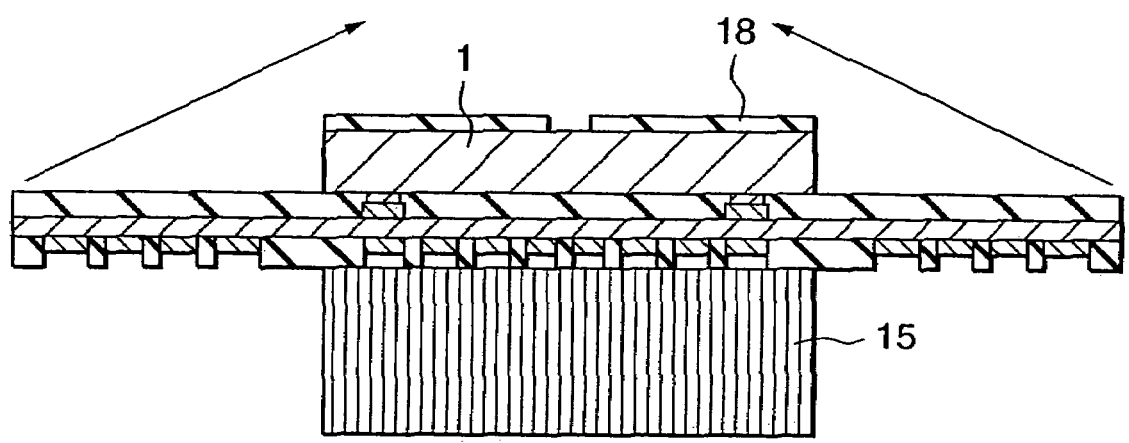
FIG. 30 is a sectional view showing the manufacturing step that follows FIG. 29.
Figure 31A:
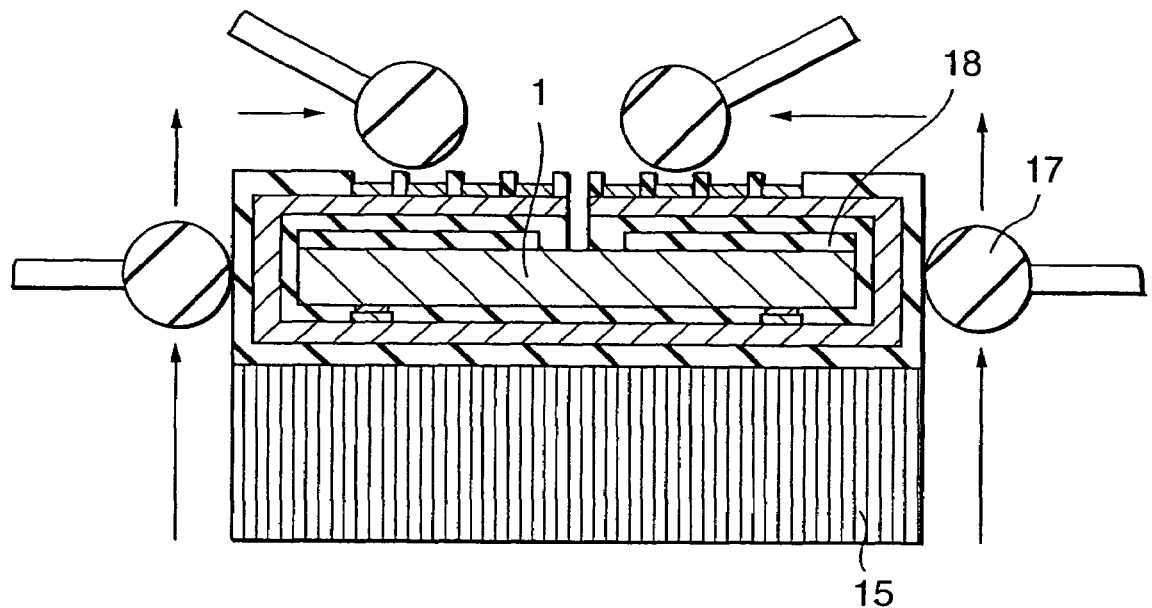
FIGS. 31(a) through (c) are sectional views showing the manufacturing steps that follow FIG. 30.
Figure 31B:
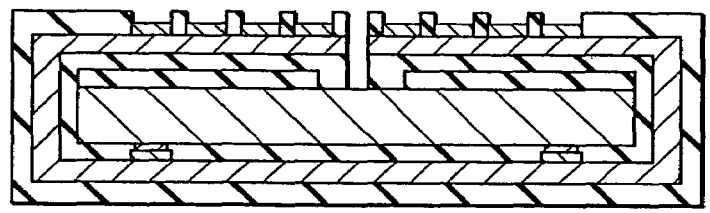
Figure 31C:
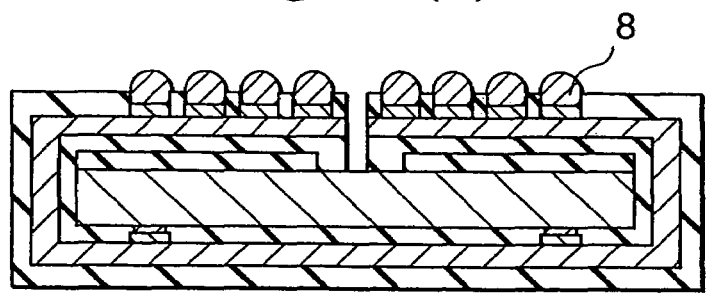

As shown in FIG. 29(*b*), the non-adhesive agent 18 is applied to the rear side of the semiconductor chip 1 except an area at the center thereof. The flexible interposer substrate 11 connected to the semiconductor chip 1 through the conductor 4 and the electrode pads 5 is then placed such that the insulating resin 3 to which the semiconductor chip 1 is not connected is brought into contact with the top face of a heater 15, and is fixed by vacuum suction. Next, as shown in FIG. 30, the flexible interposer substrate 11 is bent along the side faces and rear side of the semiconductor chip 1 while heated on the heater 15. Then the roller 17 made of silicon, TEFRON or other material that has excellent heat resistance is used to apply load as large as 0.5 through 3 kg to the flexible interposer substrate from the outside and bond the flexible interposer substrate 11 to the front side of the semiconductor chip 1 as shown in FIG. 23(*a*). Thus the flexible interposer substrate 11 is bonded to the semiconductor chip 1 so as to cover the entire circumference of the semiconductor chip 1, and the semiconductor device according to this embodiment is completed as shown in FIG. 31(*b*). Lastly, as shown in FIG. 31 (*c*), the solder bumps 8 are formed on the electrode pads 5 that are formed in the insulating resin 3 of the flexible interposer substrate 11 in order to secondarily mount the semiconductor device to the external substrate such as a motherboard.

In the manufacturing method described above, the semiconductor chip 1 is bonded to the flexible interposer substrate 11 while heating the flexible interposer substrate 11 by the heater 15. As in the first embodiment, the same effect can be obtained by forming the roller 17 from silicon rubber, TEFRON or other material that has excellent heat resistance, putting a resistor inside the roller 17, and letting a current flow in the resistor to generate heat and warm the flexible interposer substrate 11 from the outside.

A different method for applying the non-adhesive agent 18 to the semiconductor chip 1 can be employed to obtain the same effect; as shown in FIG. 32(*a*), a desired portion of the thermoplastic resin 2 of the flexible interposer substrate 11 is chosen from the surface of the thermoplastic resin 2 that faces the surface to be facing the solder bumps of the semiconductor chip 1, and the non-adhesive agent 18 is applied in advance to this desired portion where the semiconductor chip 1 is not adhered. Another method to obtain the same effect is shown in FIG. 32(*b*); a desired portion of the thermoplastic resin 2 of the flexible interposer substrate 11 is chosen from the surface of the thermoplastic resin 2 that faces the surface to be facing the solder bumps of the semiconductor chip 1, the desired portion which is to be adhered to the semiconductor chip 1 is covered and protected with a mask member 19 made from a metal plate or the like, and then a desired portion which is not to be adhered to the semiconductor chip 1 is exposed to plasma 20 by known plasma etching or the like, thereby making a portion of the thermoplastic resin 2 that is not bonded to the semiconductor chip 1 lose its adhesion.

In this embodiment, a very small area of the semiconductor chip 1 is fixed by adhesion to the flexible interposer substrate 11. Thus a structure for avoiding fixing the semiconductor chip 1 to the flexible interposer substrate 11 by adhesion is obtained without using the flat plate 6 that is employed in the other embodiments, while maintaining the flatness of the flexible interposer substrate 11. Accordingly, as in other embodiments, thermal stress caused by expansion/contraction movement of the motherboard 9 can be avoided by making the flexible interposer substrate 11 expand and contract in sync with the expansion/contraction movement of the motherboard 9 through the solder bumps 8 when the motherboard 9 alternates between thermal expansion and cold shrinkage following temperature change.

Tenth Embodiment

Figure 33:
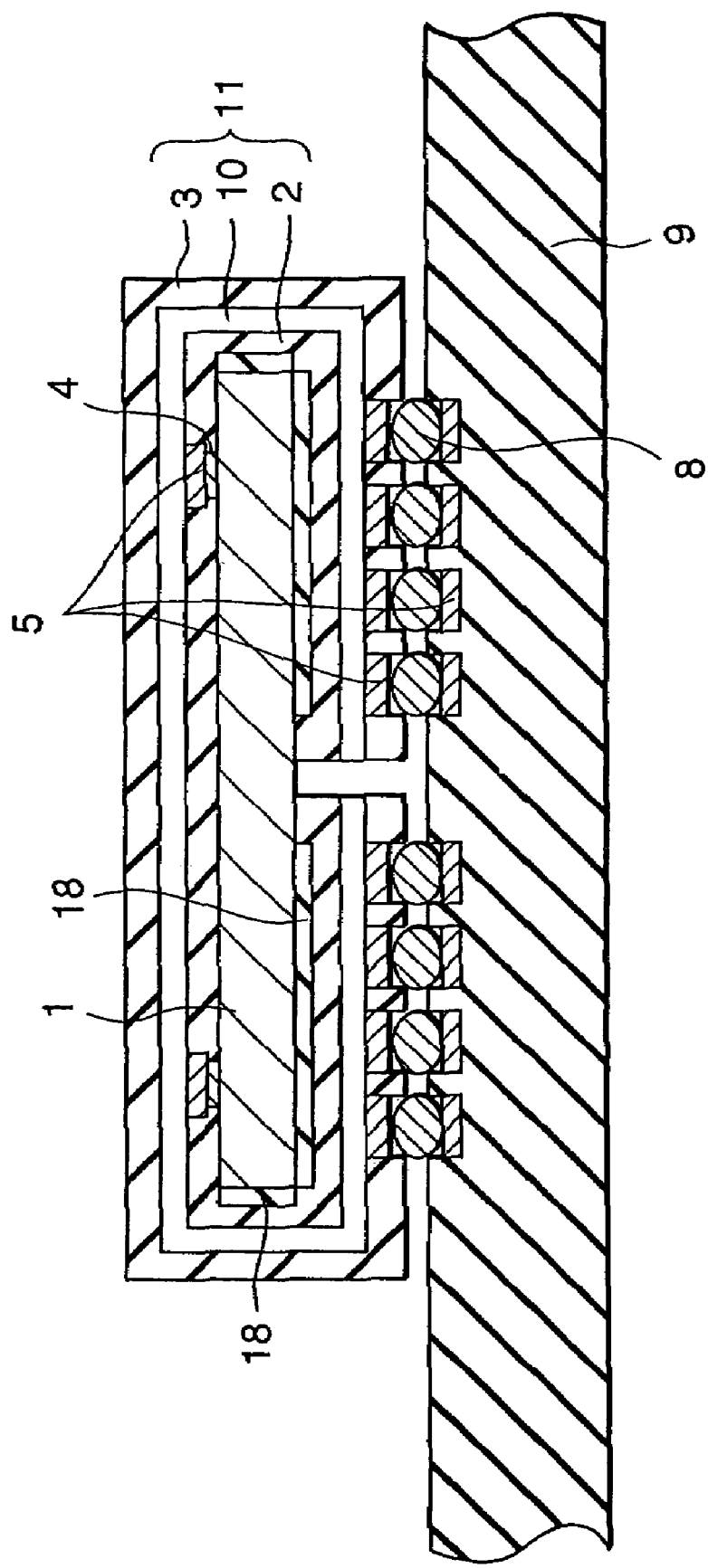
FIG. 33 is a sectional view showing a tenth embodiment of the present invention.

FIG. 33 is a sectional view of the semiconductor device according to the tenth embodiment of the present invention. The semiconductor device of this embodiment, as shown in FIG. 33, is different from the ninth embodiment in that a non-adhesive agent 18 is applied to the side surface of the semiconductor chip 1. The semiconductor device according to this embodiment can be manufactured by the same method that is employed in the manufacturing method of the ninth embodiment and the second embodiment.

In this embodiment, the non-adhesive agent 18 is applied to the entire surface facing the solder bumps of the semiconductor chip 1 except a very small area at the center of the surface, and to the side surface of the semiconductor chip 1 in order to prevent the semiconductor chip 1 and the flexible interposer substrate 11 from bonding to each other. Similar to the ninth embodiment, the semiconductor device according to this embodiment thus obtains a structure for avoiding fixing the semiconductor chip 1 to the flexible interposer substrate 11 by adhesion without using the flat plate 6 while maintaining the flatness of the flexible interposer substrate 11. Furthermore, since the side faces of the semiconductor chip 1 are not bonded to the flexible interposer substrate 11, the semiconductor device according to this embodiment is more effective in avoiding thermal stress, which is caused by expansion/contraction movement of the motherboard 9 when the motherboard 9 alternates between thermal expansion and cold shrinkage following temperature change, by making the flexible interposer substrate 11 expand and contract in sync with the expansion/contraction movement of the motherboard 9 through the solder bumps 8.

Eleven Embodiment

Figure 34:
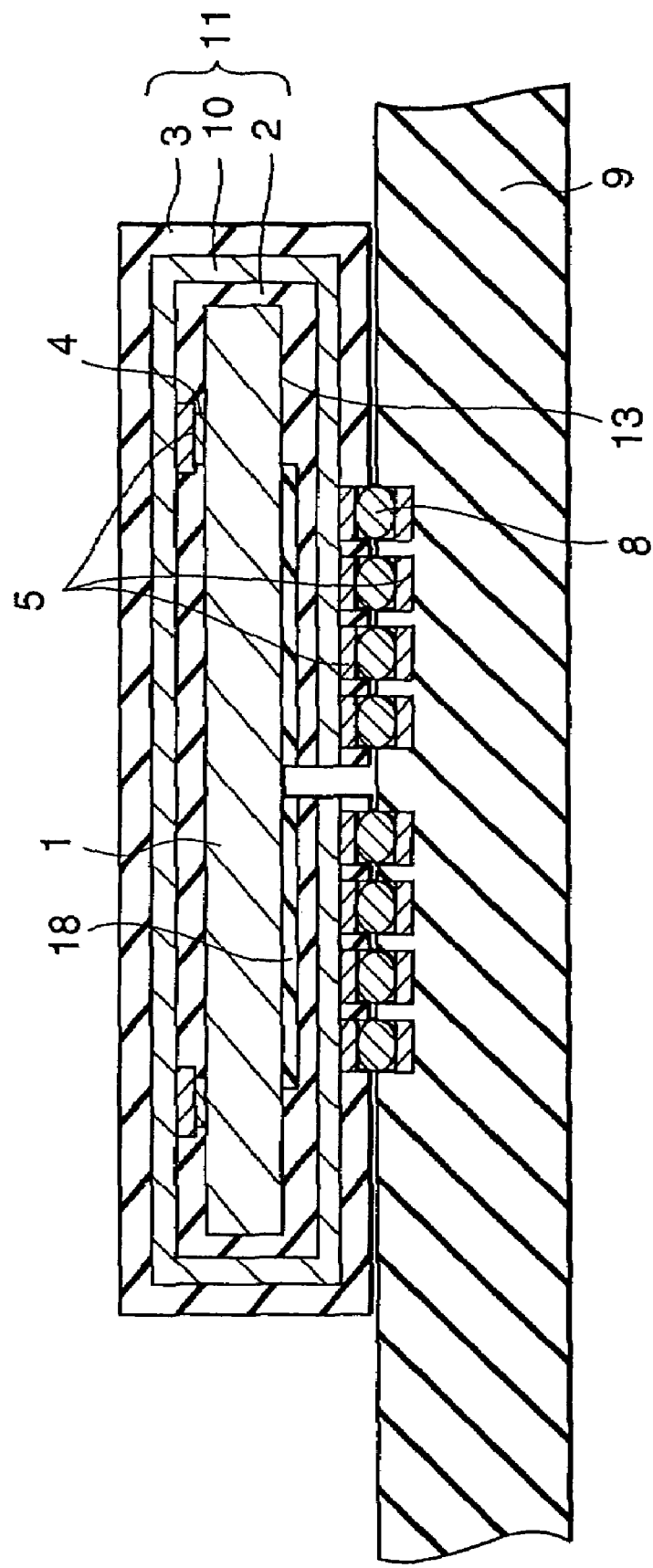
FIG. 34 is a sectional view showing an eleventh embodiment of the present invention.

FIG. 34 is a sectional view of the semiconductor device according to the eleventh embodiment of the present invention. The semiconductor device of this embodiment, as shown in FIG. 34, is different from the ninth embodiment in that a non-adhesive agent 18 is applied to the surface to be facing the solder bumps of a semiconductor chip 1 except the rim thereof. The semiconductor device according to this embodiment can be manufactured by the same method that is employed in the manufacturing method of the ninth embodiment.

In this embodiment, the non-adhesive agent 18 is applied to the entire surface facing the solder bumps of the semiconductor chip 1 except a very small area on the rim and the center part thereof in order to prevent the semiconductor chip 1 and the flexible interposer substrate 11 from bonding to each other. The semiconductor device according to this embodiment thus can obtain the similar effect to the ninth embodiment.

In the ninth through the eleventh embodiment the portion where the semiconductor chip 1 and the flexible interposer substrate 11 are not bonded to each other is no particular limitation. The position and area of the portion where the semiconductor chip 1 and the flexible interposer substrate 11 are fixed to each other are not limited and it may be such that the flexible interposer substrate 11 can be restrained from having too great a degree of freedom and that the solder bumps 8 and the electrode pads 5 on the motherboard 9 are positioned with no problem in the secondary mounting step. The bonded portion can have any surface area at any place as long as the flexible interposer substrate 11 maintains enough flatness to keep the connection reliability in the secondary mounting step.

Twelfth Embodiment

Figure 35:
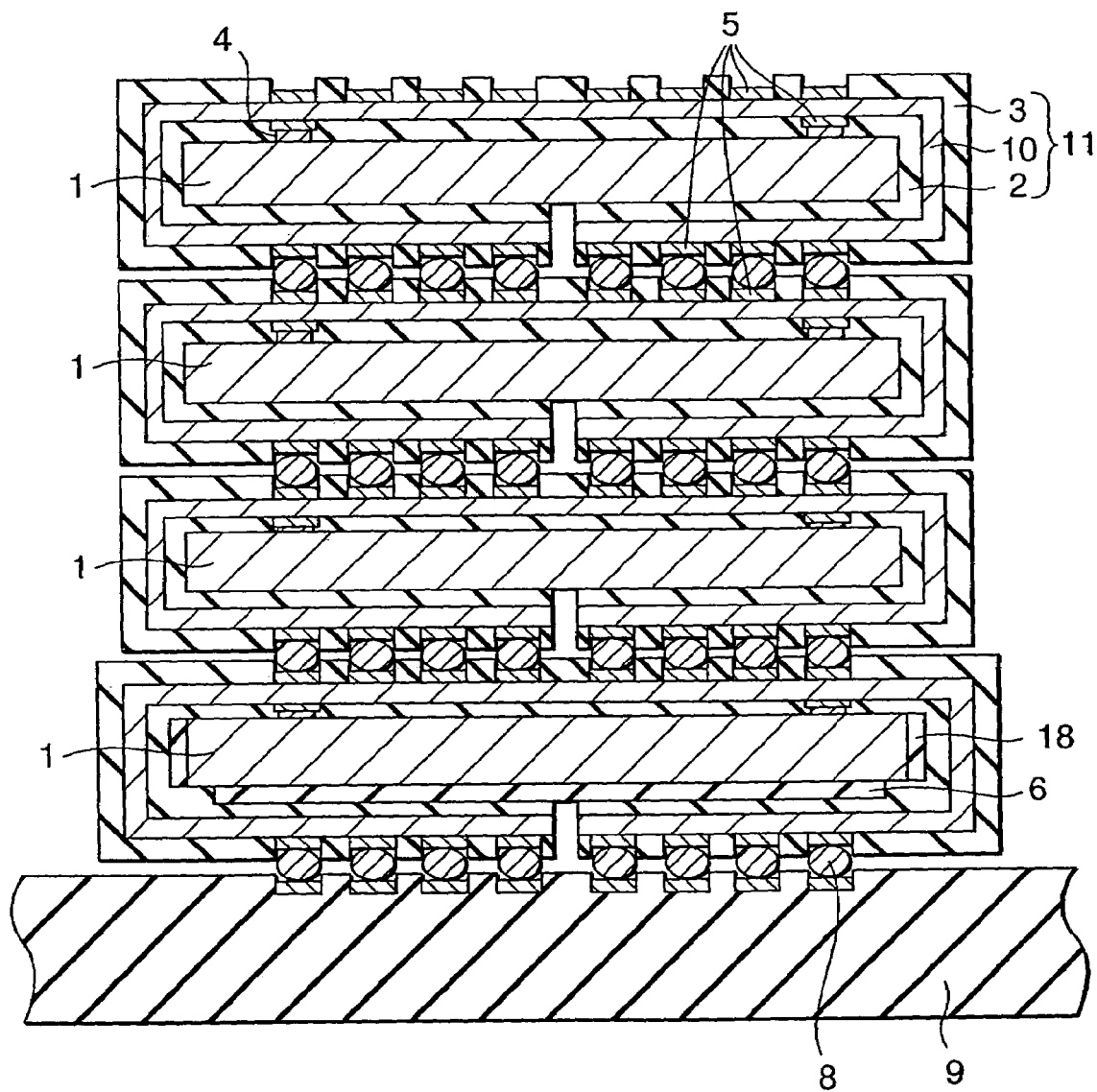
FIG. 35 is a sectional view showing a twelfth embodiment of the present invention.

FIG. 35 is a sectional view of the semiconductor device according to the twelfth embodiment of the present invention. In this embodiment, a three-dimensional semiconductor device built by stacking four semiconductor devices according to a CSP technique is secondarily mounted onto a motherboard 9. The semiconductor device 200 according to the second prior art constitutes each of the first through third stages of this three-dimensional semiconductor device whereas the semiconductor device according to the fourth embodiment of the present invention constitutes the fourth stage, which is the lowermost stage. The semiconductor devices are connected to one another through solder bumps 8 for forming connection between electrode pads 5 that are formed on their respective flexible interposer substrates 11. The solder bumps 8 formed in the lowermost semiconductor device according to the fourth embodiment are connected to electrode pads 5 on the motherboard 9.

In the twelfth embodiment, the semiconductor device according to the fourth embodiment of the present invention is employed as the semiconductor device which is placed on the lowermost stage of the three-dimensional semiconductor device and which is affected by thermal stress from the motherboard 9. This embodiment thus prevents lowering of connection reliability due to fatigue breakage of the solder bumps 8 which is brought by the thermal stress. Although a three-dimensional semiconductor device composed of four semiconductor devices is taken as an example in this embodiment, the number of semiconductor devices that constitute the three-dimensional semiconductor device is not limited and a desired number equal to or larger than 2 can be chosen.

Thirteenth Embodiment

Figure 36:
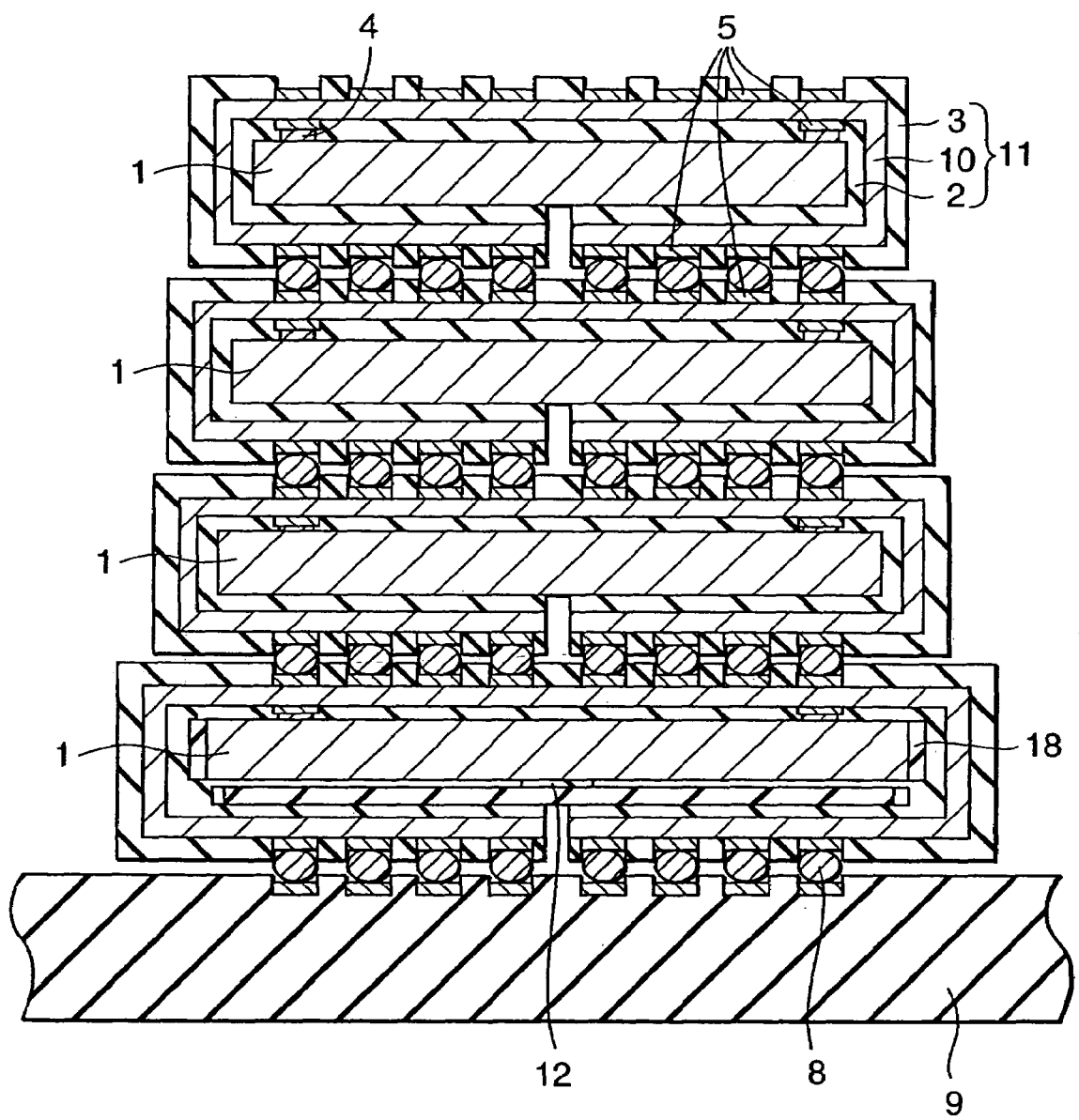
FIG. 36 is a sectional view showing a thirteenth embodiment of the present invention.

FIG. 36 is a sectional view of the semiconductor device according to the thirteenth embodiment of the present invention. This embodiment is different from the twelfth embodiment in that the semiconductor device according to the sixth embodiment of the present invention constitutes the fourth stage, which is the lowermost stage.

In the thirteenth embodiment, the semiconductor device according to the sixth embodiment of the present invention is employed as the semiconductor device which is placed on the lowermost stage of the three-dimensional semiconductor device and which is affected by thermal stress from the motherboard 9. This embodiment thus prevents lowering of connection reliability due to fatigue breakage of the solder bumps 8 which is brought by the thermal stress. Although a three-dimensional semiconductor device composed of four semiconductor devices is taken as an example in this embodiment, the number of semiconductor devices that constitute the three-dimensional semiconductor device is not particularly limited and a desired number equal to or larger than 2 can be chosen.

Fourteenth Embodiment

Figure 37:
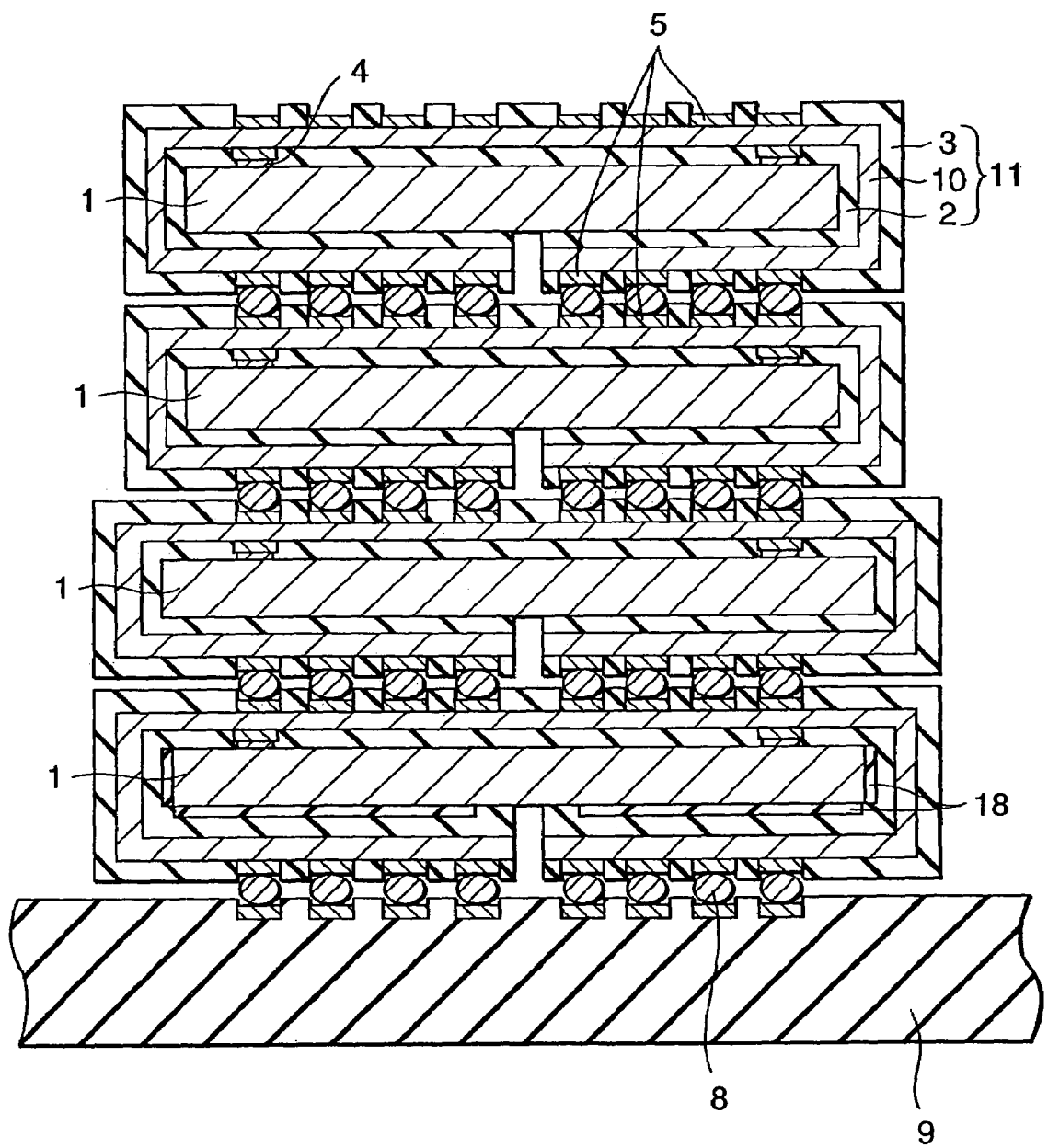
FIG. 37 is a sectional view showing a fourteenth embodiment of the present invention.

FIG. 37 is a sectional view of the semiconductor device according to the fourteenth embodiment of the present invention. This embodiment is different from the twelfth embodiment in that the semiconductor device according to the tenth embodiment of the present invention constitutes the fourth stage, which is the lowermost stage.

In the fourteenth embodiment, the semiconductor device according to the tenth embodiment of the present invention is employed as the semiconductor device which is placed on the lowermost stage of the three-dimensional semiconductor device and which is affected by thermal stress from the motherboard 9. This embodiment thus prevents lowering of connection reliability due to fatigue breakage of the solder bumps 8 which is brought by the thermal stress. Although a three-dimensional semiconductor device composed of four semiconductor devices is taken as an example in this embodiment, the number of semiconductor devices that constitute the three-dimensional semiconductor device is not particularly limited and a desired number equal to or larger than 2 can be chosen.

In the twelfth through fourteenth embodiments, the semiconductor devices according to the second prior art are used as the semiconductor devices in the stages above the lowermost semiconductor device. However, the type of semiconductor devices that constitute the three-dimensional semiconductor device is not particularly limited. As long as the lowermost semiconductor device of the stack is a semiconductor device according to the present invention and is capable of absorbing and relieving the expansion/contraction movement of the motherboard 9 upon temperature change, the same effect can be obtained irrespective of the type of semiconductor devices in stages above the lowermost stage. For instance, all of semiconductor devices that constitute a three-dimensional semiconductor device may be semiconductor devices according to the present invention. In this case, the semiconductor devices constituting the three-dimensional semiconductor device may not always be of the same type but may be different from one another. It is also possible to use semiconductor devices according to the present invention for the lowermost and second from the bottom stages of a three-dimensional semiconductor device whereas semiconductor devices of prior art are used for the upper stage semiconductor devices.

The semiconductor device and three-dimensional, laminate semiconductor device of the present invention are not limited to specific uses, but are exemplary suitable for cellular phones, portable information terminals, notebook computers, digital cameras, and like other electronic equipment which have lately been receiving an increasing demand for reduction in size and weight. The semiconductor device and three-dimensional, laminate semiconductor device of the present invention are also suitable for high density secondary mounting to external substrates installed in the above electronic equipment, such as a printed board, a build-up substrate, and a multi-layer substrate.

Fifteenth Embodiment

Figure 38:
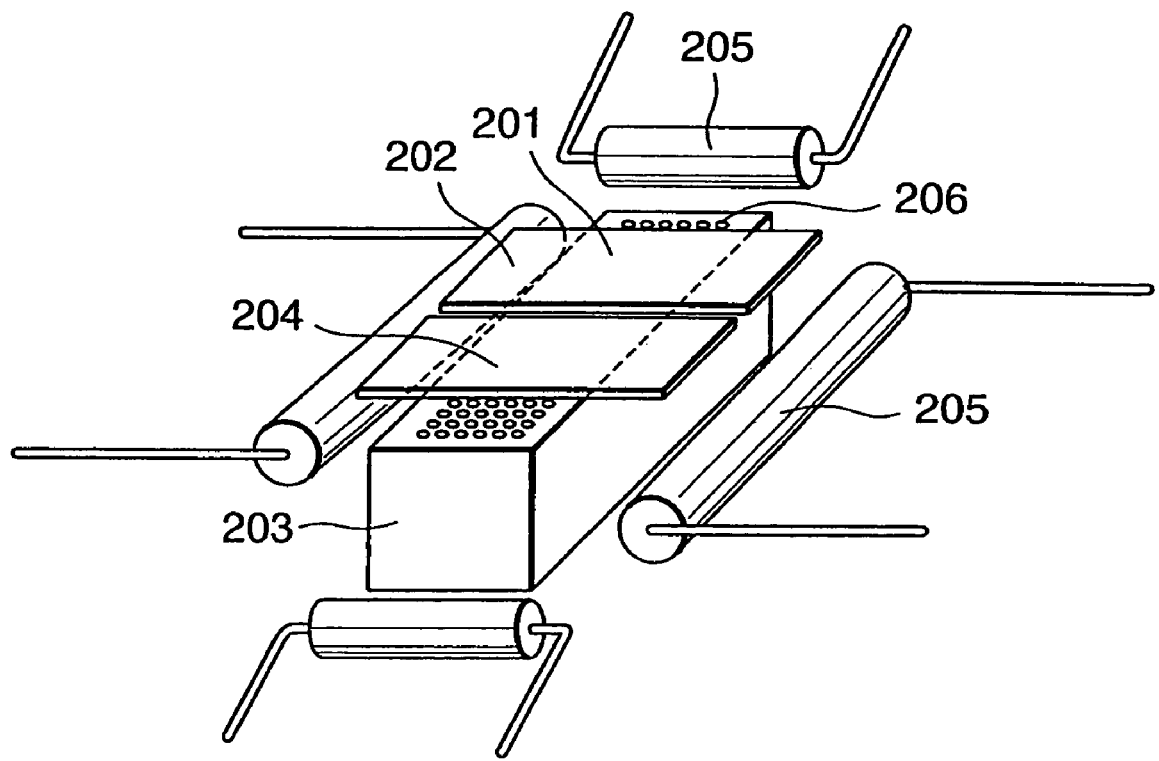
FIG. 38 is a diagram showing a semiconductor device manufacturing apparatus according to a fifteenth embodiment of the present invention.

Next, a description is given on a manufacturing apparatus for manufacturing a semiconductor device of the present invention. FIG. 38 is a schematic perspective view showing a semiconductor device manufacturing apparatus according to a fifteenth embodiment of the present invention. The semiconductor device manufacturing apparatus of this embodiment is mainly composed of the heater stage 203 and the rollers 205. The heater stage 203 is obtained by processing such a material as copper, aluminum, a copper alloy, an aluminum alloy, or stainless steel. The rollers 205 are movable while pressurizing a surface of the heater stage 203. There are four rollers 205 arranged with their rotation axes set parallel to and horizontal to four sides of the rectangular surface of the heater stage 203 respectively. But the number of the rollers is not limited. A portion of the heater stage 203 where a semiconductor device 204 is to be placed has minute holes 206 for vacuum suction to fix the semiconductor device 204. The heater stage 203 is connected to a vacuum pump through a metal pipe of small diameter or the like, so that the semiconductor device 204 is fixed to the heater stage 203 when the semiconductor device 204 is suctioned through the minute holes 206. The intensity of suction can be controlled by adjusting the exhaust power of the vacuum pump or the size of the minute holes 206.

In the case the interposer substrate 202 to be surrounding the semiconductor chip 201 is formed of an insulating material, for instance, a thermoplastic resin such as a composite material of silicone-modified polyimide and a flexible epoxy resin, the surface of the heater stage 203 is desirably processed in advance so as to render the surface non-adhesive and to prevent the interposer substrate 202 from adhering to the heater stage 203. The process performed on the heater stage surface is silicon resin coating, or fluorocarbon coating using polytetrafluoroethylene resin (PTFE), tetrafluoroethylene-perfluoroalkylethylen copolymer resin (PFA), or tetrafluoroethylene-hexafluoropropylene copolymer resin (FEP). The use of a thermoplastic resin for the insulating material of the interposer substrate 202 is effective in making the interposer substrate 202 easier to bend without cracking a semiconductor chip 201. The semiconductor chip 201 is saved from unbearably large stress in the step of bending the interposer substrate 202 since thermoplastic resins are reduced in modulus of elasticity (Young's modulus) when heated.

The rollers 205 are preferably made of an elastic, highly heat-resistant material such as silicon rubber or fluoride rubber. If the insulating material that forms the interposer substrate 202 is a composite material of silicone-modified polyimide and a flexible epoxy resin, for example, the manufacturing apparatus of this embodiment has to bond the interposer substrate 202 to the surface of the semiconductor chip 201 while heating them at 150 to 250° C. Accordingly, the material forming the rollers 205 has to be resistant to high temperature. By employing a material that has elasticity in addition to heat resistance, such as silicon rubber or fluoride rubber, the rollers can modify their surface shapes flexibly in response to minute concavities and convexities of the semiconductor device 204. This prevents failure in bonding the interposer substrate 202 to the rear face of the semiconductor chip 201 solidly.

Figure 39:
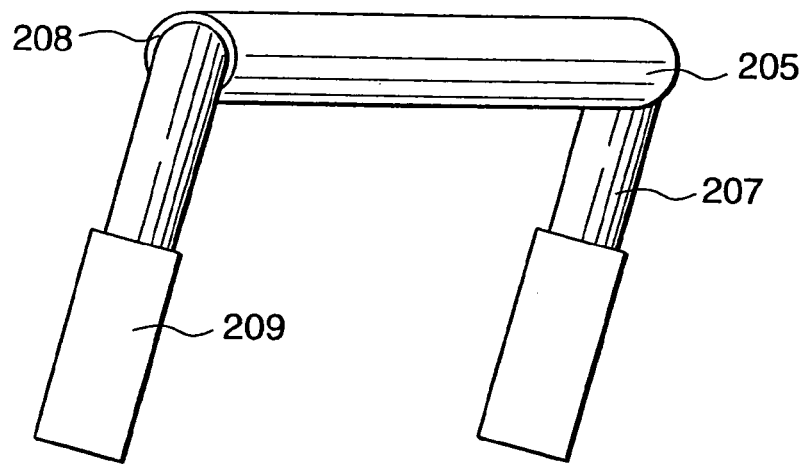
FIG. 39 is a diagram illustrating a roller in the semiconductor device manufacturing apparatus according to the fifteenth embodiment of the present invention.

As shown in FIG. 39, each of the rollers 205 is mainly composed of a heat-resistant, elastic body 208, a heating element 207, and an arm 209. The heating element 207 runs through the heat-resistant, elastic body 208, which is a silicon rubber tube, a fluoride rubber tube, or the like in order to give the rollers 205 the ability to heat. The heating element 207 is, for example, a metal pipe which is made of stainless steel, copper or the like and which houses a Nichrome or similar resistor wire surrounded by an insulator.

Figure 40:
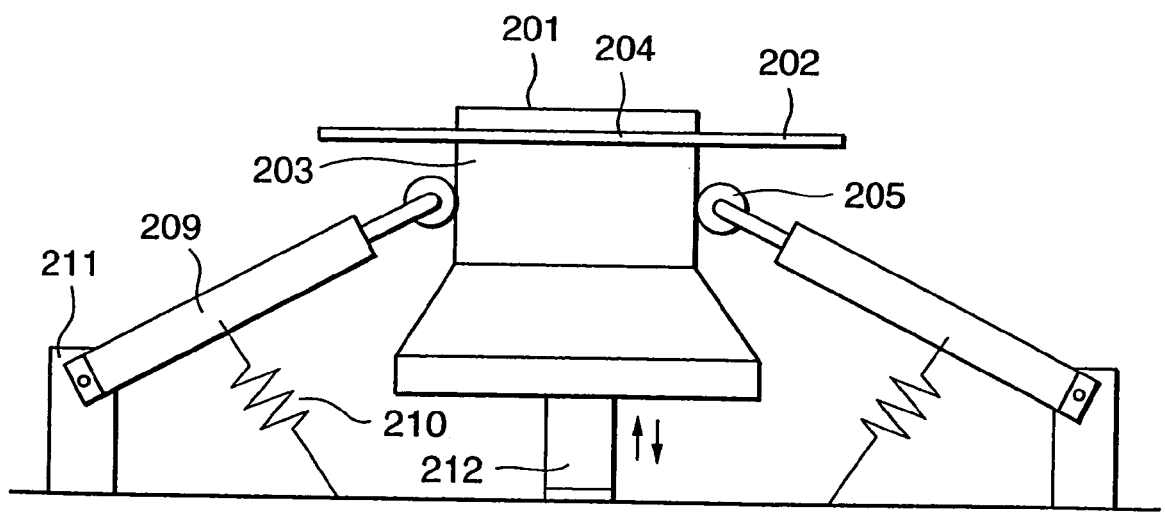
FIG. 40 is a diagram illustrating a device for pressurizing the roller in the semiconductor device manufacturing apparatus according to the fifteenth embodiment of the present invention.

A pressurizing device of the rollers 205 is structured as shown in FIG. 40, and one end of the arm 209 is supported by a supporter 211 pulled downward at an angle by an elastic spring 210. An electromotive cylinder 212 lifts and lowers the stage device 203 to make it possible for the rollers 205 to move while pressurizing the side surfaces and rear surface of the semiconductor device 204. For instance, the spring is set at an angle of 45° with respect to the ground, and this sets the level of pressurization to about 0.7 times the strength of the spring. The pressurization level can be controlled by changing the spring strength.

Figure 41:
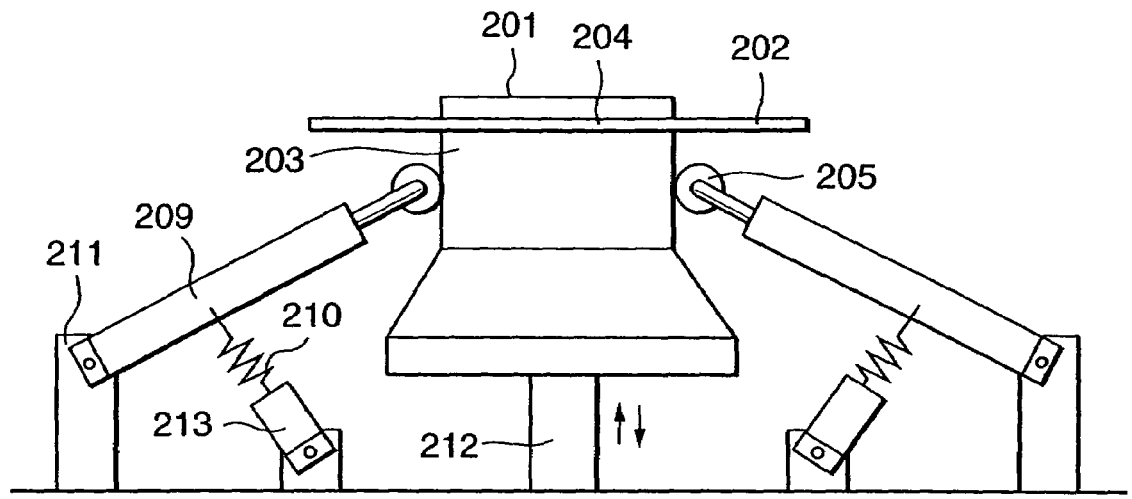
FIG. 41 is a diagram illustrating the device for pressurizing the roller in the semiconductor device manufacturing apparatus according to the fifteenth embodiment of the present invention.

There is an easier method to make the pressurization level variable. For example, the elastic spring 210 is linked as shown in FIG. 41, electromotive actuator 213 such as a direct-coupled, electromotive actuator, a coupled, electromotive actuator, or an electromotive, hydraulic actuator. The electromotive actuator 213 controls expansion and contraction of the spring 210 in advance, thereby obtaining free control over the strength of the spring 210.

A system is built to control with a personal computer a temperature adjuster of the heater stage 203, the electromotive cylinder 212 of the heater stage, and the electromotive actuator 213 of the rollers 205. This makes it possible to control, variably, through advance programming, the operation speed, operation pattern, pressurization level, and heating temperature of the rollers 205 that come into contact with the semiconductor chip 201 and the interposer substrate 202 during the manufacture process of the semiconductor device 204, as well as the heating temperature of the heater. The semiconductor device manufacturing apparatus is therefore effective as an apparatus for developing the semiconductor device 204 and as an apparatus for mass production thereof.

Sixteenth Embodiment

The semiconductor device manufacturing apparatus of this embodiment has almost the same structure as that of the semiconductor device manufacturing apparatus of the fifteenth embodiment. But it is different from the fifteenth embodiment in the surface structure of the heater stage 203. This embodiment employs as the heater stage surface material and as the stage material a porous material 214. Examples of the porous material 214 include a porous material mainly containing a fluorocarbon resin such as chloro-trifluoroethylene resin, and a porous ceramic material. The porous material 214 is advantageous because the minute holes 206 are opened throughout the porous material 214 and the semiconductor device 204 can be suctioned without newly forming holes for vacuum suction.

Seventeenth Embodiment

Figure 43A:
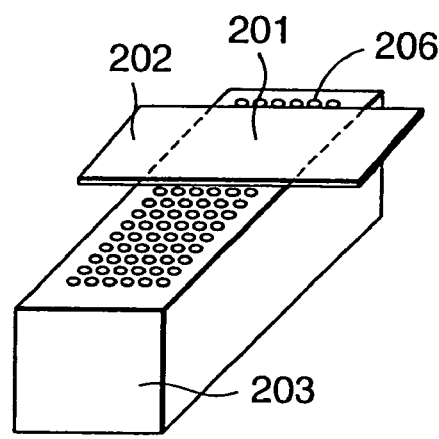
FIGS. 43(a) and (b) are diagrams showing a semiconductor device manufacturing apparatus according to a seventeenth embodiment of the present invention.
Figure 43B:
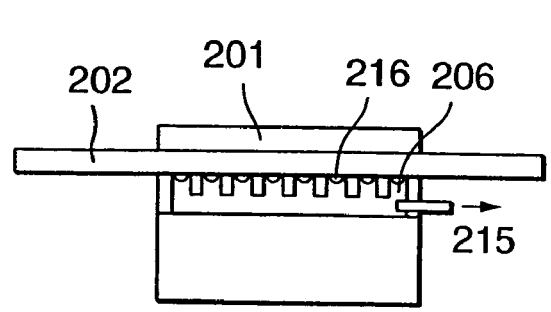

FIG. 43 is a diagram showing a semiconductor device manufacturing apparatus according to a seventeenth embodiment of the present invention. The semiconductor device manufacturing apparatus of this embodiment is different from the fifteenth embodiment in that the minute holes 206 on the surface of the heater stage 203 has function not only for vacuum suction but also for prevention of contact between solder balls 216 and the stage surface as clearance holes. Therefore, it is capable of assembling a semiconductor device that has solder balls mounted thereto.

Some of the minute holes 206 on the stage surface that are located where the solder balls 216 are positioned are designed and processed in advance so as to have a larger diameter than that of the solder balls 216.

The use of the manufacturing apparatus of the seventeenth embodiment makes it possible to assemble the semiconductor device 204 that is mounted with the solder balls 216.

Eighteenth Embodiment

Figure 44A:
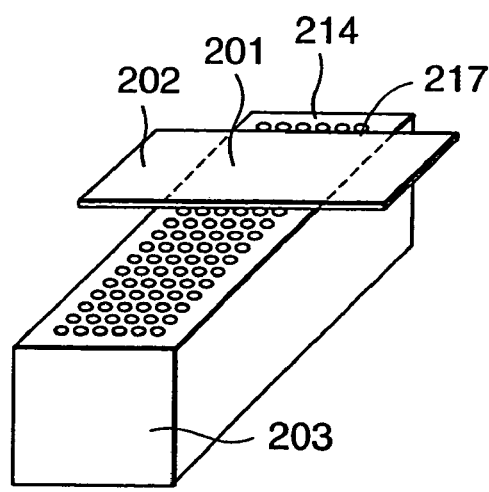
FIGS. 44(a) and (b) are diagrams showing a semiconductor device manufacturing apparatus according to an eighteenth embodiment of the present invention.
Figure 44B:
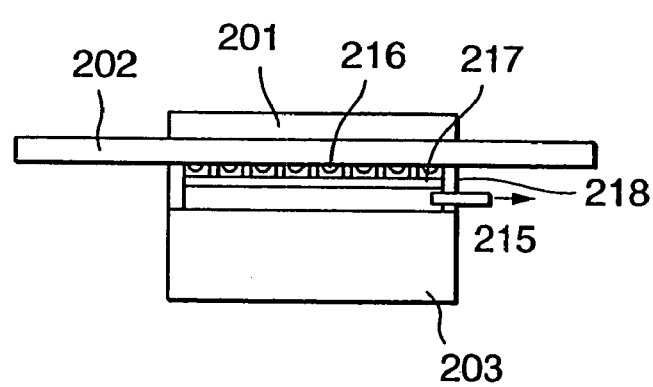

FIG. 44 is a diagram showing a semiconductor device manufacturing apparatus according to an eighteenth embodiment of the present invention. The semiconductor device manufacturing apparatus of this embodiment is different from the sixteenth embodiment in that the minute holes 206 on the surface of the heater stage 203 functions not only for vacuum suction but also for prevention of contact between solder balls 216 and the stage surface as clearance holes. Therefore, it is capable of assembling a semiconductor device that has solder balls mounted thereto.

Specifically, as shown in FIG. 44, holes having a larger diameter than that of the solder balls 216 are provided on the surface of the porous material 214 in order to avoid contact between the porous material 214 used for the surface of the heater stage 203 and the solder balls 216 mounted to the semiconductor device 204.

The use of the manufacturing apparatus of the eighteenth embodiment makes it possible to assemble the semiconductor device 204 that is mounted with the solder balls 216. This manufacturing apparatus is identical in structure with the manufacturing apparatus shown in FIG. 32 in accordance with the sixteenth embodiment except that holes each having a larger diameter than that of the solder balls 216 are provided in advance only in portions where the solder balls 216 are positioned.

In the case where the porous material 214 stretches to the side surface of the stage, it is preferable to provide a heat-resistant seal or cover 218 which mainly contains silicon resin or fluorocarbon resin, for example, on the side surface.

Nineteenth Embodiment

FIG. 45 is a diagram showing a semiconductor device manufacturing apparatus according to a nineteenth embodiment of the present invention. The semiconductor device manufacturing apparatus of this embodiment is similar to the semiconductor device manufacturing apparatus of the fifteenth embodiment. However, unlike the fifteenth embodiment, the semiconductor device manufacturing apparatus of this embodiment has a pressurizing device 219 which is capable of pressurizing the semiconductor device 204 from directly above the stage device 203. Because of the pressurizing device 219, the vacuum suction minute holes 206 which are provided in the fifteenth embodiment to fix the semiconductor device 204 to the stage surface may be omitted. The pressurizing device can move up and down without restriction. When the rollers 205 move over the surface of the stage 203 on which the semiconductor device 204 is placed, the pressurizing device 219 moves upward so as not to interrupt the movement of the rollers 205.

In addition to the function of fixing the semiconductor device 204, the pressurizing device 219 provides an effective measure to remedy defective bonding between the semiconductor chip 201 and the interposer substrate 202 after the semiconductor device 204 is assembled using the rollers. Therefore, it is preferable to use the elastic, heat-resistant material 208 such as silicon rubber or fluoride rubber for the material of the pressurizing device 219 as shown in FIG. 46(*a*) or for the material forming the surface of the pressurizing device 219 as shown in FIG. 46(*b*).

Twentieth Embodiment

Figure 47:
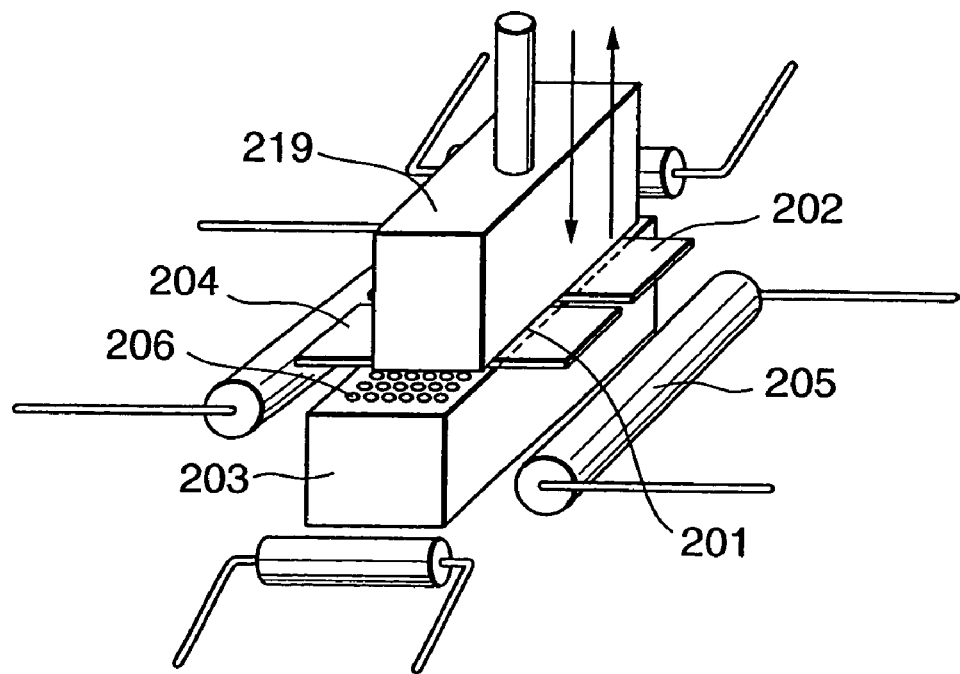
FIG. 47 is a diagram showing a semiconductor device manufacturing apparatus according to a twentieth embodiment of the present invention.

FIG. 47 is a diagram showing a semiconductor device manufacturing apparatus according to a twentieth embodiment of the present invention. The semiconductor device manufacturing apparatus of this embodiment has almost the same structure as that of the semiconductor device manufacturing apparatus of the nineteenth embodiment. However, unlike the nineteenth embodiment, the surface of the stage 203 has the minute holes 206 for fixing the semiconductor device 204 by vacuum suction. When the semiconductor chip 201 used in the semiconductor device 204 is very thin (100 μm thick or less), the semiconductor chip 201 warps and this makes it impossible for the pressurizing device 219 to fix the semiconductor device 204 sufficiently by itself. The insufficiently-fixed semiconductor device 204 will drift away from the stage in the middle of assembly, thereby making the perimeter of the semiconductor chip 201 susceptible to cracks. Forming the vacuum suction minute holes 206 on the stage surface is an effective prevention against this inconvenience.

Twenty-First Embodiment

Figure 42:
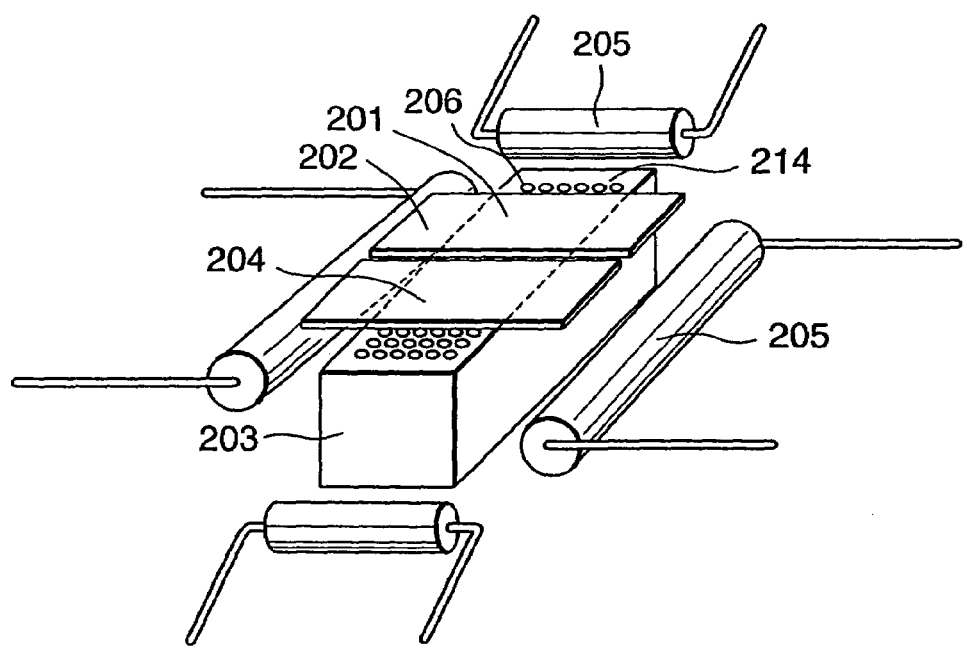
FIG. 42 is a diagram showing a semiconductor device manufacturing apparatus according to a sixteenth embodiment of the present invention.
Figure 48:
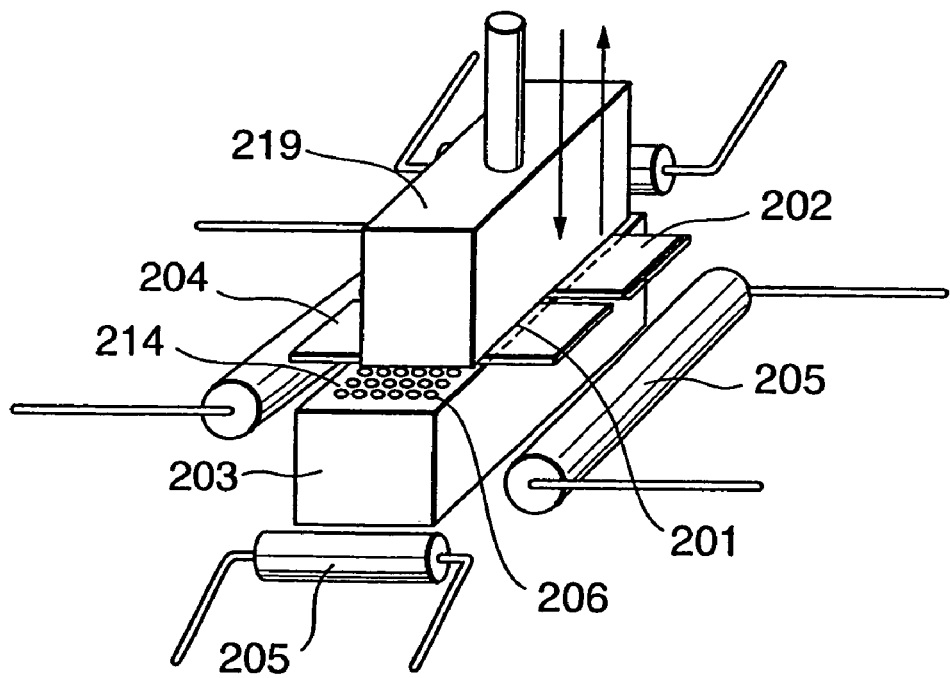
FIG. 48 is a diagram showing a semiconductor device manufacturing apparatus according to a twenty-first embodiment of the present invention.

FIG. 48 is a diagram showing a semiconductor device manufacturing apparatus according to a twenty-first embodiment of the present invention. The semiconductor device manufacturing apparatus of this embodiment is structured in almost the same way to the nineteenth embodiment shown in FIG. 45. However, unlike the nineteenth embodiment, this embodiment employs as the material of the surface of the stage 203 or as the material of the stage 203 itself the porous material 214. Examples of the porous material 214 include a porous material mainly containing a fluorocarbon resin such as chloro-trifluoroethylene resin, and a porous ceramic material. The use of the porous material 214 provides an effect similar to that of the sixteenth embodiment of the present invention shown in FIG. 42.

Twenty-Second Embodiment

Figure 49A:
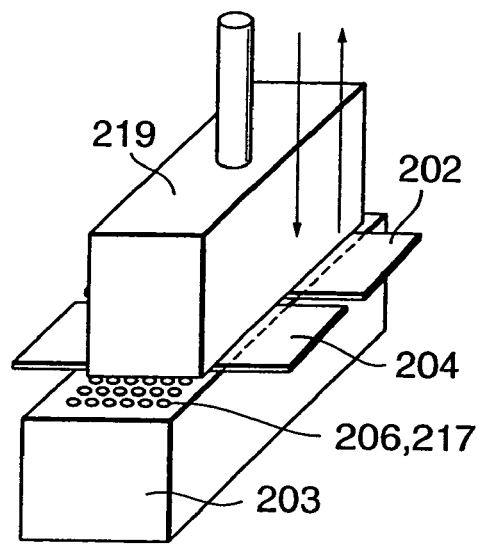
FIGS. 49(a) and (b) are diagrams showing a semiconductor device manufacturing apparatus according to a twenty-second embodiment of the present invention.
Figure 49B:
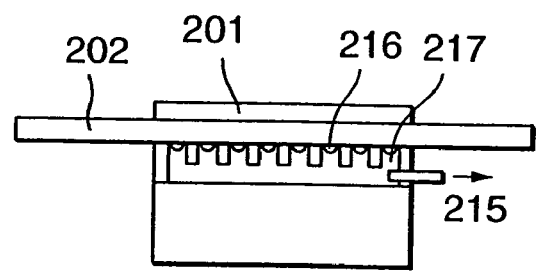

FIG. 49 is a diagram showing a semiconductor device manufacturing apparatus according to a twenty-second embodiment of the present invention. The semiconductor device manufacturing apparatus of this embodiment has almost the same structure as that of the semiconductor device manufacturing apparatus shown in FIG. 47 in accordance with the twentieth embodiment, but as shown in FIG. 49, the minute holes 206 on the surface of the heater stage 203 of this embodiment serve not only for vacuum suction but also for prevention of contact between the solder balls 216 and the stage surface as clearance holes. Therefore, it is capable of assembling the semiconductor device 204 that has solder balls mounted thereto.

Some of the minute holes 206 on the stage surface that are located where the solder balls 216 are positioned are designed and processed in advance so as to have a larger diameter than that of the solder balls 216, in other words, so as to serve as clearance holes 217 for the solder balls 216.

The use of the manufacturing apparatus of the twenty-second embodiment makes it possible to assemble the semiconductor device 204 that is mounted with the solder balls 216. This manufacturing apparatus is identical in structure with the manufacturing apparatus of the twentieth embodiment shown in FIG. 47 except that only part of the minute holes 206 on the stage surface that are located where the solder balls 216 are positioned serve as the clearance holes 217 for the solder balls 216.

Twenty-Third Embodiment

Figure 50A:
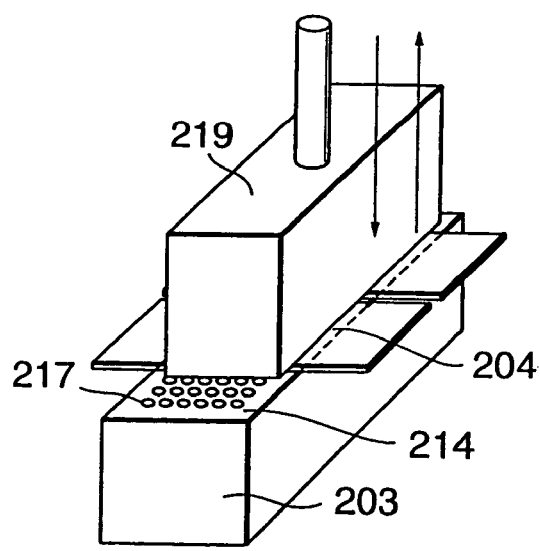
FIGS. 50(a) and (b) are diagrams showing a semiconductor device manufacturing apparatus according to a twenty-third embodiment of the present invention.
Figure 50B:
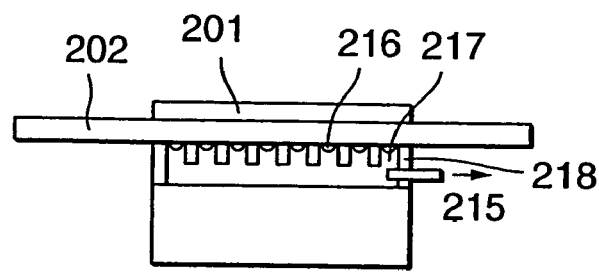

FIG. 50 is a diagram showing a semiconductor device manufacturing apparatus according to a twenty-third embodiment of the present invention. The semiconductor device manufacturing apparatus of this embodiment has almost the same structure as that of the semiconductor device manufacturing apparatus shown in FIG. 40 in accordance with the twenty-first embodiment, but as shown in FIG. 50, the minute holes 206 on the surface of the heater stage 203 of this embodiment serve not only for vacuum suction but also for prevention of contact between the solder balls 216 and the stage surface as clearance holes. Therefore, it is capable of assembling the semiconductor device 204 that has solder balls mounted thereto.

Specifically, as shown in FIG. 50, the holes 217 having a larger diameter than that of the solder balls 216 are provided in order to avoid contact between the porous material 214 used for the surface of the heater stage 203 and the solder balls 216 mounted to the semiconductor device 204.

The use of the manufacturing apparatus of the twenty-third embodiment makes it possible to assemble the semiconductor device 204 that is mounted with the solder balls 216. This manufacturing apparatus is identical in structure with the manufacturing apparatus shown in FIG. 40 in accordance with the twenty-first embodiment except that holes having a larger diameter than that of the solder balls 216 are provided in portions where the solder balls 216 are positioned.

Twenty-Fourth Embodiment

Figure 51A:
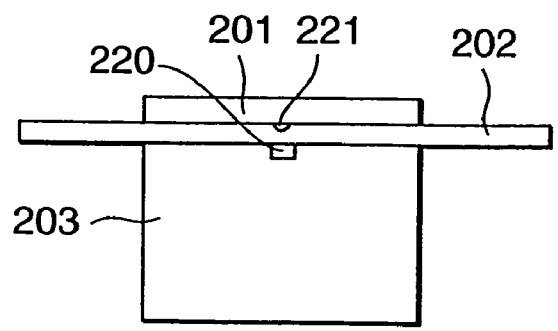
FIGS. 51(a) and (b) are diagrams showing a surface shape of a stage device in a semiconductor device manufacturing apparatus according to a twenty-fourth embodiment of the present invention.
Figure 51B:
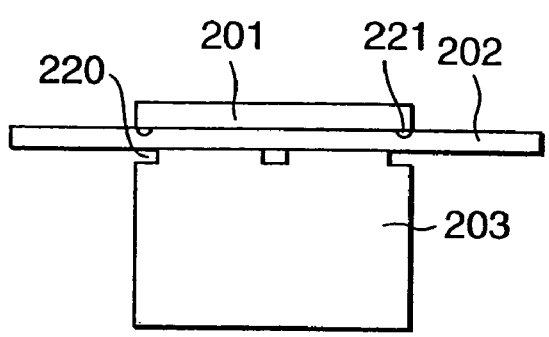

FIG. 51 is diagram showing the surface shape of a stage device in a semiconductor device manufacturing apparatus according to a twenty-fourth embodiment of the present invention. During assembly in this embodiment, the semiconductor chip 201 and the interposer substrate 202 are connected to each other by a conductive bump 221, for example. The conductor bump 221 faces the surface side of the stage (face down). Therefore, when the rollers move over the rear surface of the semiconductor chip 201, the conductor bump 221 may receive stress from the interposer substrate 202 or the surface of the stage 203 to crack an area where the conductor bump 221 is connected to an electrode pad of the semiconductor chip 201 or the electrode pad itself. The manufacturing apparatus of the twenty-fourth embodiment shown in FIG. 51 prevents this inconvenience by forming a groove 220 in a portion of the stage surface where the conductor bump is located. The groove 220 is placed in the center of the stage if the electrode pad on the semiconductor chip 201 is laid out in accordance with the center pad arrangement, and is placed in the perimeter of the stage if the electrode pad is laid out in accordance with the perimeter pad arrangement. The groove 220 can prevent the inconvenience caused by external force that is applied to the conductor bump during assembly of the semiconductor device 204.

Twenty-Fifth Embodiment

Figure 52A:
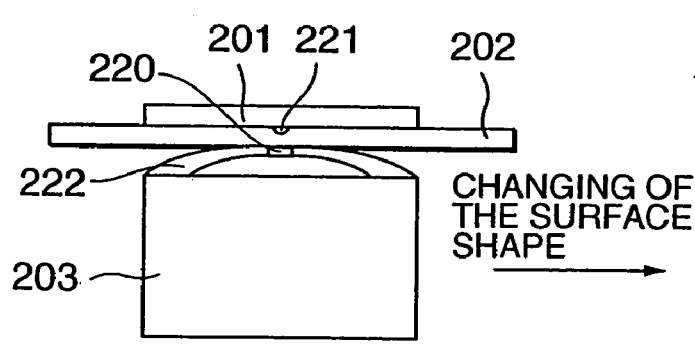
FIGS. 52(a) and (b) are diagrams showing a surface state of a stage device in a semiconductor device manufacturing apparatus according to a twenty-fifth embodiment of the present invention.
Figure 52B:
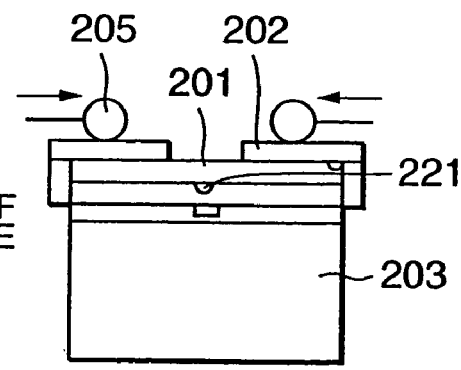

FIG. 52 is a diagram showing a surface state of a stage device in a semiconductor device manufacturing apparatus according to a twenty-fifth embodiment of the present invention. An elastic, heat-resistant material 222, which is a thin metal plate formed of copper, aluminum, a copper alloy, an aluminum alloy, or stainless steel, or TEFRON, is used for the surface of the stage. The stage surface is processed in advance to have a convex shape of a few micrometers (not exceeding 10 μm) high. The surface shape of the stage 203 is leveled by pressurizing the semiconductor device 204 from above with the rollers 205 while the rollers move over the interposer substrate 202. Changing the surface shape in this way is effective in remedying preexistent defective bonding between the semiconductor chip 201 and the interposer substrate 202 by pushing minute bubbles out of the defectively-bonded portions.

Twenty-Sixth Embodiment

Figure 53A:
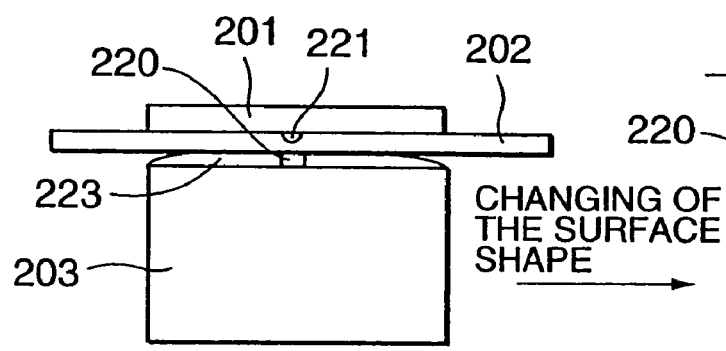
FIGS. 53(a) and (b) are diagrams showing a surface state of a stage device in a semiconductor device manufacturing apparatus according to a twenty-sixth embodiment of the present invention.
Figure 53B:
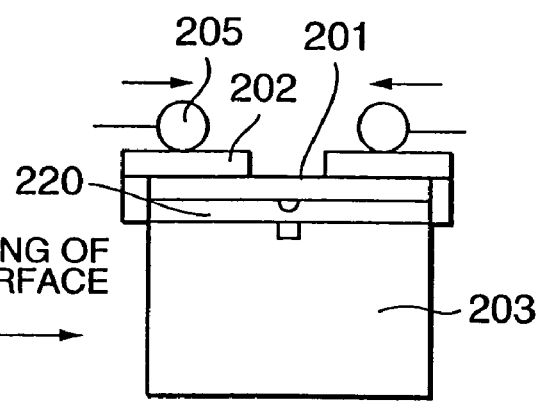

FIG. 53 is a diagram showing another surface state of a stage device in a semiconductor device manufacturing apparatus according to a twenty-sixth embodiment of the present invention. The stage surface is formed from a shape memory material such as a Cr—Ni—Ti alloy, a Co—Ni—Al alloy, an Ni—Mn—Ga alloy, or an Ni—Mn—Al alloy. The stage surface is shaped in advance to have a convex shape of a few micrometers (not exceeding 10 μm) high, and keeps this shape at normal temperature. The shape memory material, which is denoted by reference numeral 223, is heated by the rollers 205 as the rollers 205 move over the interposer substrate 202 while heating. Through the heating, the shape memory material 223 returns to a flat shape which has been memorized in advance.

Similarly to the twenty-fifth embodiment of the present invention, changing the surface shape in this way is effective in remedying preexistent defective bonding between the semiconductor chip 201 and the interposer substrate 202 by pushing minute bubbles out of the defectively-bonded portions.

Twenty-Seventh Embodiment

Figure 54:
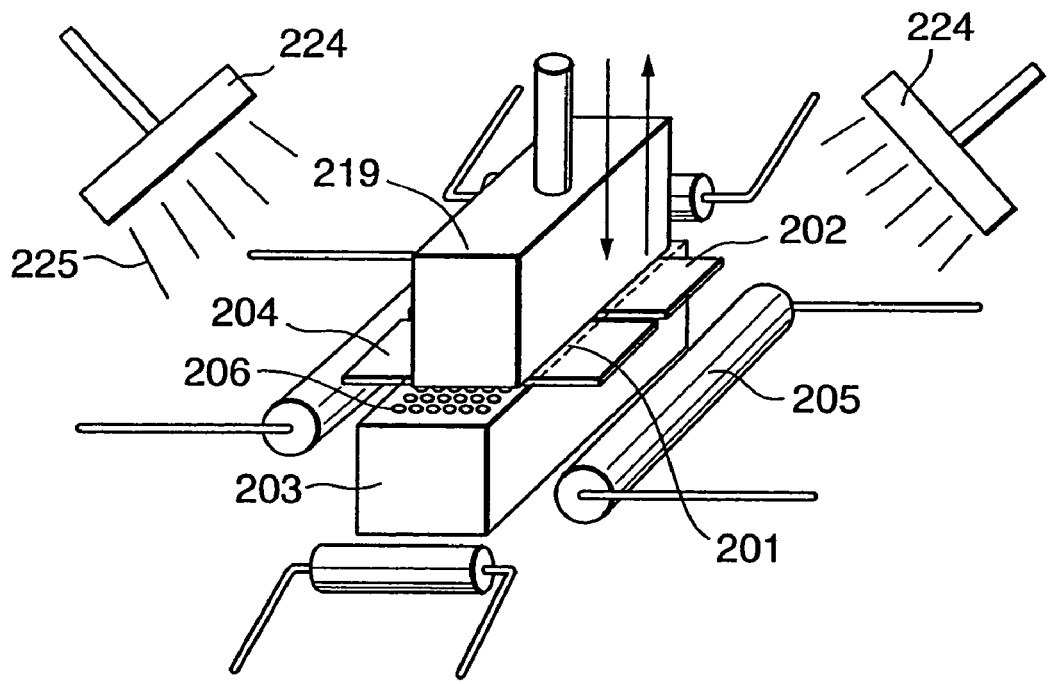
FIG. 54 is a diagram showing a semiconductor device manufacturing apparatus according to a twenty-seventh embodiment of the present invention.

FIG. 54 is a diagram showing a semiconductor device manufacturing apparatus according to a twenty-seventh embodiment of the present invention. The semiconductor device manufacturing apparatus of this embodiment is structured in almost the same way to the fifteenth through twenty-sixth embodiments, but is different in that the apparatus has an infrared heater 204 as a device for heating the semiconductor device 204 aside from the heater stage and the rollers. The effect of the infrared heater 224 is that the semiconductor device 204, in particular, the interposer substrate 202, can be heated before it is brought into contact with the rollers 205 during assembly of the semiconductor device 204. By preheating the interposer substrate 202 well with the infrared heater 224, the adhesion between the interposer substrate 202 and the semiconductor chip 201 is improved and defective bonding is eliminated.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A semiconductor device manufacturing apparatus comprising:
   a stage having a rectangular surface for placing a semiconductor device;
   a roller for pressurizing a surface of the semiconductor device on the stage,
   wherein said roller is positioned adjacent to one or more sides of the rectangular surface of said stage,
   wherein the rectangular surface of said stage has holes for fixing said semiconductor device on said stage by vacuuming through said holes, and
   wherein a groove is formed in a portion of the rectangular surface of said stage where a conductive bump of said semiconductor device is located.

2. The semiconductor device manufacturing apparatus according to claim 1, wherein said stage and roller have heating members.

3. The semiconductor device manufacturing apparatus according to claim 1, wherein said stage is made of a porous material.

4. The semiconductor device manufacturing apparatus according to claim 1, further comprising means for controlling a stress of pressurizing the surface of the semiconductor device.

5. The semiconductor device manufacturing apparatus according to claim 1,
   wherein a diameter of said holes is larger than a diameter of solder balls mounted on said semiconductor device.

6. The semiconductor device manufacturing apparatus according to claim 1,
   wherein a height of said stage at the center thereof is greater than a height of said stage at an edge thereof.

7. The semiconductor device manufacturing apparatus according to claim 6, wherein the rectangular surface of said stage is made of a shape-memory material.

8. The semiconductor device manufacturing apparatus according to claim 1, further comprising a heater for heating said semiconductor device without contacting said semiconductor device.

9. The semiconductor device manufacturing apparatus according to claim 1, wherein the rectangular surface of said stage is processed so as to render the surface non-adhesive.

10. A semiconductor device manufacturing apparatus comprising:
    a stage having a rectangular surface for placing a semiconductor device;
    a roller for pressurizing a surface of the semiconductor device on the stage;
    an arm which is part of said roller; and
    an electromotive cylinder,
    wherein said roller is positioned adjacent to one or more sides of the rectangular surface of said stage,
    wherein the rectangular surface of said stage has holes for fixing said semiconductor device on said stage by vacuuming through said holes,
    wherein said electromotive cylinder lifts and lowers said stage, and
    said arm is pulled downward at an angle by an elastic spring.

11. The semiconductor device manufacturing apparatus according to claim 10, further comprising an electromotive actuator,
wherein said electromotive actuator is linked to said elastic spring.

12. The semiconductor device manufacturing apparatus according to claim 10, wherein said stage and roller have heating members.

13. The semiconductor device manufacturing apparatus according to claim 10, wherein said stage is made of a porous material.

14. The semiconductor device manufacturing apparatus according to claim 10, further comprising means for controlling a stress of pressurizing the surface of the semiconductor device.

15. The semiconductor device manufacturing apparatus according to claim 10,
wherein a diameter of said holes is larger than a diameter of solder balls mounted on said semiconductor device.

16. The semiconductor device manufacturing apparatus according to claim 10,
wherein a height of said stage at the center thereof is greater than a height of said stage at an edge thereof.

17. The semiconductor device manufacturing apparatus according to claim 16, wherein the rectangular surface of said stage is made of a shape-memory material.

18. The semiconductor device manufacturing apparatus according to claim 10, further comprising a heater for heating said semiconductor device without contacting said semiconductor device.

19. The semiconductor device manufacturing apparatus according to claim 10, wherein the rectangular surface of said stage is processed so as to render the surface non-adhesive.

* * * * *

UNITED STATES PATENT AND TRADEMARK OFFICE
CERTIFICATE OF CORRECTION

PATENT NO. : 7,594,644 B2
APPLICATION NO. : 11/267328
DATED : September 29, 2009
INVENTOR(S) : Takao Yamazaki et al.

It is certified that error appears in the above-identified patent and that said Letters Patent is hereby corrected as shown below:

Column 25, Line 55, delete "infrared heater 204" and insert --infrared heater 224--.

Signed and Sealed this

Seventh Day of September, 2010

David J. Kappos
*Director of the United States Patent and Trademark Office*